US009702524B2

(12) United States Patent
Jacobson et al.

(10) Patent No.: US 9,702,524 B2
(45) Date of Patent: *Jul. 11, 2017

(54) HIGH COLOR-SATURATION LIGHTING DEVICES

(71) Applicant: Cree, Inc., Durham, NC (US)

(72) Inventors: Benjamin A. Jacobson, Santa Barbara, CA (US); Antony Paul van de Ven, Hong Kong (CN)

(73) Assignee: Cree, Inc., Durham, NC (US)

( * ) Notice: Subject to any disclaimer, the term of this patent is extended or adjusted under 35 U.S.C. 154(b) by 92 days.

This patent is subject to a terminal disclaimer.

(21) Appl. No.: 14/606,509

(22) Filed: Jan. 27, 2015

(65) Prior Publication Data

US 2016/0215938 A1   Jul. 28, 2016

(51) Int. Cl.
| | | |
|---|---|---|
| *H01L 33/50* | (2010.01) |
| *F21V 9/16* | (2006.01) |
| *F21K 9/64* | (2016.01) |
| *F21Y 113/17* | (2016.01) |
| *F21Y 115/10* | (2016.01) |

(52) U.S. Cl.
CPC .................. *F21V 9/16* (2013.01); *F21K 9/64* (2016.08); *H01L 33/50* (2013.01); *H01L 33/504* (2013.01); *F21Y 2113/17* (2016.08); *F21Y 2115/10* (2016.08)

(58) Field of Classification Search
CPC . H01L 33/502; H01L 33/504; H05B 33/0857; F21K 9/16; F21K 9/64
See application file for complete search history.

(56) References Cited

U.S. PATENT DOCUMENTS

| | | |
|---|---|---|
| 5,350,977 A | 9/1994 | Hamamoto et al. |
| 6,234,648 B1 | 5/2001 | Borner et al. |
| 6,357,889 B1 | 3/2002 | Duggal et al. |

(Continued)

FOREIGN PATENT DOCUMENTS

| | | |
|---|---|---|
| DE | 10233050 A1 | 2/2004 |
| JP | 2003316714 A | 11/2003 |

(Continued)

OTHER PUBLICATIONS

U.S. Appl. No. 14/702,564.*

(Continued)

*Primary Examiner* — Anh Mai
*Assistant Examiner* — Steven Horikoshi
(74) *Attorney, Agent, or Firm* — Withrow & Terranova, P.L.L.C.; Vincent K. Gustafson

(57) ABSTRACT

A lighting device including a blue solid state emitter, at least one yellow-green or green lumiphoric material, and at least one red or red-orange solid state emitter can simultaneously provide high color fidelity (e.g., high CRI Ra), high color saturation (e.g., high Qg), and high efficiency (e.g., lumens per watt). A subcombination of blue and yellow-green emissions is provided within one or more specified regions of a 1931 CIE chromaticity diagram. By providing sufficient green content, increased saturation can be active with relatively a short wavelength red or red-orange source while maintaining high color fidelity and efficacy. A mixture of green and yellow lumiphoric materials may be provided.

24 Claims, 38 Drawing Sheets

(56) References Cited

U.S. PATENT DOCUMENTS

| | | |
|---|---|---|
| 6,441,558 B1 | 8/2002 | Muthu et al. |
| 6,498,440 B2 | 12/2002 | Stam et al. |
| 6,577,073 B2 | 6/2003 | Shimizu et al. |
| 6,600,175 B1 | 7/2003 | Baretz et al. |
| 7,005,679 B2 | 2/2006 | Tarsa et al. |
| 7,026,756 B2 | 4/2006 | Shimizu et al. |
| 7,095,056 B2 | 8/2006 | Vitta et al. |
| 7,213,940 B1 | 5/2007 | Van De Ven et al. |
| 7,233,831 B2 | 6/2007 | Blackwell |
| 7,255,457 B2 | 8/2007 | Ducharme et al. |
| 7,352,138 B2 | 4/2008 | Lys et al. |
| 7,354,172 B2 | 4/2008 | Chemel et al. |
| 7,358,679 B2 | 4/2008 | Lys et al. |
| 7,520,634 B2 | 4/2009 | Ducharme et al. |
| 7,564,180 B2 | 7/2009 | Brandes |
| 7,665,865 B1 | 2/2010 | Hulse et al. |
| 7,687,753 B2 | 3/2010 | Ashdown |
| 7,744,242 B2 | 6/2010 | Krämer |
| 7,768,192 B2 | 8/2010 | Van De Ven et al. |
| 7,781,953 B2 | 8/2010 | Su |
| 7,791,061 B2 | 9/2010 | Edmond et al. |
| 7,828,460 B2 | 11/2010 | Van De Ven et al. |
| 7,845,823 B2 | 12/2010 | Mueller et al. |
| 7,918,581 B2 | 4/2011 | Van De Ven et al. |
| 8,038,317 B2 | 10/2011 | Van De Ven et al. |
| 8,201,966 B2 | 6/2012 | Hall et al. |
| 8,258,722 B2 | 9/2012 | Swoboda et al. |
| 8,436,556 B2 | 5/2013 | Eisele et al. |
| 8,508,127 B2 | 8/2013 | Negley et al. |
| 8,593,074 B2 | 11/2013 | Hatley et al. |
| 8,698,388 B2 | 4/2014 | Cash |
| 9,192,013 B1 | 11/2015 | van de Ven et al. |
| 9,240,528 B2 | 1/2016 | Bergmann et al. |
| 9,241,384 B2 | 1/2016 | van de Ven et al. |
| 2002/0070681 A1 | 6/2002 | Shimizu et al. |
| 2004/0218387 A1 | 11/2004 | Gerlach |
| 2005/0275937 A1 | 12/2005 | Wu et al. |
| 2006/0237636 A1 | 10/2006 | Lyons et al. |
| 2007/0063321 A1 | 3/2007 | Han et al. |
| 2007/0152797 A1 | 7/2007 | Chemel et al. |
| 2007/0223219 A1 | 9/2007 | Medendorp, Jr. et al. |
| 2007/0241657 A1 | 10/2007 | Radkov et al. |
| 2008/0130285 A1 | 6/2008 | Negley et al. |
| 2008/0258130 A1 | 10/2008 | Bergmann et al. |
| 2009/0080185 A1 | 3/2009 | McMillan |
| 2009/0184616 A1 | 7/2009 | Van De Ven et al. |
| 2009/0207583 A1 | 8/2009 | Takano |
| 2009/0227847 A1 | 9/2009 | Tepper et al. |
| 2009/0296384 A1 | 12/2009 | Van De Ven et al. |
| 2010/0110659 A1 | 5/2010 | Nakajima |
| 2010/0127283 A1 | 5/2010 | van de Ven et al. |
| 2010/0254129 A1 | 10/2010 | Le Toquin et al. |
| 2010/0277907 A1 | 11/2010 | Phipps et al. |
| 2011/0037388 A1 | 2/2011 | Lou et al. |
| 2011/0220929 A1* | 9/2011 | Collins ............ C09K 11/0883 257/98 |
| 2011/0299284 A1 | 12/2011 | Van De Ven et al. |
| 2012/0112614 A1 | 5/2012 | Pickard et al. |
| 2012/0242247 A1 | 9/2012 | Hartmann et al. |
| 2012/0306355 A1 | 12/2012 | Seibel, II |
| 2012/0306375 A1 | 12/2012 | van de Ven |
| 2013/0002157 A1* | 1/2013 | van de Ven ........ H05B 33/0824 315/192 |
| 2013/0069561 A1 | 3/2013 | Melanson et al. |
| 2013/0114241 A1 | 5/2013 | van de Ven et al. |
| 2013/0170199 A1 | 7/2013 | Athalye et al. |
| 2013/0271991 A1 | 10/2013 | Hussell et al. |
| 2014/0146545 A1* | 5/2014 | Shum .................. F21K 9/13 362/311.02 |
| 2014/0228914 A1 | 8/2014 | van de Ven et al. |
| 2015/0308633 A1 | 10/2015 | van de Ven et al. |

FOREIGN PATENT DOCUMENTS

| | | |
|---|---|---|
| JP | 2009152213 A | 7/2009 |
| WO | 0034709 A1 | 6/2000 |
| WO | 2009041171 A1 | 4/2009 |
| WO | 2013070860 A1 | 5/2013 |

OTHER PUBLICATIONS

U.S. Appl. No. 14/259,993, filed Apr. 23, 2014.
U.S. Appl. No. 14/260,048, filed Apr. 23, 2014.
U.S. Appl. No. 14/298,327, filed Jun. 6, 2014.
Author Unknown, "69204—LED11DA19RVL/TP: GE LED A19 Features & Photos," GE Lighting Product Catalog for consumers, retrieved Jan. 20, 2015 from http://genet.gelighting.com/LightProducts/Dispatcher?REQUEST=CONSUMERSPECPAGE&PRODUCTCODE=69204, 1 page.
Author Unknown, "69204—LED11DA19RVL/TP: GE LED A19 Technical Specifications," GE Lighting Product Catalog for consumers, retrieved Jan. 20, 2015 from http://genet.gelighting.conn/LightProducts/Dispatcher?REQUEST=CONSUMERSPECPAGE&PRODUCTCODE=69204&TABID=2&BreadCrumbValues=&ModelSelectionFilter=, 1 page.
Author Unknown, "CALiPER Retail Lamps Study 3," Solid-State Lighting Program, Feb. 2014, Pacific Northwest National Laboratory, U.S. Department of Energy, 48 pages.
Author Unknown, "Class A Color for White Lighting," Rensselaer Polytechnic Institute, 2013, 1 page.
Author Unknown, "LEDnovation EnhanceLite A19 LED Light Bulb Review," LED Light Review, retrieved Jan. 22, 2015 from http://led-light-review.com/reviews/lednovation-enhancelite-a19/, 5 pages.
Author Unknown, "Technical Note: Chromaticity Difference Specification for Light Sources," CIE TN 001:2014, 2014, International Commission on Illumination, 9 pages.
Dilouie, C., "After CRI: New metrics challenge CRI as the industry's primary tool for evaluating color rendering," Architectural Lighting, Jan.-Feb. 2012, 3 pages.
Freyssinier, J.P. et al., "The Class A Color Designation for Light Sources," 2013 DOE Solid-State Lighting R&D Workshop, Jan. 29-31, 2013, Long Beach, CA, Rensselaer Polytechnic Institute, 26 pages.
Freyssinier, J.P. et al., "Class A Color Designation for Light Sources Used in General Illumination," Journal of Light & Visual Environment, vol. 37, Nos. 2 & 3, Nov. 2013, The Illuminating Engineering Institute of Japan, 5 pages.
Freyssinier, J.P. et al., "Class A Lighting," Strategies in Light, 2012, 14 pages.
Narendran, N. et al., "Color Rendering Properties of LED Light Sources," Solid State Lighting II: Proceedings of SPIE, vol. 4776, Nov. 26, 2002, SPIE, 8 pages.
Negley, G. et al., "Essentials of designing efficient luminaires with LEDs," LEDs Magazine, Issue 18, Jan./Feb. 2008, Pennwell Corporation, pp. 17-22.
Ohno, Y., "Latest Research and Standardization on Chromaticity & Color Quality of LED lighting," 11th China International Forum on Solid State Lighting, Nov. 2014, Guangzhou, National Institute of Standards and Technology, 32 pages.
Rea, Mark S., "Value Metrics for Better Lighting," vol. PM228, 2013, SPIE Press, pp. 36-43, 52-63.
Van De Ven, A. et al., "Warm White illumination with high CRI and high efficacy by combining 455nm excited yellowish phosphor LEDs and red AllnGaP LEDs," First International Conference on White LEDs and Solid State Lighting, Nov. 28, 2007, LED Lighting Fixtures, Inc., 8 pages.
Wood, M., "MacAdam ellipses: Due to the increasing use of solid state lighting devices, utilizing MacAdam ellipses to define the color point specification of lamps is becoming more prevalent," Protocol, Fall 2010, pp. 15-18.
Non-Final Office Action for U.S. Appl. No. 14/259,993, mailed Apr. 8, 2016, 5 pages.

(56) References Cited

OTHER PUBLICATIONS

International Search Report and Written Opinion for International Patent Application No. PCT/US2015/026770, mailed Sep. 2, 2015, 9 pages.
International Preliminary Report on Patentability for International Patent Application No. PCT/US2015/026770, mailed Nov. 3, 2016, 7 pages.
Notice of Allowance for U.S. Appl. No. 14/259,993, mailed Oct. 24, 2016, 7 pages.

* cited by examiner

FIG. 7A        FIG. 7B

| | HIGH-Qg CR22 DEMOS (4 UNITS) | CR22 POR (BUILT AS BENCHMARK) |
|---|---|---|
| Qg | 108.1 | 101.6 |
| CRI | 91.0 | 90.5 |
| AC LPW | 110.8 | 108.3 |
| CCT | 3446 | 3449 |
| DUV | < 1/2 STEP | < 1/2 STEP |
| PHOSPHOR | 1:1 GAL535:NYAG7 | NYAG4 |
| BLUE DIE-SHEET DWL | 450.6 | 458.1 |
| RED DIE-SHEET DWL | 50% 615.5 50% 611.5 | 613.5 NOMINAL |
| BLUE PEAK WL | 446 | 454 |
| RED PEAK WL | 624 | 623 |
| LF | 3306 | 3237 |
| AC POWER | 29.8 | 30.1 |
| BLUE RF (SBTC SPHERE) | 588.3 mW | 577.4 mW |
| BLUE RF (DIE-SHEET) | 635.0 mW | 628.9 mW |
| RDO LPW | 94.0 | 90.1 |

*FIG. 15*

| | LEFT (HIGH Qg) | RIGHT (STANDARD) |
|---|---|---|
| CCT: | 2760 | 2735 |
| DUV: | -0.0005 | 0.0008 |
| CRI Ra: | 83.4 | 93.2 |
| R9: | 66.0 | 66.3 |
| COS Qg: | 112.8 | 104.7 |
| BLUE PK: | 445 | 450 |
| RED PK: | 628 | 625 |

| | LEFT (HIGH Qg) | RIGHT (STANDARD) |
|---|---|---|
| CCT: | 4490 | 4506 |
| DUV: | 0.0002 | -0.0001 |
| CRI Ra: | 89.3 | 94.4 |
| R9: | 94.3 | 76.1 |
| COS Qg: | 106.0 | 98.0 |
| BLUE PK: | 445 | 459 |
| RED PK: | 627 | 624 |

HIGH COLOR-SATURATION LIGHTING DEVICES

FIELD OF THE DISCLOSURE

The present disclosure relates to solid state lighting devices, including devices with lumiphors arranged to be stimulated by electrically activated solid state emitters, and relates to associated methods of making and using such devices.

BACKGROUND

Solid state emitters such as light emitting diodes (LEDs) are widely used in consumer and commercial applications. Continued developments in LED technology have resulted in highly efficient and mechanically robust light sources arranged to output emissions in the visible spectrum and beyond. These attributes, coupled with the long service life of solid state devices, have enabled a variety of new display applications, and have resulted in use of LEDs in general illumination applications with the potential to replace incandescent and fluorescent lamps.

Solid state emitters may include lumiphoric materials (also known as lumiphors) that absorb a portion of emissions having a first peak wavelength emitted by the emitter and re-emit light having a second peak wavelength that differs from the first peak wavelength. Phosphors, scintillators, and lumiphoric inks are common lumiphoric materials. Light perceived as white or near-white may be generated by a combination of red, green, and blue ("RGB") emitters, or, alternatively, by combined emissions of a blue LED and a lumiphor such as a yellow phosphor (e.g., YAG:Ce or Ce:YAG). In the latter case, a portion of the blue LED emissions pass through the phosphor, while another portion of the blue emissions is downconverted to yellow, and the blue and yellow light in combination are perceived as white. White light may also be produced by stimulating phosphors or dyes of multiple colors with a violet or UV LED source.

Emissions of a blue LED in combination with a yellow or green lumiphoric material may be near-white in character and referred to as "blue-shifted yellow" ("BSY") light or "blue-shifted green" ("BSG") light. Addition of red (or red-orange) spectral output from a red-emitting LED (to yield a "BSY+R" device) or from a red lumiphoric material (to yield a "BS(Y+R)" device) may be used to increase the warmth of the aggregated light output and better approximate light produced by incandescent lamps.

Quality artificial lighting generally attempts to emulate the characteristics of natural light. Natural light sources include daylight with a relatively high color temperature (e.g., ~5000K) and incandescent lamps with a lower color temperature (e.g., ~2800K).

Solid state emitters such as LEDs in combination with lumiphors create white light by mixing relatively narrow wavelength bands together with spectral gaps between peaks of LEDs and/or lumiphors. The resulting light may be under-saturated with certain colors of the spectrum or over-saturated with certain colors.

Color reproduction is commonly measured using Color Rendering Index (CRI) or average Color Rendering Index (CRI Ra). To calculate CRI, the color appearance of 14 reflective samples is simulated when illuminated by a reference radiator (illuminant) and the test source. CRI Ra is a modified average utilizing the first eight indices, all of which have low to moderate chromatic saturation. (R9 is one of six saturated test colors not used in calculating CRI, with R9 embodying a large red content.) CRI and CRI Ra are used to determine how closely an artificial light source matches the color rendering of a natural light source at the same correlated color temperature. Daylight has a high CRI Ra (approximately 100), with incandescent bulbs also being relatively close (CRI Ra greater than 95), and fluorescent lighting being less accurate (with typical CRI Ra values of approximately 70-80).

CRI Ra (or CRI) alone is not a satisfactory measure of the benefit of a light source, since it confers little ability to predict color discrimination (i.e., to perceive subtle difference in hue) or color preference. There appears to be a natural human attraction to brighter color. Daylight provides a spectrum of light that allows the human eye to perceive bright and vivid colors, which allows objects to be distinguished even with subtle color shade differences. Accordingly, it is generally recognized that daylight and blackbody sources are superior to many artificial light sources for emphasizing and distinguishing color. The ability of human vision to differentiate color is different under correlated color temperature conditions providing the same CRI Ra. Such differentiation is proportional to the gamut of the illuminating light.

Gamut area of a light source can be calculated as the area enclosed within a polygon defined by the chromaticities in CIE 1976 u'v' color space of the eight color chips used to calculate CRI Ra when illuminated by a test light source. Gamut area index (GAI) is a convenient way of characterizing in chromaticity space how saturated the illumination makes objects appear—with a larger GAI making object colors appear more saturated. GAI is a relative number whereby an imaginary equal-energy spectrum (wherein radiant power is equal at all wavelengths) is scored as 100. GAI for a test source is determined by comparing color space area of the light being tested to the color space area produced by the imaginary or theoretical equal-energy spectrum (EES) source. Unlike CRI Ra (or CRI), which has a maximum value of 100, GAI can exceed 100, meaning that some sources saturate colors more than an equal-energy source serves to saturate color.

It is found that typical blackbody-like light sources and typical daylight-like light sources have different gamut areas. Low correlated color temperature (CCT) sources (e.g., incandescent emitters) have a GAI of approximately 50% (i.e., about half the gamut area of the EES source). Sources with higher CCT values have a larger GAI. For example, a very bluish light with a CCT of 10000K may have a GAI of 140%.

Another way of characterizing how saturated an illuminant makes objects appear is relative gamut area, or Qg, which is the area formed by (a*, b*) coordinates of the 15 test-color samples in CIELAB normalized by the gamut area of a reference illuminant at the same CCT and multiplied by 100. In a manner similar to GAI, Qg values can exceed 100; however, Qg values are scaled for consistency relative to CCT. Because of chromatic adaptation, and because CCT is selected to set the overall color tone of an environment as part of the lighting design process, variable-reference measures such as Qg may be especially relevant to applied lighting design. If the relative gamut is greater than that of the reference, and illuminance is lower than that provided by daylight, then an increase in preference and discrimination might be expected relative to the reference at that same CCT. Conversely, if the relative gamut is smaller than that of the reference, then a decrease in preference and discrimination might be expected relative to the reference at the same CCT.

It is believed that, in at least certain contexts, some consumers may prefer light sources with enhanced vividness. However, it may be challenging to provide enhanced vividness in combination with high color rendering suitable for general illumination, and may be even more challenging to provide the foregoing characteristics in combination with high luminous efficacy.

The art continues to seek improved solid state lighting devices providing desirable illumination characteristics and capable of overcoming challenges associated with conventional lighting devices.

SUMMARY

The present disclosure relates to a lighting device and lighting method capable of providing high color-quality light. In certain aspects, a lighting device simultaneously provides high color fidelity (e.g., high CRI), high color saturation (e.g., high Qg), and high efficiency (e.g., lumens per watt). Such features may be provided with an electrically activated solid state emitter arranged to output light having a dominant wavelength in the blue range, at least one lumiphoric material arranged to output light having a dominant wavelength in the green or yellow-green range, and another electrically activated solid state emitter arranged to output light having a dominant wavelength in the red or red-orange range. It has been found that if the blue light-emitting source has a sufficiently short wavelength and the at least one lumiphoric material is selected to include sufficient green content, increased saturation can be achieved with a relatively short peak wavelength red (or red-orange) light-emitting source while still maintaining high color fidelity and high efficiency. In certain embodiments, a mixture of multiple lumiphoric materials is provided. A subcombination of light including lumiphor emissions and an unabsorbed portion of the blue emissions (e.g., with the subcombination corresponding to BSY/G or BSG emissions) may produce a mixture of light having a color point within one or more specified regions of a 1931 CIE Chromaticity Diagram.

In one aspect, the present disclosure relates to a lighting device comprising at least one first electrically activated solid state emitter arranged to generate first emissions comprising a dominant wavelength in a blue range; at least one lumiphoric material arranged to receive at least a portion of the first emissions and produce lumiphor emissions comprising a dominant wavelength in a green or yellow-green range; and at least one second electrically activated solid state emitter arranged to generate second emissions comprising a dominant wavelength in a red or red-orange range; wherein a combination of (A) the lumiphor emissions and (B) an unabsorbed portion of the first emissions transmitted through or past the at least one lumiphoric material would, in the absence of any additional light, produce a mixture of light having a color point on a 1931 CIE Chromaticity Diagram including x, y coordinates that define a point on or within a closed shape bounded by a first line having x, y endpoint coordinates of (0.040, 0.329) and (0.309, 0.349), a second line having x, y endpoint coordinates of (0.309, 0.349) and (0.391, 0.509), a third line having x, y endpoint coordinates of (0.391, 0.509) and (0.020, 0.770), and a curve corresponding to a portion of the spectrum locus having x, y endpoint coordinates of (0.020, 0.770) and (0.040, 0.329); wherein aggregate emissions of the lighting device include at least a portion of the first emissions, at least a portion of the lumiphor emissions, and at least a portion of the second emissions; and wherein said aggregate emissions comprise a color rendering index (CRI Ra) value of at least 85, said aggregate emissions comprise a correlated color temperature (CCT) value, and said aggregate emissions comprise a relative gamut area (Qg) value of at least the value obtained by the equation 116.5 minus the product of 0.003 times the CCT value. In certain embodiments, the combination of (A) the lumiphor emissions and (B) an unabsorbed portion of the first emissions may define a point on or within one or more subregions of the closed shape. In certain embodiments, the aggregate emissions may include a CRI Ra value of at least 90, a luminous efficacy of at least 80 (more preferably at least 95, or still more preferably at least 115) lumens per watt, a CCT value in a range of from 2000K to 5000K, and/or a R9 color rendering value of at least 50 (or at least 60, at least 70, or at least 80 according to certain embodiments). In certain embodiments, a green lumiphor and a yellow lumiphor may be present in combination, with a proportion of green lumiphor to yellow lumiphor being at least 1:1, at least 1.5:1, at least 2:1, at least 3:1, at least 4:1, or at least 5:1. In certain embodiments, the first emissions may include a dominant wavelength not exceeding 465 nm (such as in a range of from 447 nm to 465 nm, or in a subrange of from 447 nm to 455 nm, or in a subrange of not exceeding 455 nm), and the second emissions may include a peak wavelength of less than 628 nm (such as in a range of from 615 nm to 627 nm).

In another aspect, the present disclosure relates to a lighting device comprising at least one first electrically activated solid state emitter arranged to generate first emissions comprising a dominant wavelength in a blue range; at least one lumiphoric material arranged to receive at least a portion of the first emissions and produce lumiphor emissions comprising a dominant wavelength in a green or yellow-green range; and at least one second electrically activated solid state emitter arranged to generate second emissions comprising a dominant wavelength in a red or red-orange range; wherein a combination of (A) the lumiphor emissions and (B) an unabsorbed portion of the first emissions transmitted through or past the at least one lumiphoric material would, in the absence of any additional light, produce a mixture of light having a color point on a 1931 CIE Chromaticity Diagram including x, y coordinates that define a point on or within a closed shape bounded by a first line having x, y endpoint coordinates of (0.264, 0.346) and (0.309, 0.349), a second line having x, y endpoint coordinates of (0.309, 0.349) and (0.391, 0.509), a third line having x, y endpoint coordinates of (0.391, 0.509) and (0.337, 0.547), and a fourth line having x, y endpoint coordinates of (0.337, 0.547) and (0.264, 0.346); wherein aggregate emissions of the lighting device include at least a portion of the first emissions, at least a portion of the lumiphor emissions, and at least a portion of the second emissions, and said aggregate emissions comprise a correlated color temperature (CCT) value; and wherein said aggregate emissions comprise at least one of the following features (i) to (iv): (i) a color rendering index (CRI Ra) value of at least 85, (ii) a relative gamut area (Qg) value of at least the value obtained by the equation 116.5 minus the product of 0.003 times the CCT value, (iii) a luminous efficacy of at least 80 lumens per watt; and (iv) a R9 color rendering value at least 50 (or at least 60, at least 70, or at least 80 according to certain embodiments). In certain embodiments, the combination of (A) the lumiphor emissions and (B) an unabsorbed portion of the first emissions may define a point on or within one or more subregions of the closed shape. In certain embodiments, a green lumiphor and a yellow lumiphor may be present in combination, with a proportion of green lumiphor to yellow lumiphor being at least 1:1, at least 1.5:1, or at least 2:1. In certain embodiments, the first emissions may include a dominant wavelength not exceeding 465 nm (such as in a range of from 447 nm to 465 nm, or in a subrange of from 447 nm to 455, or in a subrange of not exceeding 455 nm), and the second emissions may include a peak wavelength of less than 628 nm (such as in a range of from 615 nm to 627 nm).

In another aspect, the invention relates to a method comprising illuminating an object, a space, or an environment, utilizing a solid state lighting device as described herein.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Other aspects, features and embodiments of the invention will be more fully apparent from the ensuing disclosure and appended claims.

BRIEF DESCRIPTION OF THE DRAWINGS

FIGS. 7A-7B are contour plots of Qg and CRI Ra, respectively, as a function of blue LED dominant wavelength and red (or red-orange) LED dominant wavelength for a GAL 535 green phosphor at a CCT of 3449K.

FIG. 15 is a table providing performance values and characteristics for high-Qg BSY/G+R lighting devices including 450.6 nm dominant wavelength blue LEDs, a 1:1 mixture of GAL535:NYAG7 green and yellow phosphors, and a mix of 611.5 nm and 615.5 nm dominant wavelength red (or red-orange) LEDs providing a peak wavelength of 624 nm, corresponding performance values and characteristics and for a point-of-reference CR22 BSY+R device including 458.1 nm dominant wavelength blue LEDs, NYAG4 yellow phosphor, and 613.5 nm dominant wavelength LEDs.

DETAILED DESCRIPTION

As noted previously, the art continues to seek solid state lighting devices providing desirable illumination characteristics. Color quality has been traditionally been defined with respect to CRI, which considers fidelity relative to daylight or an equal energy source. But it has been confirmed by the applicants that higher vibrancy associated with more saturated colors may be preferred by a majority of consumers, at least in certain environments such as retail stores, restaurants, grocery stores, auto dealers, etc. Strong separation of reds, greens, and blues in a light source tend to support high Qg, but not always in combination with high CRI and high efficacy.

Various embodiments disclosed herein relate to lighting devices capable of simultaneously providing high color fidelity (e.g., high CRI), high color saturation (e.g., high Qg), and high efficiency (e.g., lumens per watt). Preferred lighting devices include an electrically activated solid state emitter arranged to output light having a dominant wavelength in the blue range, at least one lumiphoric material arranged to output light having a dominant wavelength in the green or yellow-green range, and another electrically activated solid state emitter arranged to output light having a dominant wavelength in the red or red-orange range. Increased saturation can be achieved with a relatively short wavelength red light-emitting source (e.g., red LED) while maintaining high color fidelity and high efficiency if the blue light-emitting source has a sufficiently short wavelength and the at least one lumiphoric material is selected to include sufficient green content. In certain embodiments, a mixture of multiple lumiphoric materials is provided, such as a mixture of green and lumiphoric materials. In certain embodiments, green lumiphoric material is present in an amount and/or concentration exceeding that of a yellow lumiphoric material. A subcombination of light including lumiphor emissions and an unabsorbed portion of the blue emissions (e.g., with the subcombination corresponding to BSY/G or BSG emissions) may produce a mixture of light having a color point within one or more specified regions of a 1931 CIE Chromaticity Diagram.

Figure 1:
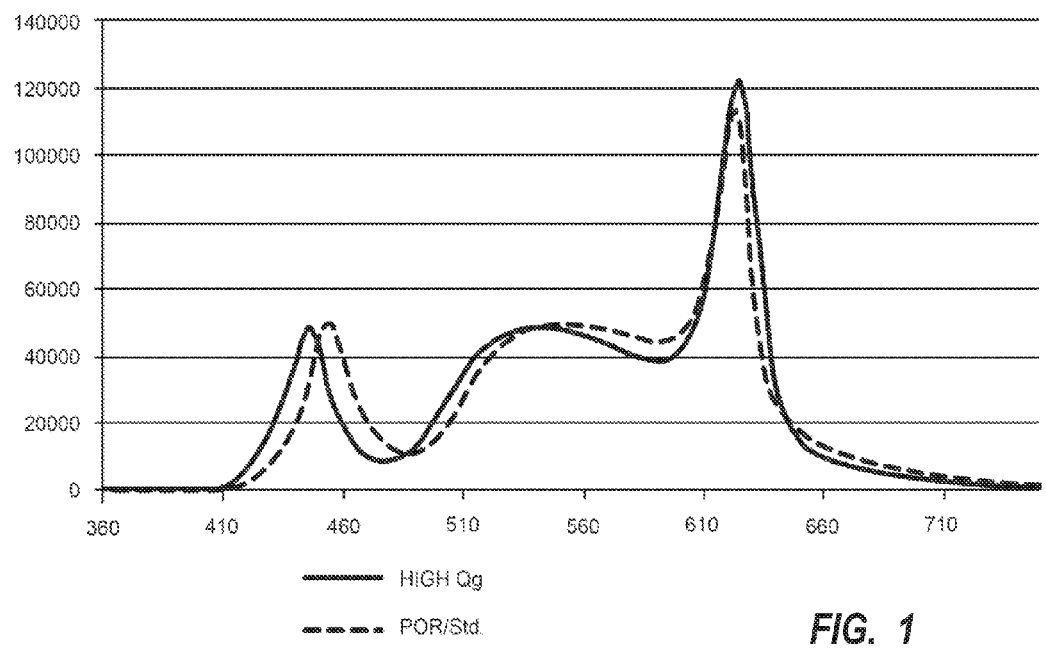
FIG. 1 is a spectral diagram including intensity as a function of wavelength (in nm) for a point-of-reference or standard "blue-shifted yellow plus red" (BSY+R) lighting device and a high Qg "blue-shifted yellow-green plus red" (BSY/G+R) or "blue-shifted green plus red" (BSG+R) modeled lighting device.

FIG. 1 is a spectral diagram providing intensity as a function of wavelength (in nm) for a point-of-reference (POR) or standard "blue-shifted yellow plus red" (BSY+R) LED lighting device and a high Qg "blue-shifted yellow-green plus red" (BSY/G+R) or "blue-shifted green plus red" (BSG+R) modeled LED lighting device. As shown in FIG. 1, relative to the POR source, the high Qg source includes blue LED emissions with a shorter blue peak wavelength (shown at left), a shorter phosphor peak wavelength (shown at middle), and red LED emissions with greater intensity (shown at right). The shorter peak wavelengths of the blue and yellow/green emissions permit a greater proportion of lumens to be delivered by the red LED.

Figure 2:
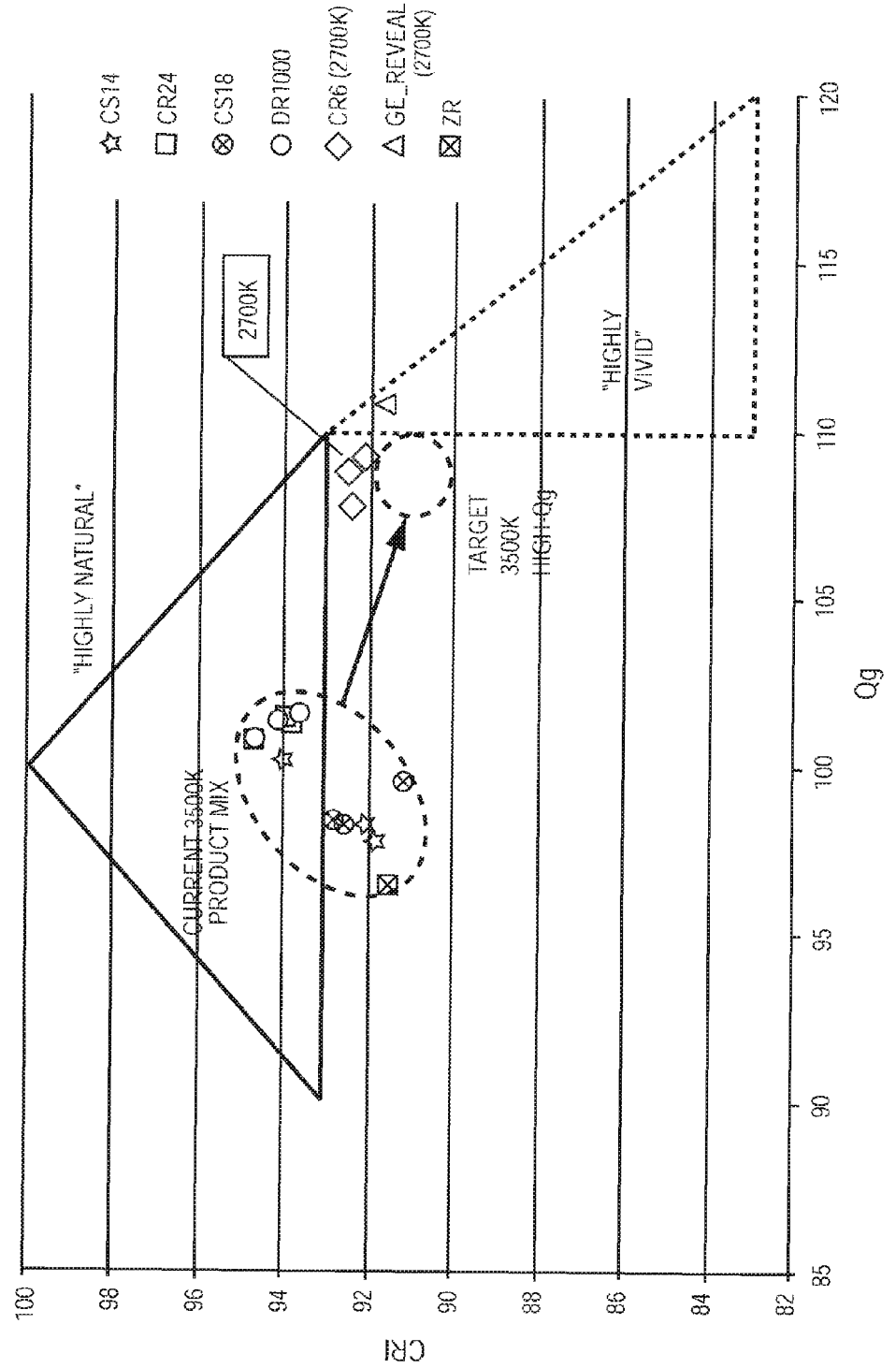
FIG. 2 is an orthogonal plot of CRI Ra and Qg including "highly natural" and "highly vivid" triangular regions, and including points identifying values for various currently available 3500K products and 2700K products, and identifying a target 3500K high Qg/high CRI region.

FIG. 2 is an orthogonal plot of CRI and Qg. The non-overlapping character of the triangular-shaped "highly natural" and "highly vivid" regions demonstrate the existence of a trade-off between fidelity and vividness. "Highly natural" sources as shown in FIG. 2 typically have a CRI of at least 90 or greater, and Qg values at or near 100. FIG. 2 includes points identifying values for various currently available 3500K products and certain 2700K products, and identifying a target 3500K high Qg/high CRI region. As Qg values increase, the number of sources having high CRI diminishes. It should be noted that Qg is affected by CCT. Sources with CCT values less than 3000K naturally tend to have higher Qg values due to presence of significant red content. As CCT values increase, reduced relative red content tends to cause Qg values to decline. All of the sources having Qg values greater than 105 in FIG. 2 have nominal CCT values of 2700K. Of those higher Qg sources, the GE Reveal® LED bulb further includes a neodymium notch filtering element that tends to further enhance Qg. The remaining sources are produced by Cree, Inc. (Durham, N.C., US). A "target 3500K high Qg" region shown in FIG. 2 includes a CRI of at least 90 and a Qg value of at least 106.5 and represents an initial target defined by the applicants. Such target pertains to certain embodiments only, and is not intended to limit the scope of the subject matter disclosed and claimed herein.

More specific aspects of the invention will be described after terms are defined and general concepts are introduced.

Unless otherwise defined, terms used herein should be construed to have the same meaning as commonly understood by one of ordinary skill in the art to which this invention belongs. It will be further understood that terms used herein should be interpreted as having a meaning that is consistent with their meaning in the context of this specification and the relevant art, and should not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

Embodiments of the invention are described herein with reference to cross-sectional, perspective, elevation, and/or plan view illustrations that are schematic illustrations of idealized embodiments of the invention. Variations from the shapes of the illustrations as a result, for example, of manufacturing techniques and/or tolerances, are to be expected, such that embodiments of the invention should not be construed as limited to particular shapes illustrated herein. The invention may be embodied in different forms and should not be construed as limited to the specific embodiments set forth herein. In the drawings, the size and relative sizes of layers and regions may be exaggerated for clarity. In certain drawings, conventional features inherent to LED devices known in the art but not essential to the understanding of the invention have been omitted to facilitate ease of explanation of the inventive subject matter.

Unless the absence of one or more elements is specifically recited, the terms "comprising," "including," and "having" as used herein should be interpreted as open-ended terms that do not preclude the presence of one or more elements.

It will be understood that when an element such as a layer, region, or substrate is referred to as being "on" another element, it can be directly on the other element or intervening elements may be present. Moreover, relative terms such as "on," "above," "upper," "top," "lower," or "bottom" may be used herein to describe a relationship between one structure or portion to another structure or portion as illustrated in the figures, but it should be understood that such relative terms are intended to encompass different orientations of the device in addition to the orientation depicted in the figures.

The terms "solid state light emitter" or "solid state emitter" (which may be qualified as being "electrically activated") may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. Solid state light emitting devices according to embodiments disclosed herein may include, but are not limited to, III-V nitride based LED chips or laser chips fabricated on a silicon, silicon carbide, sapphire, or III-V nitride growth substrate, including (for example) devices manufactured and sold by Cree, Inc. of Durham, N.C.

Solid state light emitters may be used individually or in groups to emit one or more beams to stimulate emissions of one or more lumiphoric materials (e.g., phosphors, scintillators, lumiphoric inks, quantum dots, day glow tapes, etc.) to generate light at one or more peak wavelength, or of at least one desired perceived color (including combinations of colors that may be perceived as white). Lumiphoric materials may be provided in the form of particles, films, or sheets.

Inclusion of lumiphoric (also called "luminescent") materials in lighting devices as described herein may be accomplished by any suitable means, including: direct coating on solid state emitters, dispersal in encapsulant materials arranged to cover solid state emitters; coating on lumiphor support elements (e.g., by powder coating, inkjet printing, or the like); incorporation into diffusers or lenses; and the like. Examples of lumiphoric materials are disclosed, for example, in U.S. Pat. No. 6,600,175 and in U.S. Patent Application Publication Nos. 2009/0184616 and 2012/0306355, and methods for coating light emitting elements with phosphors are disclosed in U.S. Patent Application Publication No. 2008/0179611, with the foregoing publications being incorporated by reference. Other materials, such as light scattering elements (e.g., particles) and/or index matching materials, may be associated with a lumiphoric material-containing element or surface. One or more lumiphoric materials useable in devices as described herein may be down-converting or up-converting, or can include a combination of both types.

Examples of phosphors that may be used according to various embodiments include, without limitation, cerium (III)-doped yttrium aluminum garnet (Ce:YAG or YAG:Ce); yttrium aluminum oxide doped with cerium yttrium aluminum garnet (NYAG); lutetium aluminum garnet (LuAG), green aluminate (GAL, including but not limited to GAL535); $(Sr,Ba,Ca)_2\text{-}xSiO_4\text{:}Eu_x$ (BOSE, including both BOSE yellow and BOSE green varieties, including for example $(Ba,Sr)_2SiO_4\text{:}Eu^{2+}$); and CASN ($CaAlSiN_3\text{:}Eu^{2+}$). In certain embodiments, two or more phosphors may be mixed or provided in one or more discrete regions of a single lighting device.

In certain embodiments, at least one lumiphoric material may be spatially segregated ("remote") from and arranged to receive emissions from at least one electrically activated solid state emitter, with such spatial separation reducing thermal coupling between a solid state emitter and lumiphoric material. In certain embodiments, a spatially segregated lumiphor may be arranged to fully cover one or more electrically activated emitters of a lighting device. In certain embodiments, a spatially segregated lumiphor may be arranged to cover only a portion or subset of one or more emitters electrically activated emitters.

In certain embodiments, at least one lumiphoric material may be arranged with a substantially constant thickness and/or concentration relative to different electrically activated emitters. In certain embodiments, one or more lumiphoric materials may be arranged with presence, thickness, and/or concentration that vary relative to different emitters. Multiple lumiphors (e.g., lumiphors of different compositions) may be applied with different concentrations or thicknesses relative to different electrically activated emitters. In one embodiment, lumiphor presence, composition, thickness and/or concentration may vary relative to multiple electrically activated emitters. In certain embodiments, at least one lumiphoric material may be applied to a solid state emitter or a lumiphoric material support surface by patterning, which may be aided by one or more masks.

Various substrates may be used as mounting elements on which, in which, or over which multiple solid state light emitters (e.g., emitter chips) may be arranged or supported (e.g., mounted). Exemplary substrates include printed circuit boards (including but not limited to metal core printed circuit boards, flexible circuit boards, dielectric laminates, and the like) having electrical traces arranged on one or multiple surfaces thereof. A substrate, mounting plate, or other support element may include a printed circuit board (PCB), a metal core printed circuit board (MCPCB), a flexible printed circuit board, a dielectric laminate (e.g., FR-4 boards as known in the art) or any suitable substrate for mounting LED chips and/or LED packages.

In certain embodiments, one or more LED components can include one or more "chip-on-board" (COB) LED chips and/or packaged LED chips that can be electrically coupled or connected in series or parallel with one another and mounted on a portion of a substrate. In certain embodiments, COB LED chips can be mounted directly on portions of substrate without the need for additional packaging.

Certain embodiments may involve use of solid state emitter packages. A solid state emitter package may include at least one solid state emitter chip (more preferably multiple solid state emitter chips) that is enclosed with packaging elements to provide environmental protection, mechanical protection, color selection, and/or light focusing utility, as well as electrical leads, contacts, and/or traces enabling electrical connection to an external circuit. One or more emitter chips may be arranged to stimulate one or more lumiphoric materials, which may be coated on, arranged over, or otherwise disposed in light receiving relationship to one or more solid state emitters. At least one lumiphoric material may be arranged to receive emissions of at least some emitters of a plurality of solid state light emitters and responsively emit lumiphor emissions. A lens and/or encapsulant material, optionally including lumiphoric material, may be disposed over solid state emitters, lumiphoric materials, and/or lumiphor-containing layers in a solid state emitter package.

In certain embodiments, a light emitting apparatus as disclosed herein (whether or not including one or more LED packages) may include at least one of the following items arranged to receive light from multiple LEDs: a single leadframe arranged to conduct electrical power to the plurality of electrically activated solid state light emitters; a single reflector arranged to reflect at least a portion of light emanating from the plurality of electrically activated solid state light emitters; a single submount or mounting element supporting the plurality of electrically activated solid state light emitters; a single lens arranged to transmit at least a portion of light emanating from the plurality of electrically activated solid state light emitters; and a single diffuser arranged to diffuse at least a portion of light emanating from the plurality of electrically activated solid state light emitters. In certain embodiments, a light emitting apparatus including multiple LEDs may include at least one of the following items arranged to receive light from multiple LEDs: multiple lenses, multiple optical elements, and multiple reflectors. Examples of optical elements include, but are not limited to, elements arranged to affect light mixing, focusing, collimation, dispersion, and/or beam shaping.

In certain embodiments, a solid state lighting device (e.g., package) may include a reflector cup defining a cavity, at least one solid state emitter arranged within the cavity, and encapsulant material arranged within the cavity. In certain embodiments, at least one solid state emitter may be arranged over a substrate and at least partially surrounded by a boundary wall (optionally embodying at least one dispensed dam material laterally spaced from the emitter(s)), with an encapsulant material arranged over the emitter(s) and in contact with the at least one boundary wall.

The expressions "lighting device," "light emitting device," and "light emitting apparatus" as used herein are not limited, except that such elements are capable of emitting light. That is, a lighting device or light emitting apparatus can be a device which illuminates an area or volume, e.g., a structure, a swimming pool or spa, a room, a warehouse, an indicator, a road, a parking lot, a vehicle, signage (e.g., road signs), a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, street lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting (work lights, etc.), mirrors/vanity lighting, or any other light emitting devices. In certain embodiments, lighting devices or light emitting apparatuses as disclosed herein may be self-ballasted. In certain embodiments, a light emitting apparatus may be embodied in a light fixture.

In preferred embodiments, a solid state lighting device is devoid of any incandescent light emitting element. In certain embodiments, a solid state lighting device lacks any "unconverted" blue-emitting solid state emitter not arranged to stimulate emissions of a lumiphoric material.

Subject matter herein relates in certain embodiments to a method of illuminating an object, space, or enclosure using at least one lighting device or lighting apparatus as disclosed herein, optionally by energizing a single power line connected to multiple lighting devices and/or by pulse width modulation control of the at least one lighting device or lighting apparatus.

Subject matter herein relates in certain embodiments to an illuminated enclosure (the volume of which can be illuminated uniformly or non-uniformly), comprising an enclosed space and at least one lighting device or light emitting apparatus as disclosed herein, wherein at least one lighting device or light emitting apparatus illuminates at least a portion of the enclosure (uniformly or non-uniformly). Subject matter herein further relates to an illuminated area comprising at least one item selected from among the group consisting of a structure, a swimming pool or spa, a room, a warehouse, an indicator, a road, a parking lot, a vehicle, signage (e.g., road signs), a billboard, a ship, a toy, a mirror, a vessel, an electronic device, a boat, an aircraft, a stadium, a computer, a remote audio device, a remote video device, a cell phone, a tree, a window, a LCD display, a cave, a tunnel, a yard, a lamppost, etc., having mounted therein or thereon at least one lighting device or light emitting apparatus as described herein. Methods include illuminating an object, a space, or an environment, utilizing one or more lighting devices or light emitting apparatuses as disclosed herein. In certain embodiments, a lighting apparatus as disclosed herein includes multiple LED components arranged in an array (e.g., a two-dimensional array).

In certain embodiments, lighting devices as disclosed herein may provide emissions exhibiting enhanced vividness in combination with relatively high CRI Ra (e.g., according to one or more threshold ranges for Qg and CRI Ra recited herein) without use of any notch filtering material arranged to affect reflection or to at least partially inhibit transmission of light. A notch filtering material when arranged on or in a light transmissive surface of a lighting device will inherently entail at least some attenuation of light and concomitant reduction of luminous efficacy. Presence of notch filtering material in a lighting device may also increase need for heat dissipating structures (e.g., heatsinks) since notch filtering material is subjected to being heated by absorbed light energy. As a result, providing a lighting device that is devoid of notch filtering material may avoid reduction of luminous efficacy, and may reduce need for heat dissipating structures, relative to a lighting device incorporating a notch filtering material.

In other embodiments, lighting devices as disclosed herein may include or have associated therewith one or more notch filtering materials, such as to enhance GAI and/or CRI Ra. The term "notch filtering material" refers to a material that affects passage of light to cause light exiting the material to exhibit a spectral notch. A spectral notch is a portion of the color spectrum where the light is attenuated, thus forming a "notch" when light intensity is plotted against wavelength. Examples of notch filtering materials include rare earth and lanthanide materials, such as lanthanum, cerium, praseodymium, neodymium, promethium, samarium, europium, gadolinium, terbium, dysprosium, holmium, erbium, thulium, ytterbium, lutetium, scandium, and yttrium, as well as oxides thereof (e.g., neodymium oxide). Color pigments can impart notch filtering properties in either transmissive or reflective applications. In many instances, color pigments may provide softer spectral notch (with more gradually sloping wavelength attenuation) characteristics relative to other notch filtering materials. One example of a color pigment includes an ultramarine pigment based on $CoAl_2O_4$, providing peak attenuation at a wavelength of about 580 nm. A cobalt blue pigment of similar composition could also be used. Other color pigments based on $CuSO_4$ or $NiCl_2$ can also be used. If provided, a notch filtering material may be added to a light-transmissive element, a light scattering element, and/or a light reflecting element.

Figure 3:
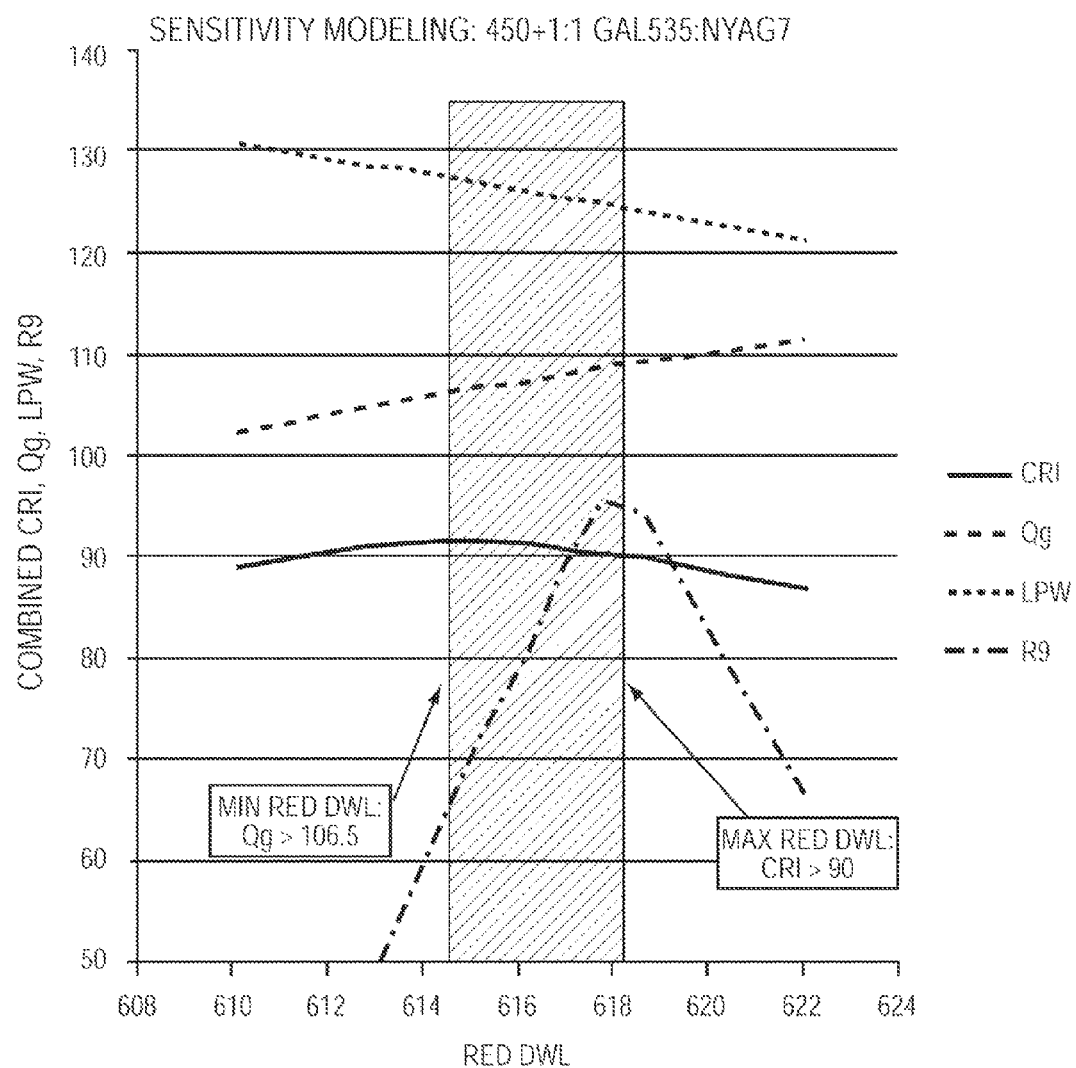
FIG. 3 is a line chart depicting CRI Ra, Qg, lumens per watt, and R9 along the y-axis versus red (or red-orange) LED dominant wavelength along the x-axis obtained by modeling BSY/G+R lighting devices including a 1:1 mixture of GAL535:NYAG7 green and yellow phosphors, showing that Qg>106.5 and CRI Ra>90 can be obtained for red (or red-orange) LED wavelengths in a range of from 614.5 nm to 618 nm at a CCT of 3449K.

As mentioned above in connection with FIG. 2, a high Qg region for 3500K light sources including a CRI of at least 90 and a Qg value of at least 106.5 was identified as an initial target for investigating an ability to simultaneously provide high Qg, high CRI, and high efficacy from a lighting device. Spectral modeling was performed with a 450 nm dominant wavelength LED and a 1:1 mixture of GAL535 (green) phosphor and NYAG (yellow) phosphor to determine sensitivity of parameters such as CRI, Qg, luminous efficacy (lumens per watt), and R9 color rendering to dominant red LED wavelength (e.g., in a range of red dominant wavelengths from 610 nm to 623 nm). Results of such sensitivity modeling are shown in FIG. 3, which is a line chart depicting CRI, Qg, lumens per watt, and R9 along the y-axis versus red LED dominant wavelength along the x-axis. As shown in FIG. 3, a CRI values above 90 may be attained in combination with Qg values greater than 106.5 with red LEDs having dominant wavelengths in a range of about 614.5 nm to 618 nm. FIG. 3 does not take into account sensitivity of the foregoing parameters to blue LED dominant wavelength.

Figure 4:
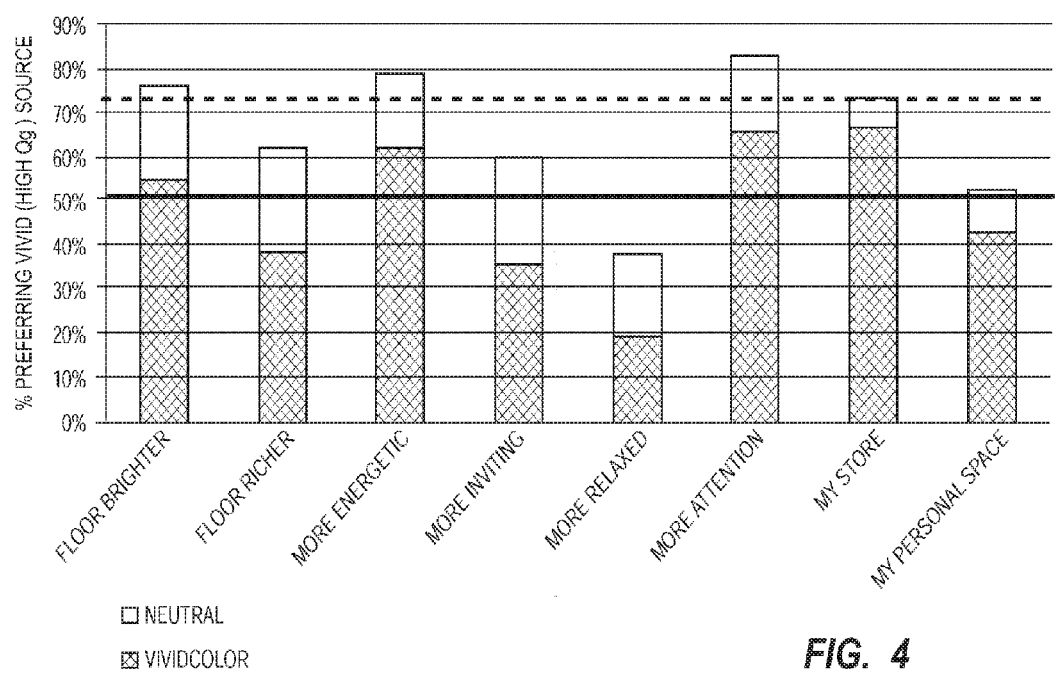
FIG. 4 is a bar chart summarizing results of surveying 42 observers of two side-by-side identical object-containing rooms differently illuminated with standard BSY+R and high-Qg BSY/G+R sources each at a CCT of 3449K on a scale of 0 (neutral) to 5 (strong preference) for eight criteria.

To start to address the question of whether high Qg matters to consumers, surveys were administered to 42 people who observed two side-by-side object-containing identical rooms that were illuminated differently. One room was illuminated with Cree TrueWhite® BSY+R lamps (Qg=100, CRI=94, R9=56) as a point of reference or standard source, and the other room was illuminated with prototype Cree BSY/G+R lamps (Qg=108, CRI=92, R9=88) embodying a "High-Qg" source. Both rooms were illuminated with equal illuminance (+/−2%) and substantially equal color points (within 0.0005 delta u'v'). Observers rated the two sides on a scale of 0 (neutral) to 5 (strong preference) for six specific traits (i.e., floor brighter, floor richer, more energetic, more relaxed, and more attention) as well as overall preference if the observer owned a retail store, and overall preference for a personal "home or workspace." Results of the survey are summarized in FIG. 4. 65% of the respondents cited the High-Qg side as more "attention-grabbing" or preferred for the retail floor of "their store." Including neutral responses, 80% of the respondents found the High-Qg side as being equal or better at making objects grab attention. 75% of the respondents cited the High-Qg side as equal or better for brighter floors. Conversely, 60% of the respondents cited the standard (point of reference) source as being "more relaxed." No clear preference was established for personal "home or workspace." The preceding survey demonstrates a clear majority preference for high-Qg sources for retail or "high energy" lighting applications.

To determine process windows for obtaining high Qg lighting devices including blue LEDs, phosphors, and red LEDs, various combinations of blue LEDs (having dominant wavelengths of 446.9 nm, 450.6 nm, and 455.6 nm), yellow/green phosphor combinations (2:1 GAL535: NYAG4, 1:1 GAL535:NYAG4, and 1:2 GAL535:NYAG4), and red (or red-orange) LEDs (having dominant wavelengths of 605 nm, 610 nm, 614 nm, and 618 nm) were measured at a temperature of 80° C. and a luminous flux range of 100-350 mA. Measurements were taken for 4 pieces of each component. Lumens per watt values for each component were corrected to factory blue (for BSY/G combination) or red radiant flux. It was assumed that system spectra (e.g., BSY/G+R system) would equal the sum of component spectra (e.g., blue LED, Y/G phosphor, and red or red-orange LED). Total spectrum was tuned to the desired color point by calculation of $I_f$ values. A fixed blue shifted phosphor to red LED component ratio of 2:1 was selected, including 1 high saturation BSY/G plus one low-saturation BSY and 1 red or red-orange LED.

Figure 5A:
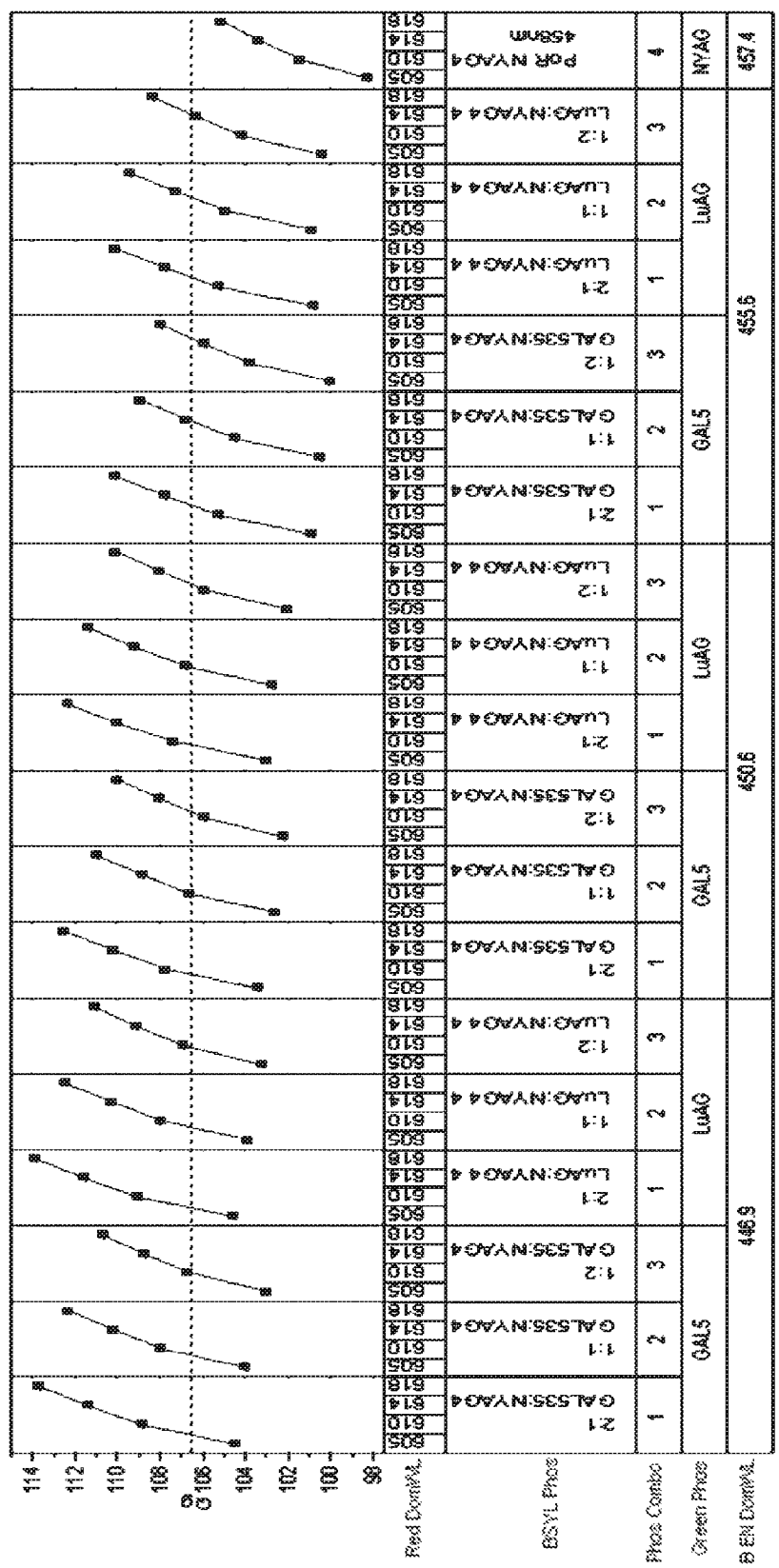
FIG. 5A is a variability chart mapping Qg response for devices including eighteen (18) different blue LED and yellow-green phosphor combinations, each in combination with four different red or red-orange LEDs (having dominant wavelengths of 605 nm, 610 nm, 614 nm, and 618 nm), plus Qg response for a point-of-reference BSY source in combination with four different red (or red-orange) LEDs, with each BSY/G+R and BSY+R source having a CCT of 3449K and having a ratio of two phosphor converted blue LEDs to one red (or red-orange) LED.

FIG. 5A is a variability chart mapping Qg response for eighteen (18) different blue LED (having dominant wavelengths of 446.9 nm, 450.6 nm, and 455.6 nm) and yellow/green phosphor combinations (2:1 GAL535:NYAG4, 1:1 GAL535:NYAG4, and 1:2 GAL535:NYAG4), each in combination with four different red or red-orange LEDs (having dominant wavelengths of 605 nm, 610 nm, 614 nm, and 618 nm), together with a point-of-reference BSY source (457.4 nm blue dominant wavelength plus yellow NYAG phosphor) in combination with four different red or red-orange LEDs (605 nm, 610 nm, 614 nm, and 618 nm dominant wavelengths), with each composite source at a CCT of 3449K. The dashed horizontal line in the upper frame of FIG. 5A corresponds to a Qg value of 106.5. General trends observable from FIG. 5A are that Qg generally increases with increasing red LED dominant wavelength, with decreasing blue LED dominant wavelength, and with increasing green:yellow phosphor ratio. The point-of-reference (BSY+R) source (at far right in FIG. 5A) exhibits Qg values that are lower than any other BSY/G+R source shown in FIG. 5A.

Figure 5B:
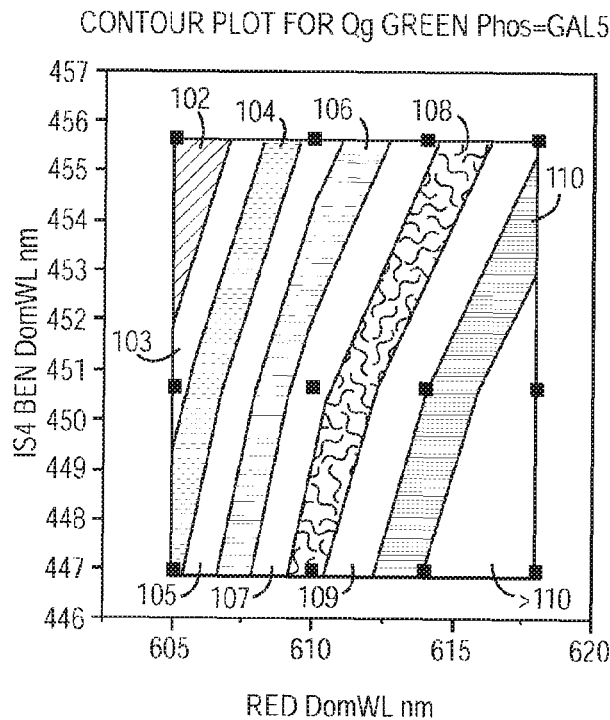
FIGS. 5B-5C are contour plots of Qg as a function of blue LED dominant wavelength and red (or red-orange) LED dominant wavelength for a device including a GAL535 green lumiphor and a device including a LuAG green phosphor, respectively, with each device at a CCT of 3449K.
Figure 5C:
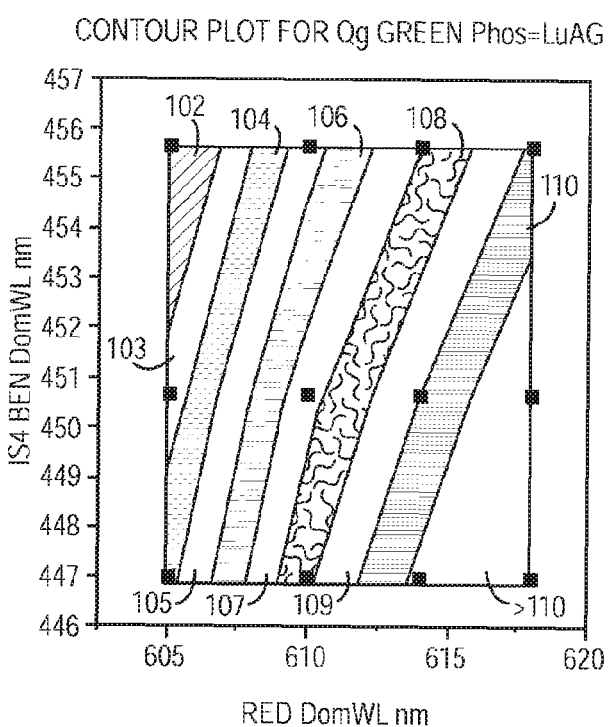

FIG. 5B is a contour plot of Qg as a function of blue LED dominant wavelength and red LED dominant wavelength for device including a GAL535 green lumiphor at a CCT of 3449K. FIG. 5C is a contour plot of Qg as a function of blue LED dominant wavelength and red LED dominant wavelength for a LuAG green lumiphor at a CCT of 3449K.

Figure 6A:
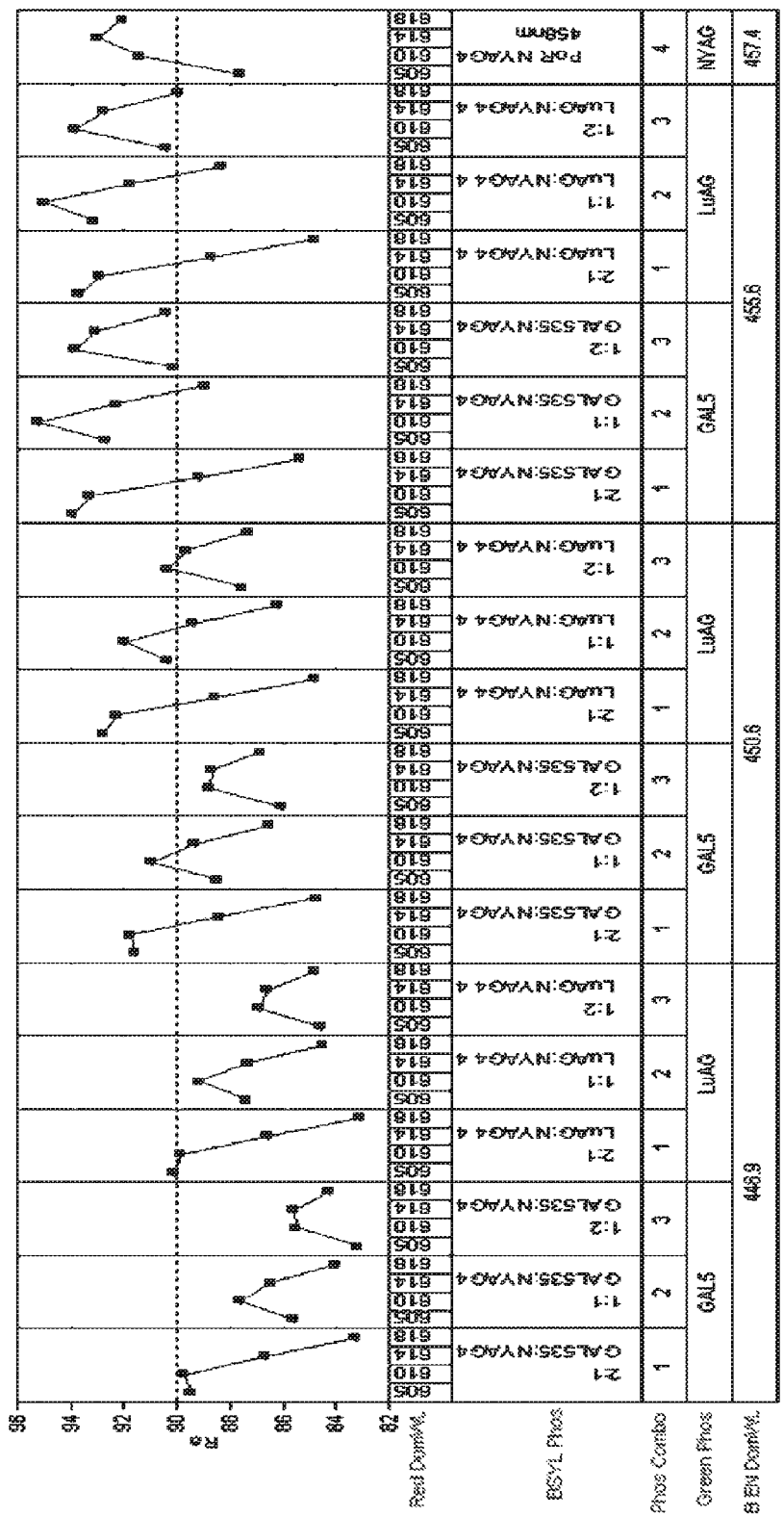
FIG. 6A is a variability chart mapping CRI Ra for the same LED and phosphor combinations as described for FIG. 5A.

FIG. 6A is a variability chart mapping CRI Ra for the same LED and phosphor combinations as described for FIG. 5A. The dashed horizontal line in the upper frame of FIG. 6A coincides to a CRI Ra value of 90. General trends observable from FIG. 6A are that CRI Ra increases with an increase in blue LED dominant wavelength (from 446.9 nm to 450.6 nm, and again from 450.6 nm to 455.6 nm), and that red LED dominant wavelength affects CRI Ra (in most cases exhibiting a distinct peak). Increasing green:yellow phosphor ratio increases CRI Ra for a blue LED dominant wavelength of 450.6 nm, but does not appear to do so for a blue LED dominant wavelength of 455.6 nm. The point-of-reference (BSY+R) source (at far right in FIG. 6A) exhibits CRI Ra values of greater than 90 for all red LED dominant wavelengths at or above 610 nm.

Figure 6B:
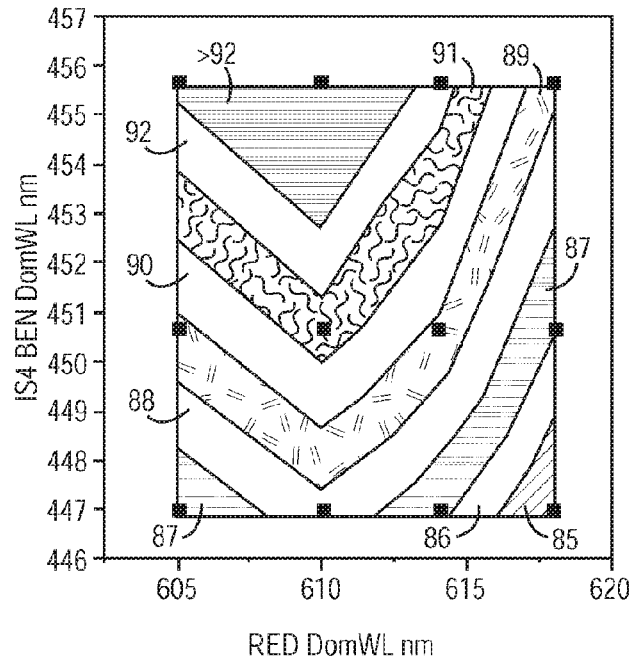
FIG. 6B-6C are contour plots of CRI Ra as a function of blue LED dominant wavelength and red (or red-orange) LED dominant wavelength for a GAL535 green phosphor and for a LuAG green phosphor, respectively, with each combination at a CCT of 3449K.
Figure 6C:
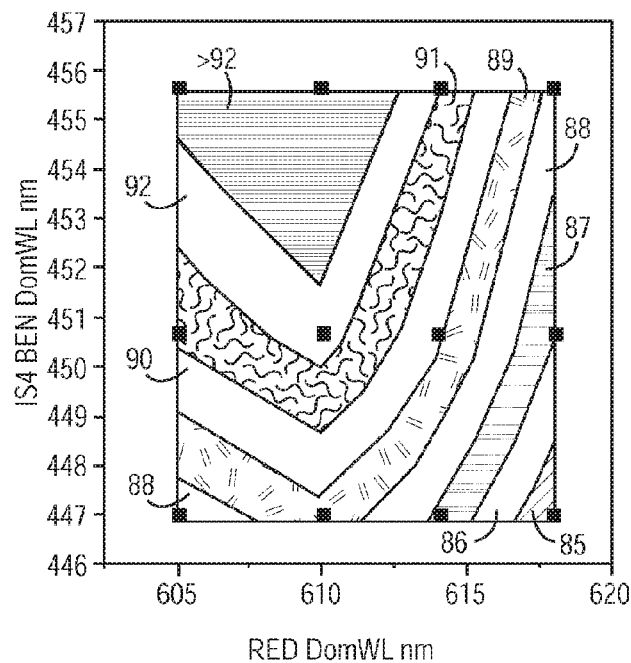

FIG. 6B is a contour plot of CRI Ra as a function of blue LED dominant wavelength and red LED dominant wavelength for a GAL535 green phosphor at a CCT of 3449K. FIG. 6C is a contour plot of CRI Ra as a function of blue LED dominant wavelength and red LED dominant wavelength for a LuAG green phosphor at a CCT of 3449K.

Figure 7C:
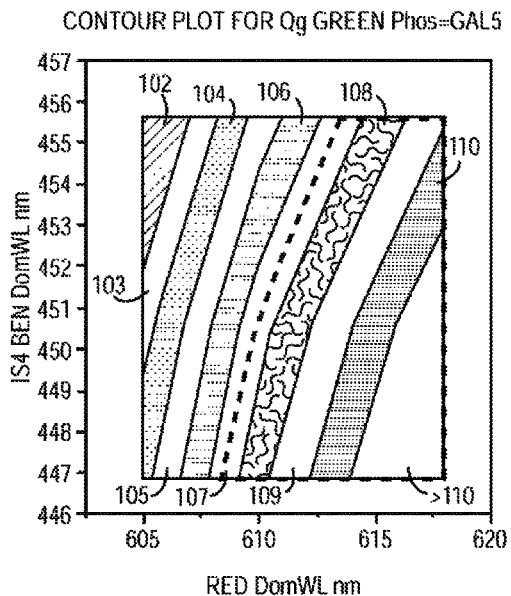
FIG. 7C is an overlap plot of dashed line regions shown in FIGS. 7A-7B.
Figure 7C:
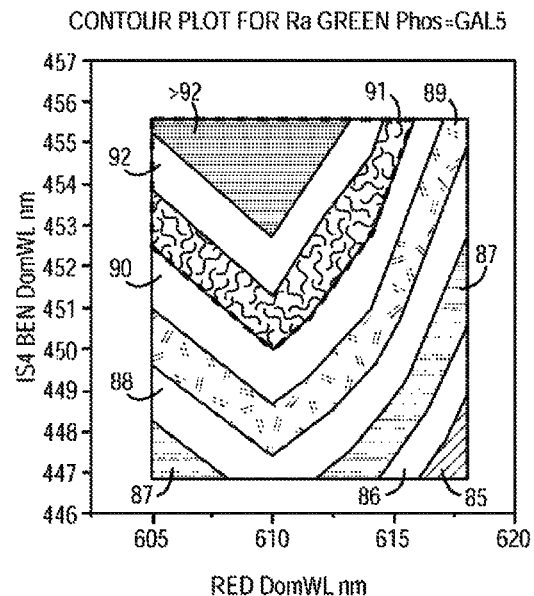
Figure 7C:
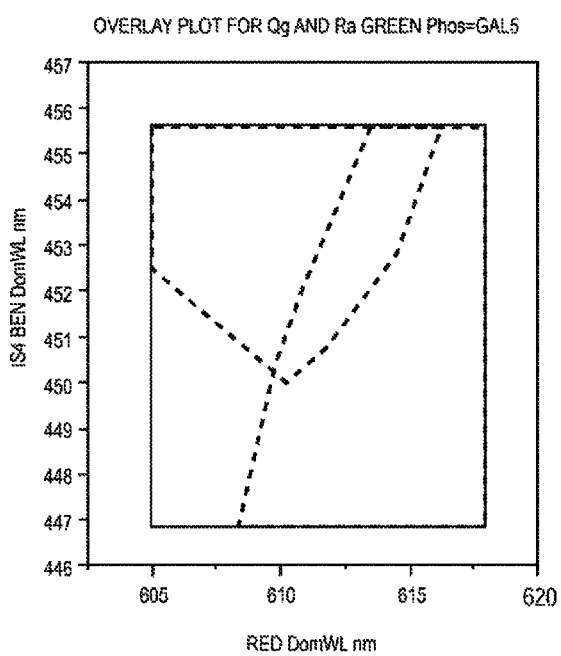

FIG. 7A is a contour plot of Qg as a function of blue LED dominant wavelength and red LED dominant wavelength for a GAL535 green phosphor at a CCT of 3449K, including a dashed line region containing Qg values greater than 106.5. FIG. 7B is a contour plot of CRI Ra as a function of blue LED dominant wavelength and red LED dominant wavelength for a GAL535 green phosphor at a CCT of 3449K, including a dashed line region containing CRI Ra values greater than 90. FIG. 7C is an overlap plot of the dashed line regions of FIGS. 7A-7B, with the intersection representing a window of conditions under which both Qg>106.5 and CRI Ra>90 may be obtained.

Figure 8A:
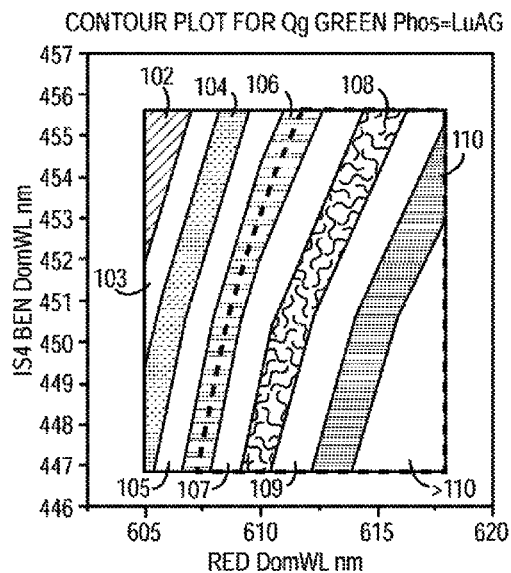
FIGS. 8A-8B are contour plots of Qg and CRI Ra, respectively, as a function of blue LED dominant wavelength and red (or red-orange) LED dominant wavelength for a LuAG green phosphor at a CCT of 3449K.
Figure 8B:
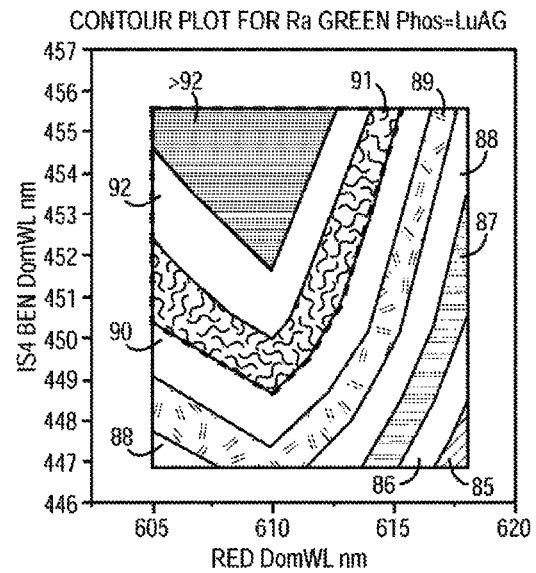
Figure 8C:
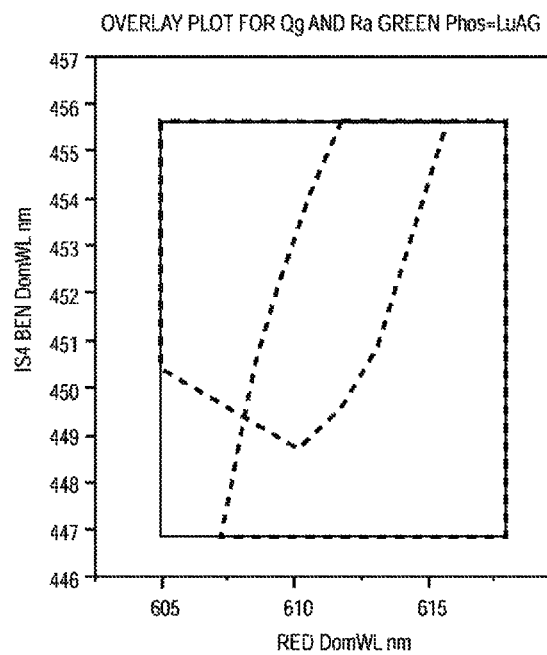
FIG. 8C is an overlap plot of the dashed line regions shown in FIGS. 8A-8B.

FIG. 8A is a contour plot of Qg as a function of blue LED dominant wavelength and red LED dominant wavelength for a LuAG green phosphor at a CCT of 3449K, including a dashed line region containing Qg values greater than 106.5. FIG. 8B is a contour plot of CRI Ra as a function of blue LED dominant wavelength and red LED dominant wavelength for a LuAG green phosphor at a CCT of 3449K, including a dashed line region containing CRI Ra values greater than 90. FIG. 8C is an overlap plot of the dashed line regions of FIGS. 8A-8B, with the intersection representing a window of conditions under which both Qg>106.5 and CRI Ra>90 may be obtained.

Figure 9A:
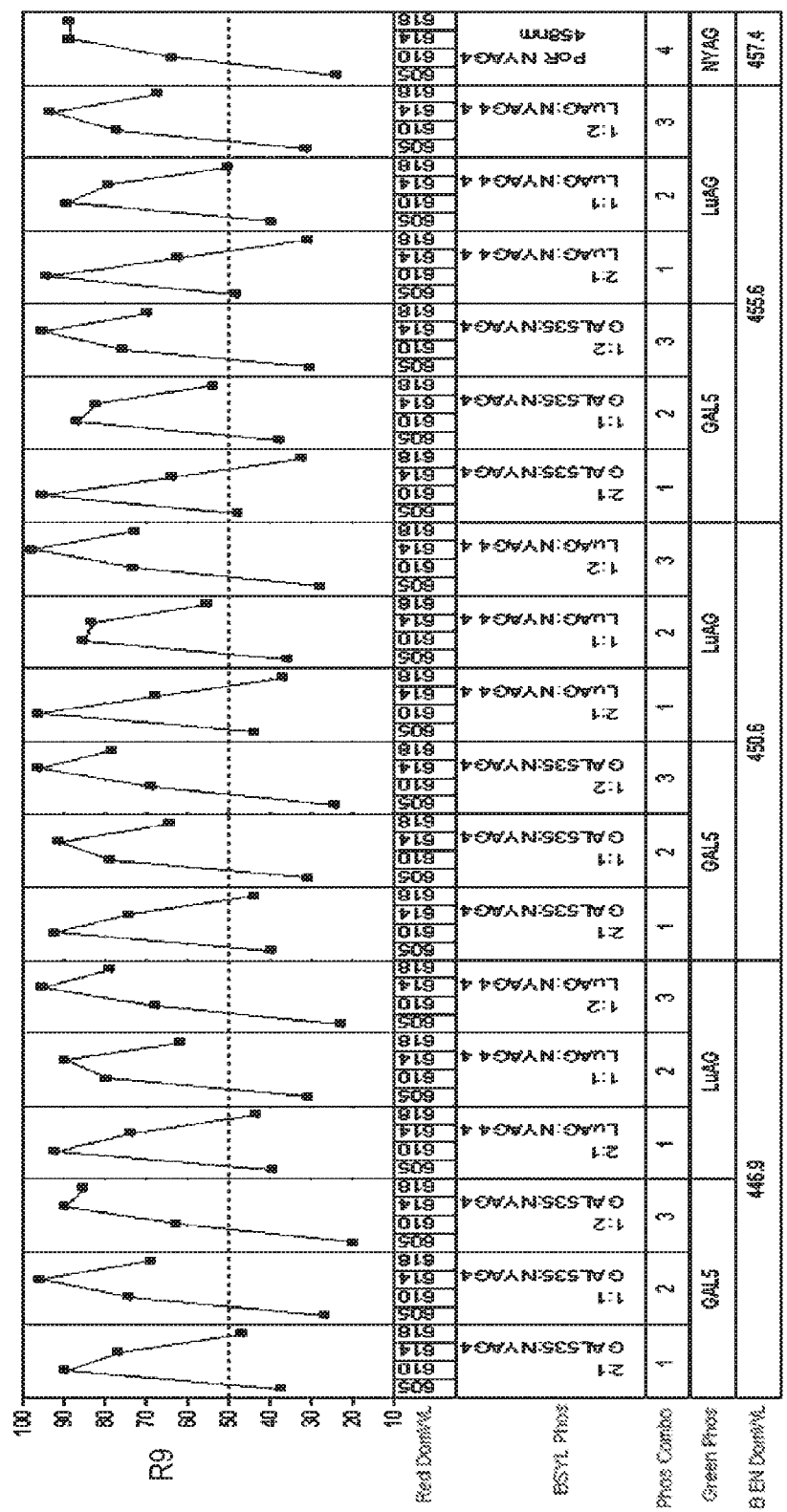
FIG. 9A is a variability chart mapping R9 color rendering for the same LED and phosphor combinations as described for FIGS. 5A and 6A.

FIG. 9A is a variability chart mapping R9 color rendering for the same LED and phosphor combinations as described for FIGS. 5A and 6A. It is noted that R9 color rendering appears to be maximized in the same range as the process specified to simultaneously attain high Qg and high CRI Ra. It may be observed in FIG. 9A that the point-of-reference (BSY+R) source (at far right in FIG. 9A) exhibits R9 color rendering values greater than 50 for all red LED dominant wavelengths at or above 610 nm.

Figure 9B:
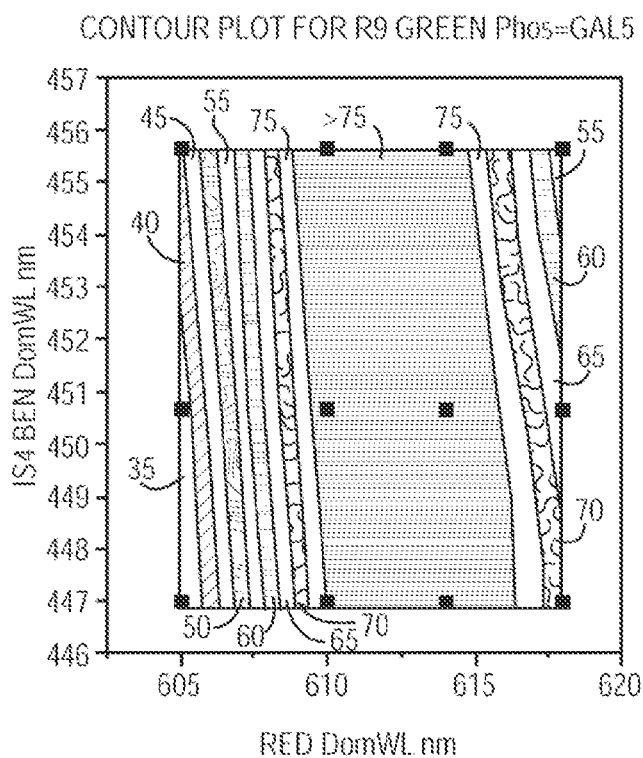
FIG. 9B is a contour plot of R9 color rendering as a function of blue LED dominant wavelength and red (or red-orange) LED dominant wavelength for a GAL535 green lumiphor at a CCT of 3449K.
Figure 9C:
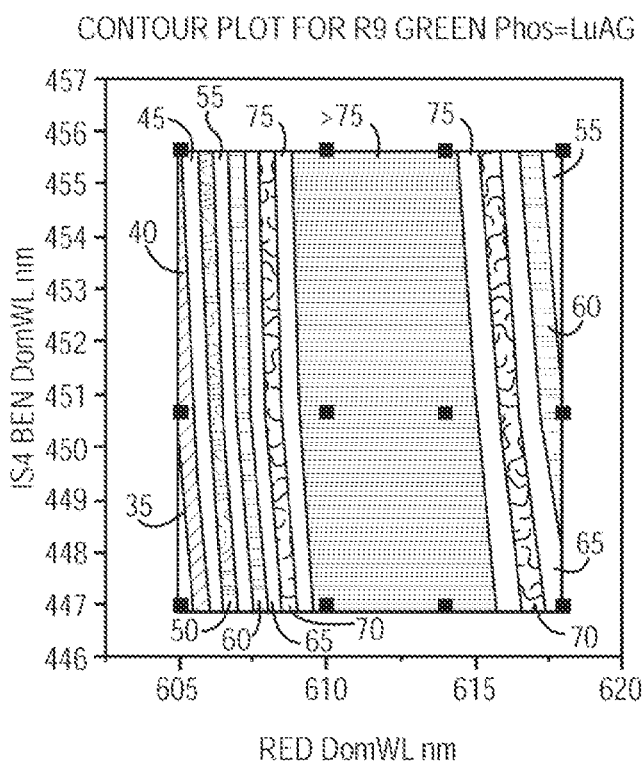
FIG. 9C is a contour plot of R9 color rendering as a function of blue LED dominant wavelength and red (or red-orange) LED dominant wavelength for a LuAG green lumiphor at a CCT of 3449K.

FIG. 9B is a contour plot of R9 color rendering as a function of blue LED dominant wavelength and red (or red-orange) LED dominant wavelength for a GAL535 green lumiphor at a CCT of 3449K. FIG. 9C is a contour plot of R9 color rendering as a function of blue LED dominant wavelength and red (or red-orange) LED dominant wavelength for a LuAG green lumiphor at a CCT of 3449K.

Figure 10A:
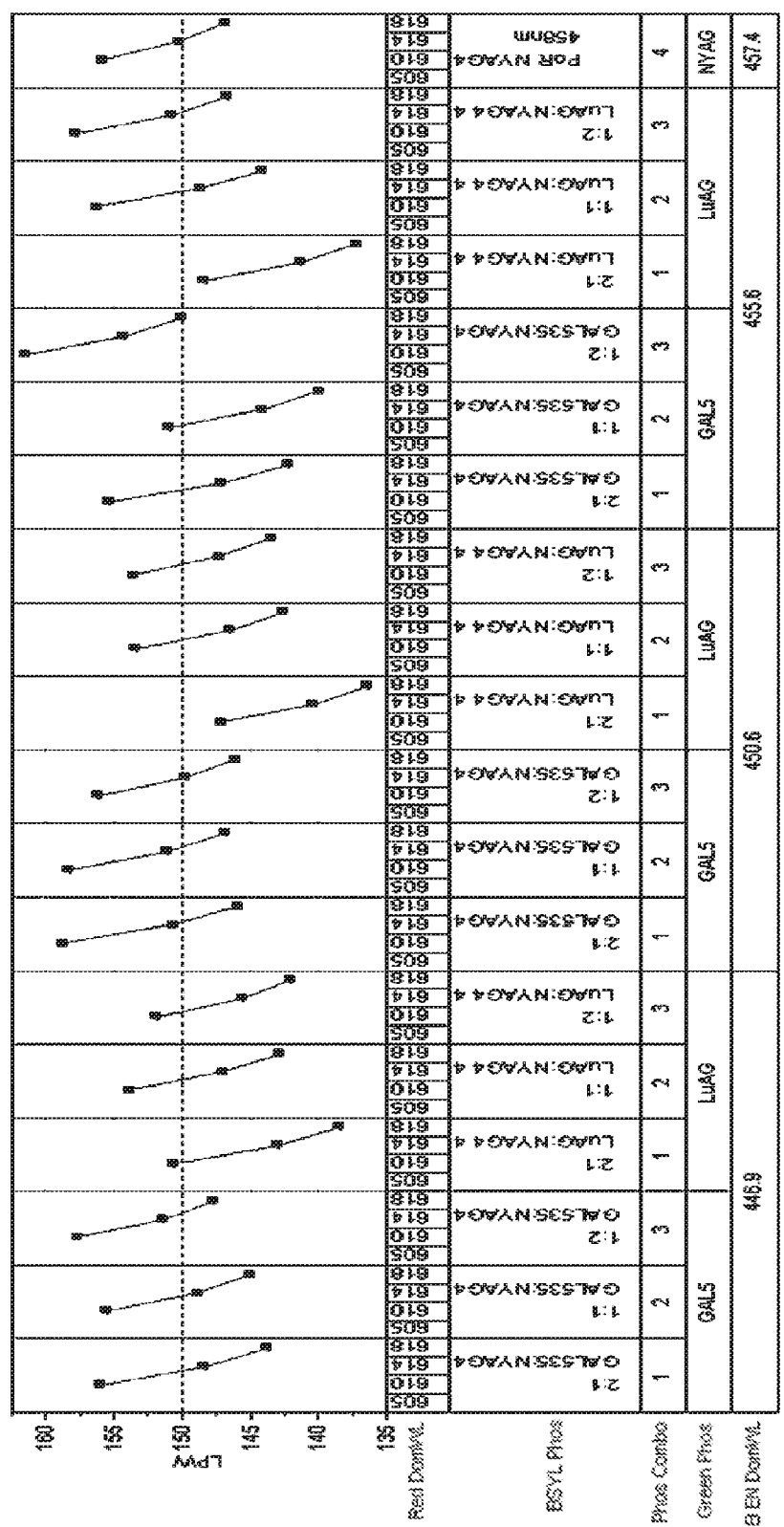
FIG. 10A is a variability chart mapping luminous efficacy (lumens per watt) for the same LED and phosphor combinations as described for FIGS. 5A, 6A, and 9A.

FIG. 10A is a variability chart mapping component luminous efficacy (lumens per watt or LPW) for the same LED and phosphor combinations as described for FIGS. 5A, 6A, and 9A. The dashed horizontal line in FIG. 10A corresponds to a LPW value of 150. General trends observable from FIG. 10A are that GAL535 consistently exhibits higher LPW than LuAG, and that LPW generally increases with decreasing red LED dominant wavelength. No consistent trend in LPW is observed for changes in green:yellow phosphor ratio. It is also observed that recipes with GAL535 have LPW values that are generally comparable to LPW values (in a range of 147-156 LPW over the entire red LED dominant wavelength range) obtained by the point-of-reference BSY+R source shown at far right in FIG. 10A.

Figure 10B:
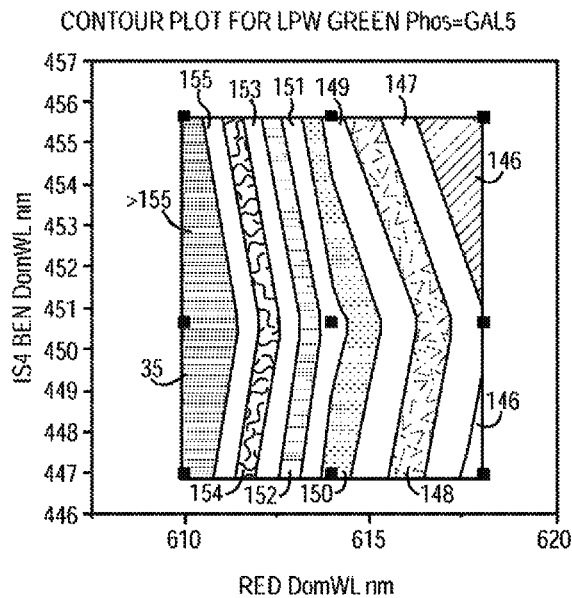
FIGS. 10B-10C are contour plots of luminous efficacy as a function of blue LED dominant wavelength and red (or red-orange) LED dominant wavelength for a component including a GAL535 green phosphor and a component including a LuAg green phosphor, respectively, at a CCT of 3449K.

FIG. 10B is a contour plot of luminous efficacy as a function of blue LED dominant wavelength and red LED dominant wavelength for a component including a GAL535 green lumiphor at a CCT of 3449K. FIG. 10O is a contour plot of luminous efficacy as a function of blue LED dominant wavelength and red LED dominant wavelength for a component including a LuAG green lumiphor at a CCT of 3449K.

Figure 11:
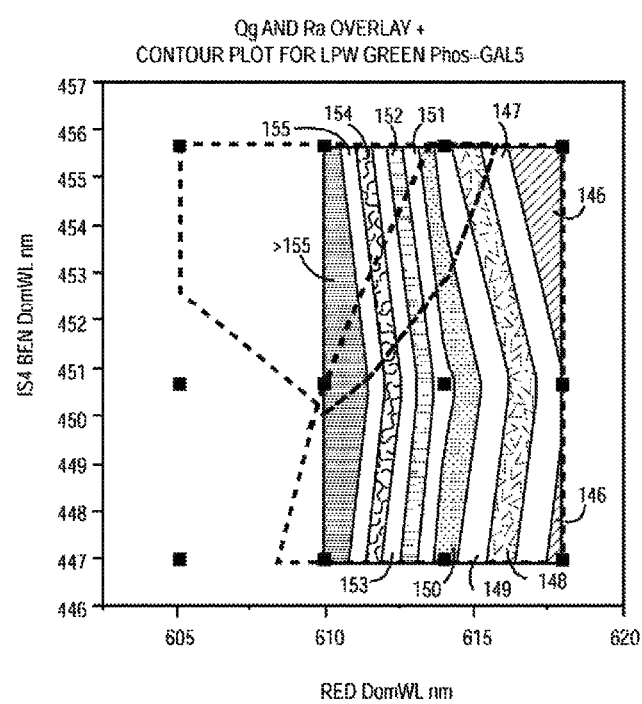
FIG. 11 is an overlay contour plot including the luminous efficacy contour plot of FIG. 10B over which the dashed line regions of FIGS. 7A-7C have been overlaid.

FIG. 11 is an overlay contour plot including the luminous efficacy contour plot of FIG. 10B over which the dashed line regions (for Qg and CRI Ra) of FIGS. 7A-7C have been overlaid, identifying lumens per watt values for the intersection of dashed line regions that represents a window of conditions under which both Qg>106.5 and CRI Ra>90 may be obtained. The lumens per watt range of 148-155 within the intersection of dashed line regions is similar to the range of 147-156 LPW obtained by the point-of-reference BSY+R source as shown in FIG. 10A.

Figure 12A:
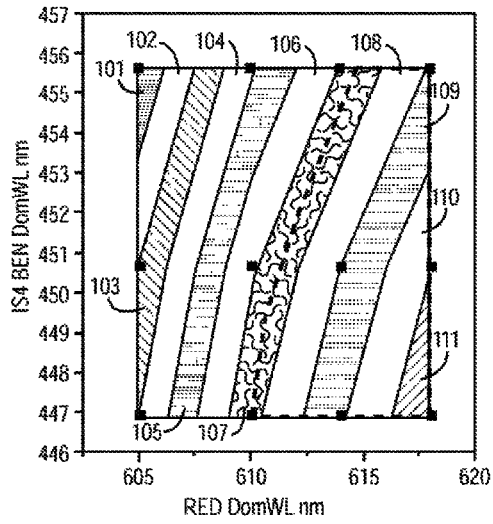
FIGS. 12A-12B are contour plots of Qg and CRI Ra, respectively, as a function of blue LED dominant wavelength and red (or red-orange) LED dominant wavelength for a device with a phosphor mixture including a green: yellow (e.g., GAL535:NYAG4) phosphor ratio of 1:2 at a CCT of 3449K.
Figure 12B:
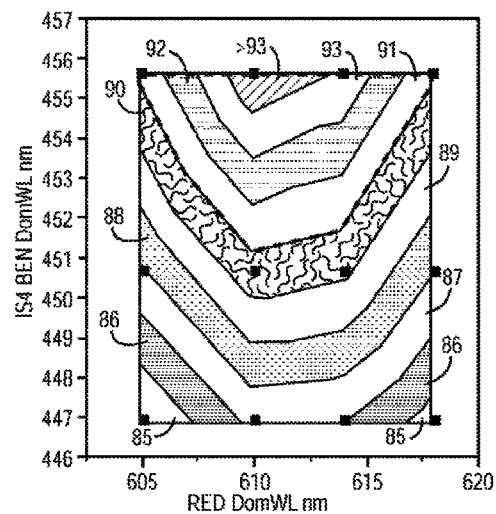
Figure 12C:
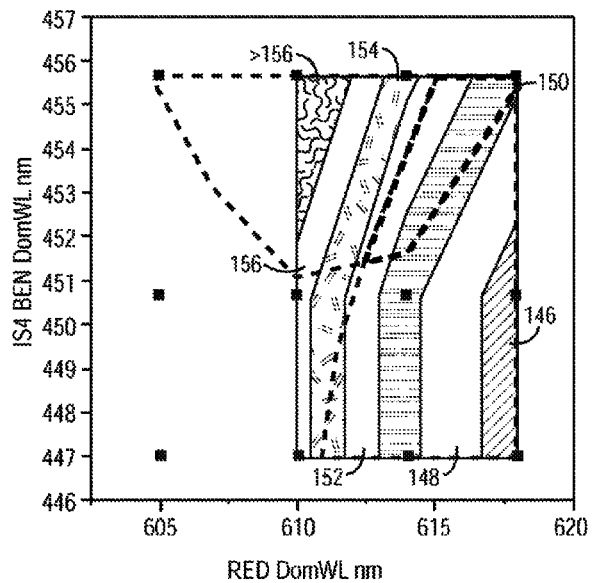
FIG. 12C is a contour plot of luminous efficacy as a function of blue LED dominant wavelength and red (or red-orange) LED dominant wavelength for the device of FIGS. 12A-12B, over which the dashed line regions of FIGS. 12A-12B have been overlaid.

FIG. 12A is a contour plot of Qg as a function of blue LED dominant wavelength and red LED dominant wavelength for a device with a phosphor mixture including a green:yellow (e.g., GAL535:NYAG4) phosphor ratio of 1:2 at a CCT of 3449K, and including a dashed line region containing Qg values greater than 106.5. FIG. 12B is a contour plot of CRI Ra as a function of blue LED dominant wavelength and red LED dominant wavelength for the device of FIG. 12A, and including a dashed line region containing CRI Ra values greater than 90. FIG. 12C is a contour plot of luminous efficacy as a function of blue LED dominant wavelength and red LED dominant wavelength for the device of FIGS. 12A-12B, over which the dashed line regions of FIGS. 12A-12B have been overlaid, identifying lumens per watt values (in a range of 150-152 LPW) for the intersection of dashed line regions that represents a window of conditions under which both Qg>106.5 and CRI Ra>90 may be obtained.

Figure 13A:
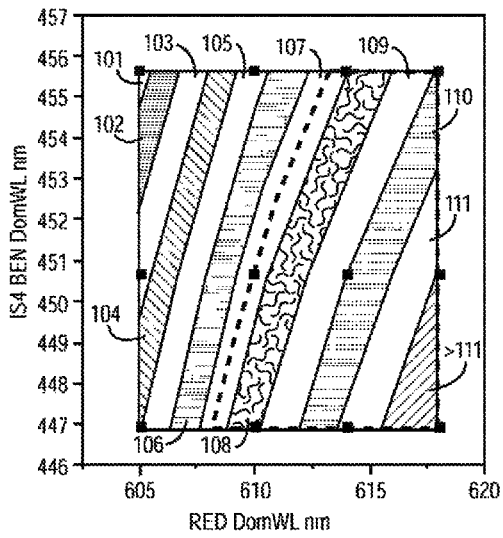
FIGS. 13A-13B are contour plots of Qg and CRI, respectively, as a function of blue LED dominant wavelength and red (or red-orange) LED dominant wavelength for a device with a phosphor mixture including a green:yellow (e.g., GAL535:NYAG4) phosphor ratio of 1:1 at a CCT of 3449K.
Figure 13B:
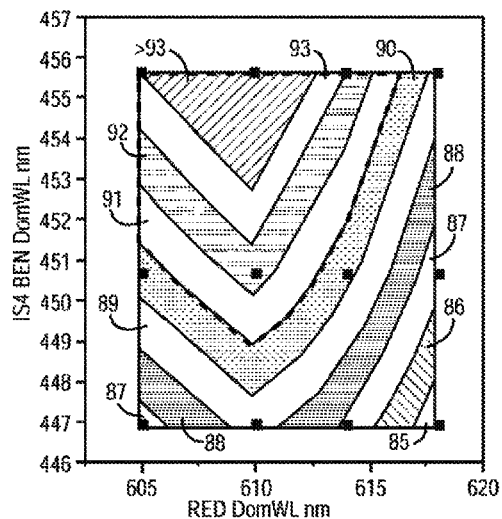
Figure 13C:
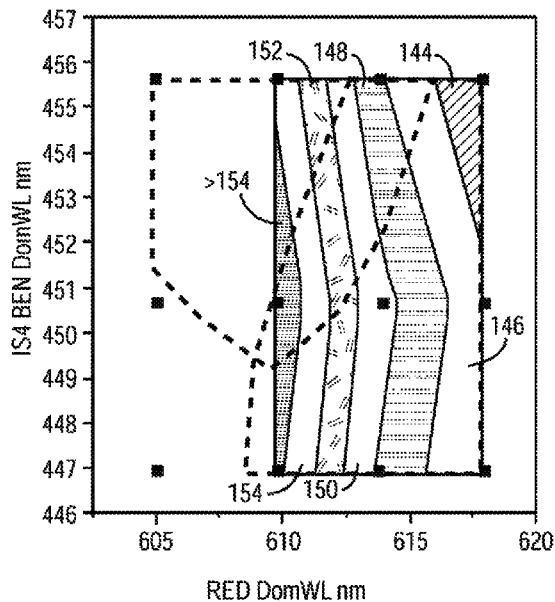
FIG. 13C is a contour plot of luminous efficacy as a function of blue LED dominant wavelength and red (or red-orange) LED dominant wavelength for the device of FIGS. 13A-13B, over which the dashed line regions of FIGS. 13A-13B have been overlaid.

FIG. 13A is a contour plot of Qg as a function of blue LED dominant wavelength and red LED dominant wavelength for a device with a phosphor mixture including a green:yellow (e.g., GAL535:NYAG4) phosphor ratio of 1:1 at a CCT of 3449K, and including a dashed line region containing Qg values greater than 106.5. FIG. 13B is a contour plot of CRI Ra as a function of blue LED dominant wavelength and red LED dominant wavelength for the device of FIG. 13A, and including a dashed line region containing CRI Ra values greater than 90. FIG. 13C is a contour plot of luminous efficacy as a function of blue LED dominant wavelength and red LED dominant wavelength for the device of FIGS. 13A-13B, over which the dashed line regions of FIGS. 13A-13B have been overlaid, identifying lumens per watt values (in a range of 146-154 LPW) for the intersection of dashed line regions that represents a window of conditions under which both Qg>106.5 and CRI Ra>90 may be obtained.

Figure 14A:
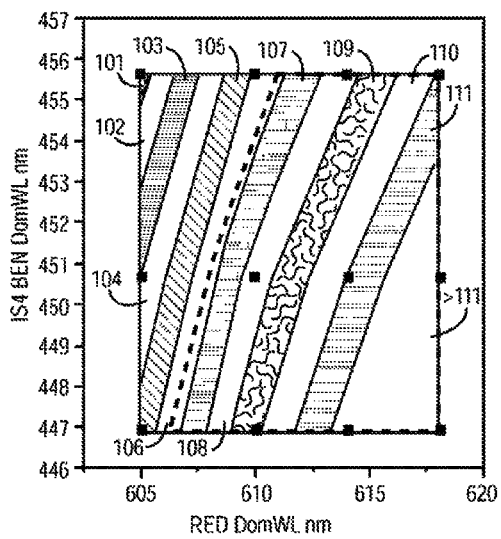
FIGS. 14A-14B are contour plots of Qg and CRI Ra, respectively, as a function of blue LED dominant wavelength and red (or red-orange) LED dominant wavelength for a device with a phosphor mixture including a green: yellow (e.g., GAL535:NYAG4) phosphor ratio of 2:1 at a CCT of 3449K.
Figure 14B:
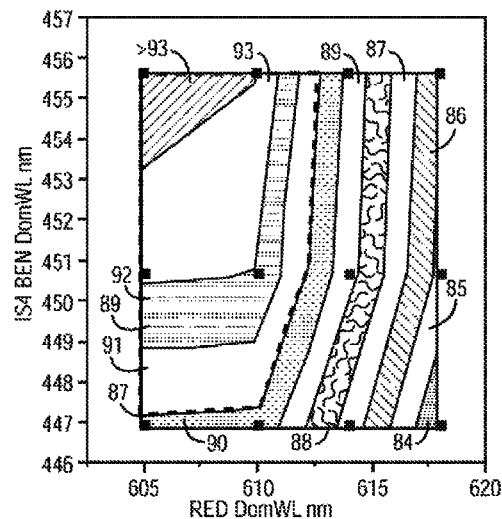
Figure 14C:
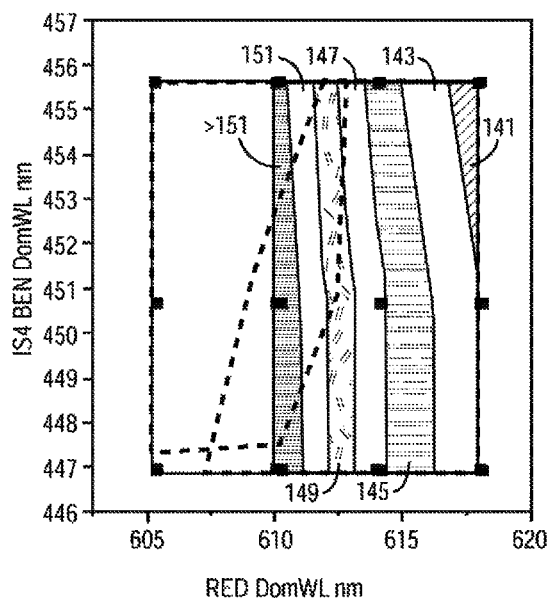
FIG. 14C is a contour plot of luminous efficacy as a function of blue LED dominant wavelength and red (or red-orange) LED dominant wavelength for the device of FIGS. 14A-14B, over which the dashed line regions of FIGS. 14A-14B have been overlaid.

FIG. 14A is a contour plot of Qg as a function of blue LED dominant wavelength and red LED dominant wavelength for a device with a phosphor mixture including a green:yellow (e.g., GAL535:NYAG4) phosphor ratio of 2:1 at a CCT of 3449K, and including a dashed line region containing Qg values greater than 106.5. FIG. 14B is a contour plot of CRI Ra as a function of blue LED dominant wavelength and red LED dominant wavelength for the device of FIG. 14A, and including a dashed line region containing CRI Ra values greater than 90. FIG. 14C is a contour plot of luminous efficacy as a function of blue LED dominant wavelength and red LED dominant wavelength for the device of FIGS. 14A-14B, over which the dashed line regions of FIGS. 14A-14B have been overlaid, identifying lumens per watt values (in a range of 147-151 LPW) for the intersection of dashed line regions that represents a window of conditions under which both Qg>106.5 and CRI Ra>90 may be obtained.

FIGS. 5A to 14C demonstrate that Qg>106.5 and CRI Ra>90 at 3449K may be obtained using BSY/G+R devices, and that such Qg and CRI Ra thresholds may also be obtained with high luminous efficacy and with high R9 color rendering values. In certain embodiments, desired thresholds may be obtained with blue LEDs having dominant wavelengths in a range including (but not necessarily limited to) 451-456 nm, with red LEDs having dominant wavelengths in a range including (but not necessarily limited to) 610-614 nm, and mixtures of green and yellow phosphors. One example of a desired green and yellow phosphor combination is GAL535:NYAG4. It is observed that the ratio of green:yellow phosphors may involve trade-offs, since a 1:1 green:yellow ratio may exhibit higher luminous efficacy values, whereas a 2:1 green:yellow ratio may provide a larger process window when taking into account other parameters.

FIG. 15 is a table providing performance values and characteristics for high-Qg BSY/G+R lighting devices including 450.6 nm dominant wavelength blue LEDs (providing a peak wavelength of 445 nm), a 1:1 mixture of GAL535:NYAG7 green and yellow phosphors, and a mix of 611.5 nm and 615.5 nm dominant wavelength red LEDs (providing a peak wavelength of 628 nm) at a nominal CCT of 3449K, corresponding performance values and characteristics and for a point-of-reference (POR) CR22 BSY+R device including 458.1 nm dominant wavelength blue LEDs, NYAG4 yellow phosphor, and 613.5 nm dominant wavelength LEDs. The high-Qg sources had Qg, CRI, and LPW values of 108.1, 91.0, and 110.8 versus comparable values of 101.6, 90.5, and 108.3 for the POR source.

To seek to quantify user benefits of high-Qg sources over a range of additional correlated color temperatures, additional surveys were conducted to compare high-Qg and standard light sources having nominal CCT values near 2700K and 4500K. A pair of identical matching regions with a selection of retail objects (textiles, wood, ceramics, plastics, and color reference charges) were placed in color booths that were differently illuminated with standard BSY+R and high-Qg BSY/G+R sources. Each high-Qg source had a Qg value of 8 points above the standard source. 13 observers were surveyed as to their impressions of comparisons between the respective nominal 2700K sources, and between the respective nominal 4500K sources. Spectral diagrams and performance characteristics for the light sources used in the comparison survey involving the 13 observers are provided in FIGS. 16A to 17B.

Figures 16A, 16B:
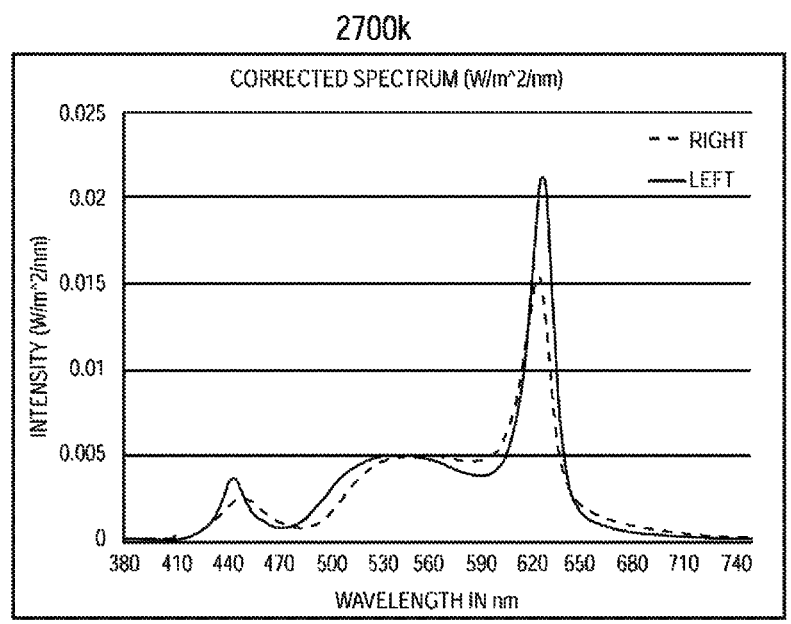
FIG. 16A is a spectral diagram including intensity as a function of wavelength (in nm) for a point-of-reference or standard (right) "blue-shifted yellow plus red" (BSY+R) lighting device and a high Qg (left) "blue-shifted yellow-green plus red" (BSY/G+R) or "blue-shifted green plus red" (BSG+R) lighting device at CCT values near 2700K.
FIG. 16B is a table identifying CCT, DUV, CRI Ra, R9, CQS Qg, blue LED peak wavelength, and red (or red-orange) LED peak wavelength for the lighting devices of FIG. 16A.
Figures 17A, 17B:
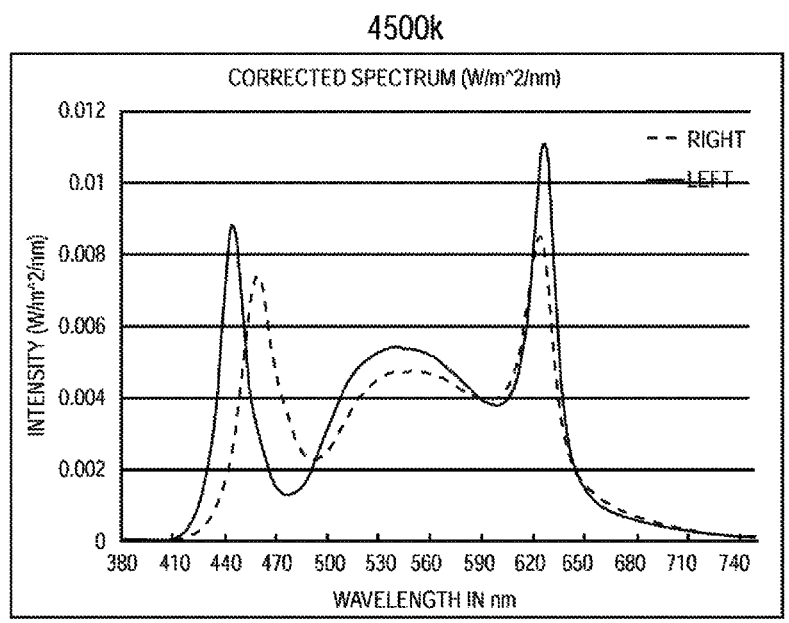
FIG. 17A is a spectral diagram including intensity as a function of wavelength (in nm) for a point-of-reference or standard (right) "blue-shifted yellow plus red" (BSY+R) lighting device and a high Qg (left) "blue-shifted yellow-green plus red" (BSY/G+R) or "blue-shifted green plus red" (BSG+R) lighting device at CCT values near 4500K.
FIG. 17B is a table identifying CCT, DUV, CRI Ra, R9, CQS Qg, blue LED peak wavelength, and red (or red-orange) LED peak wavelength for the lighting devices of FIG. 17A.
Figure 18A:
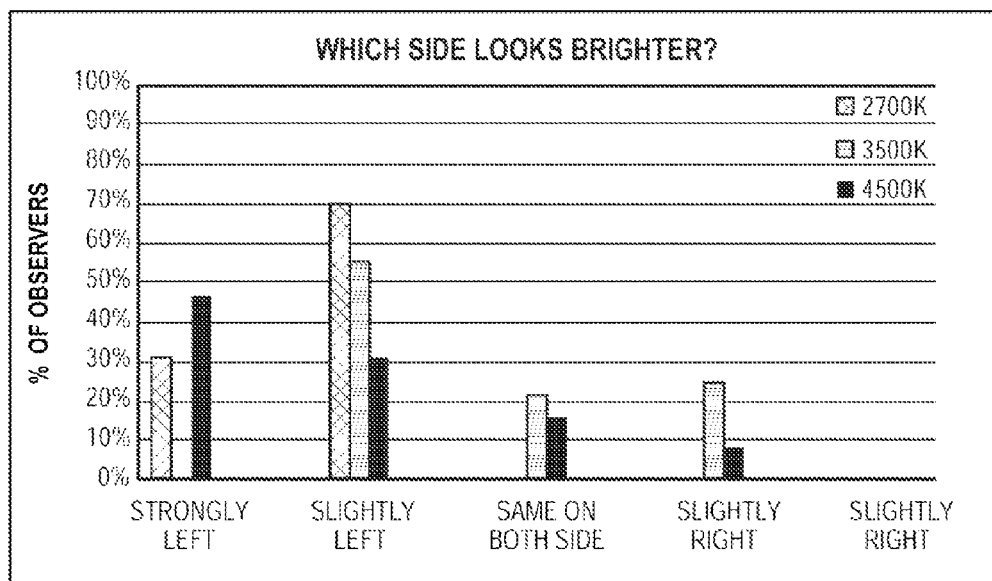
FIGS. 18A-18F are bar charts summarizing results of surveys of observers of side-by-side environments differently illuminated with standard BSY+R and high-Qg BSY/G+R sources at nominal CCT values of 2700K, 3500K, and 4500K for six criteria.
Figure 18B:
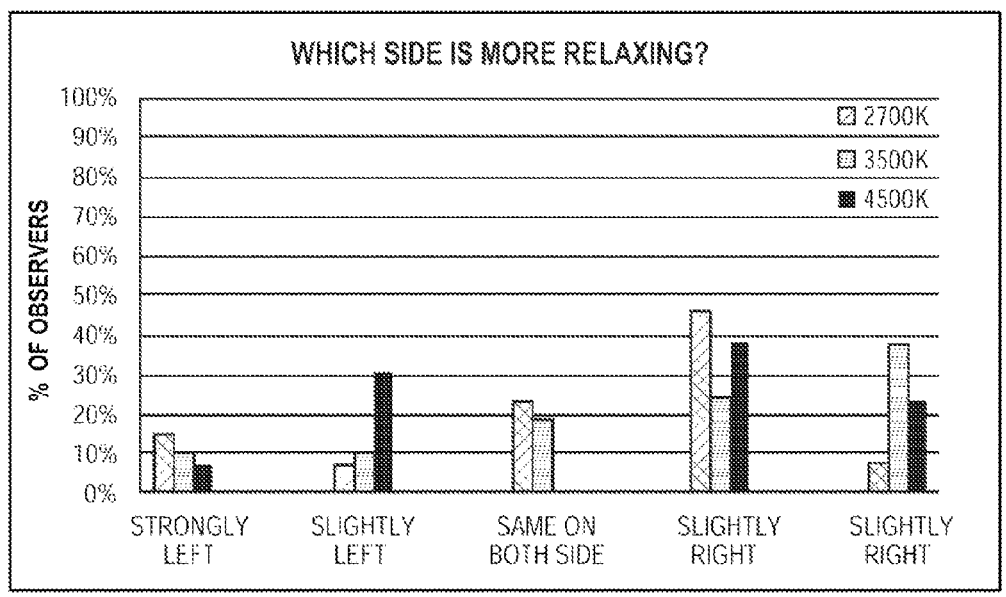
Figure 18C:
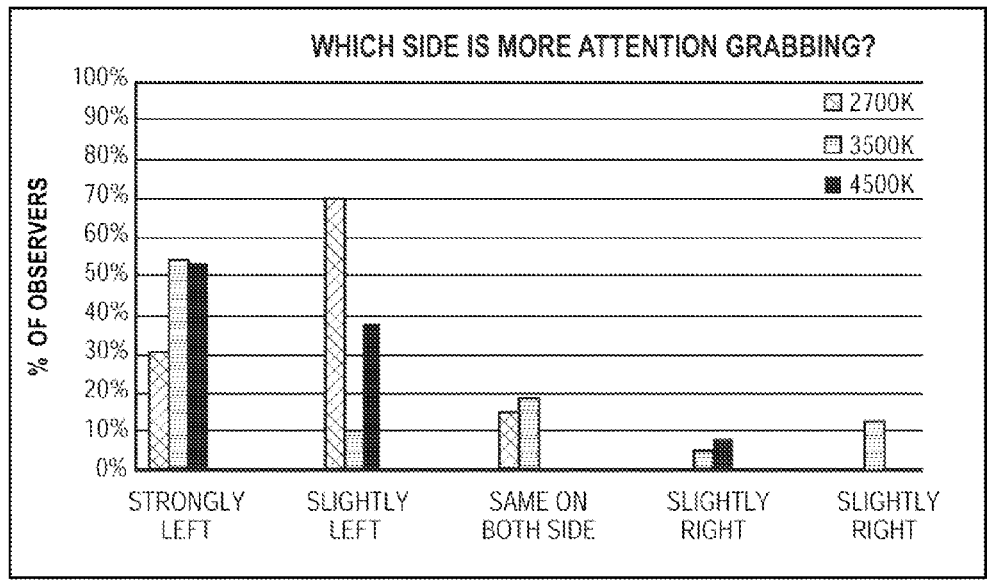
Figure 18D:
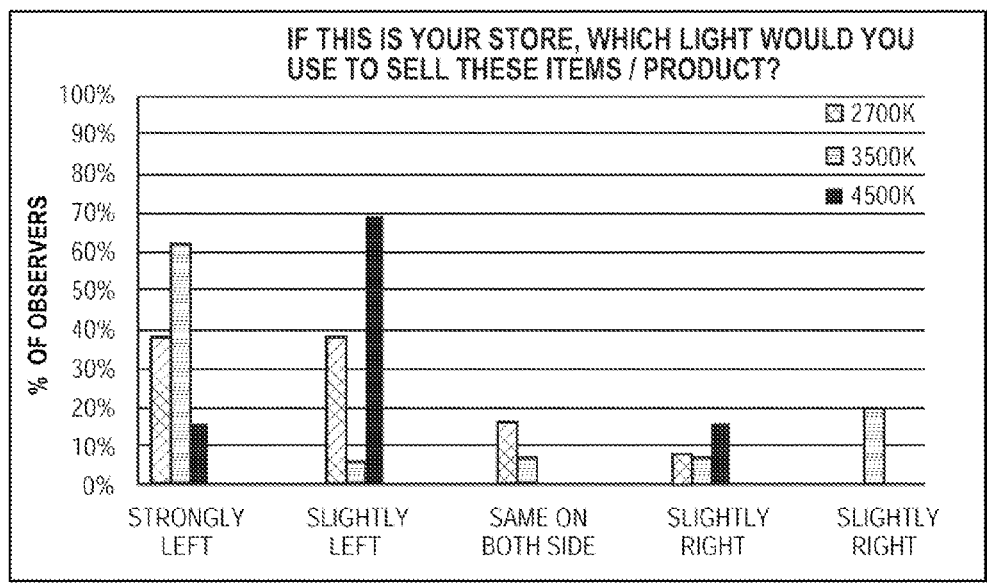
Figure 18E:
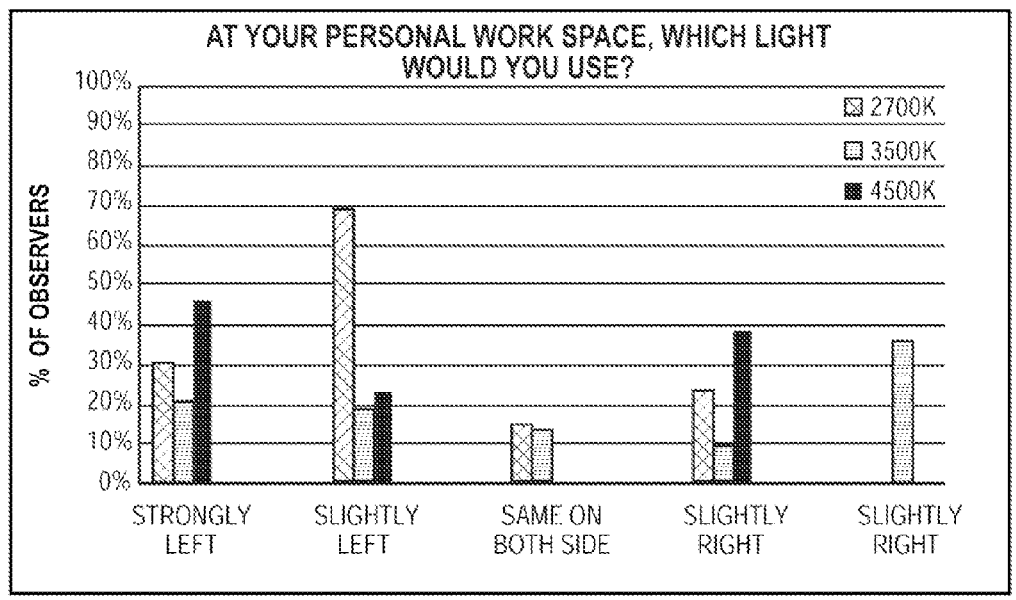
Figure 18F:
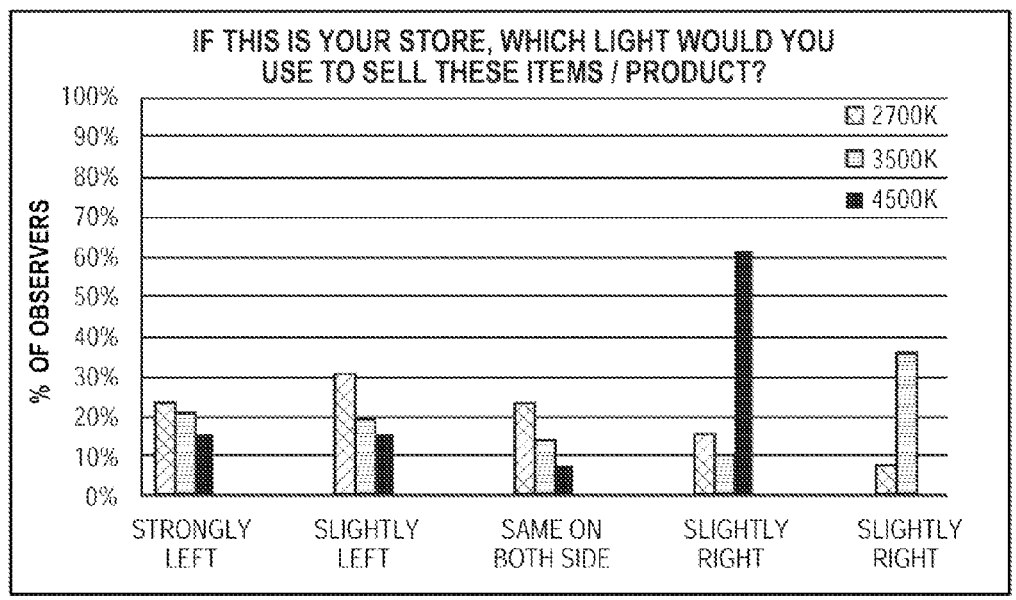

FIG. 16A is a spectral diagram including intensity as a function of wavelength (in nm) for a point-of-reference or standard (right) BSY+R lighting device and a high Qg (left) BSY/G+R or "blue-shifted green plus red" (BSG+R) lighting device at CCT values near 2700K. FIG. 16B is a table identifying CCT, DUV, CRI Ra, R9, CQS Qg, blue LED peak wavelength, and red LED peak wavelength for the lighting devices of FIG. 16A. FIG. 17A is a spectral diagram including intensity as a function of wavelength (in nm) for a point-of-reference or standard (right) BSY+R lighting device and a high Qg (left) BSY/G+R or BSG+R lighting device at CCT values near 4500K. FIG. 17B is a table identifying CCT, DUV, CRI Ra, R9, CQS Qg, blue LED peak wavelength, and red LED peak wavelength for the lighting devices of FIG. 17A. In FIGS. 16B and 17B, each (left) high Qg source has a Qg value that is 8 points higher than the comparable (right) standard or point-of-reference source at substantially the same CCT. It is to be appreciated that Qg values for the 2700K sources are generally higher than Qg values for the 4500K sources, consistent with the fact that Qg generally declines with increasing CCT due to diminishing red content with increasing CCT.

FIGS. 18A-18F are bar charts summarizing results of surveys of observers of side-by-side environments differently illuminated with standard BSY+R and high-Qg BSY/G+R sources at nominal CCT values of 2700K, 3500K, and 4500K for six criteria (which side looks brighter, which side is more relaxing, which side is more attention grabbing, which light would you use in your store to sell the items/products, which light would you use in your personal space, and which light would you use in your personal space). The 2700K and 4500K sources were described in connection with FIGS. 16A-17B. The 3500K sources and method (involving 42 observers) were described in connection with FIG. 4. Composite results for surveys pertaining to the 2700K, 3500K, and 4500K sources are provided in FIGS. 18A-18F. Conclusions discernable from FIGS. 18A-18F are that over the entire CCT range of 2700K to 4500K, high-Qg sources are preferred as brighter, more energetic, more attention-grabbing, and more suitable for retail environments than standard/point of references sources, and standard sources are perceived as more relaxing. Preferences are highly varied (but overall appear to be neutral) with respect to preferences for home and personal workspace environments.

To determine process windows for obtaining high Qg lighting devices including blue LEDs, phosphors, and red LEDs at multiple CCT values, various combinations of blue LEDs (having dominant wavelengths of 446.9 nm, 450.6 nm, and 455.6 nm), yellow-green phosphor combinations (2:1 GAL535:NYAG4, 1:1 GAL535:NYAG4, and 1:2 GAL535:NYAG4), and red (or red-orange) LEDs (having dominant wavelengths of 605 nm, 610 nm, 614 nm, and 618 nm) were measured at a temperature of 80° C. and a luminous flux range of 100-350 mA. Measurements were taken for 4 pieces of each component. Lumens per watt values for each component were corrected to factory blue (for BSY/G combination) or red radiant flux. It was assumed that system spectra (e.g., BSY/G+R system) would equal the sum of component spectra (e.g., blue LED, Y/G phosphor, and red or red-orange LED). Total spectrum was tuned to the desired color point by calculation of $I_f$ values. A fixed blue shifted phosphor to red LED component ratio of 2:1 was selected, including 1 high saturation BSY/G plus one low-saturation BSY and 1 red or red-orange LED. Total spectrum was tuned to the desired color point by calculation of $I_f$ values. A fixed blue shifted phosphor to red LED component ratio of 2:1 was selected, including 1 high saturation BSY/G plus one low-saturation BSY and 1 red or red-orange LED.

Figure 19:
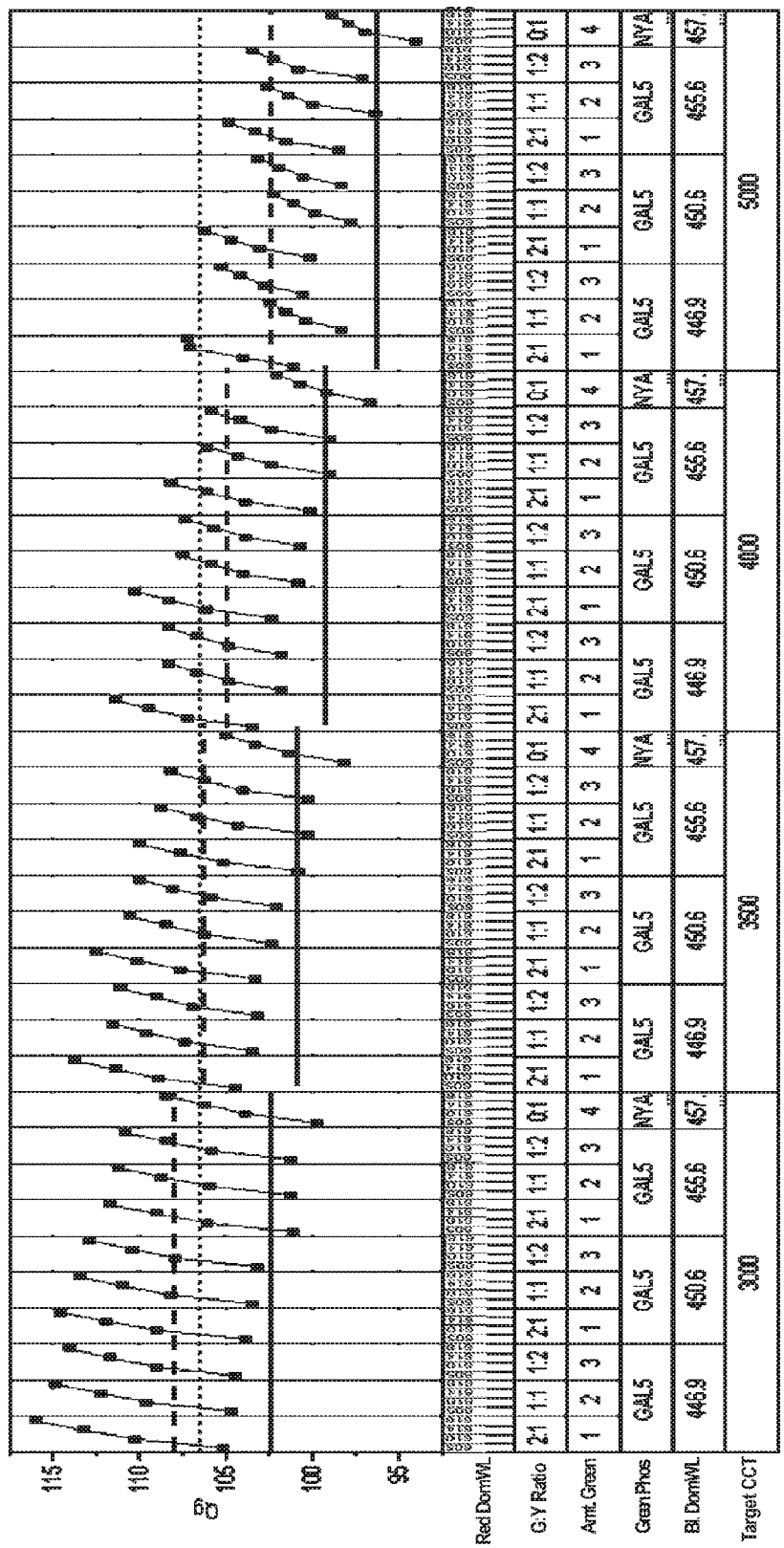
FIG. 19 is a variability chart mapping Qg response for devices including nine (9) different blue LED and yellow/green phosphor combinations, each in combination with four different red or red-orange LEDs (having dominant wavelengths of 605 nm, 610 nm, 614 nm, and 618 nm), plus Qg response for a point of reference BSY source in combination with four different red LEDs, with each BSY/G+R and BSY+R source presented at four target CCT values of 3000K, 3500K, 4000K, and 5000K.

FIG. 19 is a variability chart mapping Qg response for devices including nine (9) different blue LED and yellow-green phosphor combinations, each in combination with four different red or red-orange LEDs (having dominant wavelengths of 605 nm, 610 nm, 614 nm, and 618 nm), plus Qg response for a point of reference BSY source in combination with four different red LEDs, with each BSY/G+R and BSY+R source presented at four target CCT values of 3000K, 3500K, 4000K, and 5000K. Each CCT range (3000K, 3500K, 4000K, 5000K) includes a solid horizontal line representing a weighted average Qg of production data over a 25-day period, and includes a heavy dashed line representing a delta Qg value of 5.5 over the weighted average. A light dashed line also appears at a fixed Qg value of 106.5 to permit comparison with FIG. 6A. As is apparent from FIG. 19, Qg values decline with increasing CCT, generally decline with increasing blue dominant wavelength, generally increase with increasing proportion of green:yellow phosphor, and consistently increase with increasing red dominant wavelength. In every instance a delta Qg value of at least 5.5 over the weighted average can be obtained with at least one BSY/G+R combination (albeit in some cases only with longer red peak wavelengths within the displayed range of 605-618 nm). Qg values corresponding to minimum delta Qg of 5.5 shown as heavy dashed lines in FIG. 19 may be correlated to CCT by the following equation:

$$Qg=116.5-(0.003\times CCT)$$

Since a notch filtering material may affect Qg, in certain embodiments Qg values may be specified for aggregate emissions (including a portion of blue solid state emitter emissions, at least a portion lumiphor emissions, and at least a portion of red solid state emitter emissions) prior to passage through any optionally present notch filtering element arranged to at least partially inhibit transmission of said aggregate emissions. Such language does not compel the presence or absence of a notch filtering material, but simply refers to a situation in which Qg should be computed prior to transmission through any notch filtering material. If a lighting device is devoid of notch filtering material, then such aggregate emissions correspond to emissions exiting the lighting device. If a lighting device includes a notch filtering material, then such aggregate emissions may correspond to an intermediate region of a lighting device "upstream" of any notch filtering element.

Figure 20:
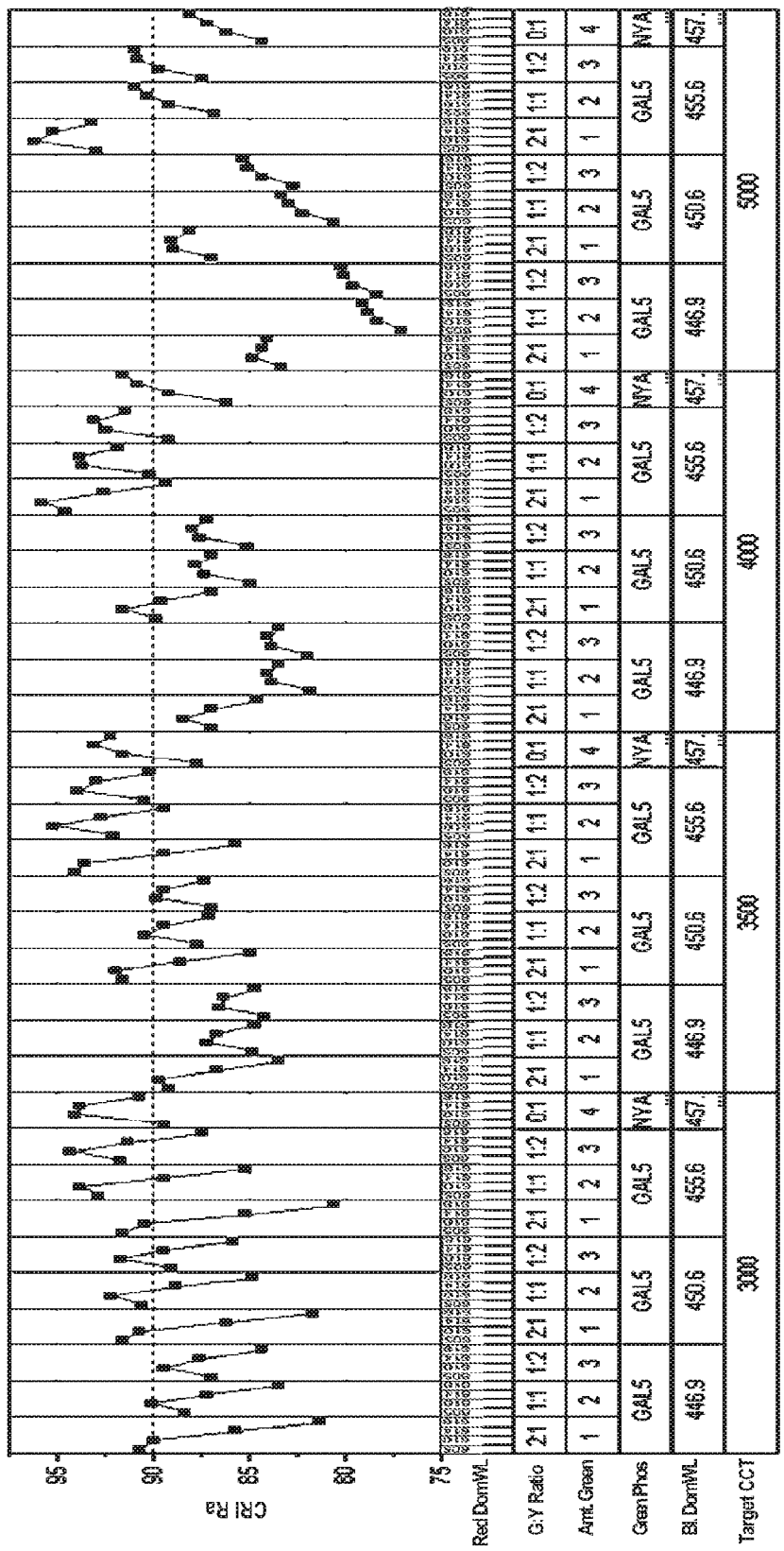
FIG. 20 is a variability chart mapping CRI Ra response for the same LED and phosphor combinations as described for FIG. 19, with each BSY/G+R and BSY+R source presented at four target CCT values of 3000K, 3500K, 4000K, and 5000K.

FIG. 20 is a variability chart mapping CRI Ra for the same LED and phosphor combinations as described for FIG. 19. The dashed horizontal line in the upper frame of FIG. 20 coincides to a CRI Ra value of 90. As is apparent from FIG. 20, at each CCT the CRI Ra values generally increase with decreasing green:yellow phosphor ratio. It is noted that at 5000K, a CRI Ra value of at least 90 can only be obtained with a 2:1 green:yellow phosphor ratio.

Figure 21A:
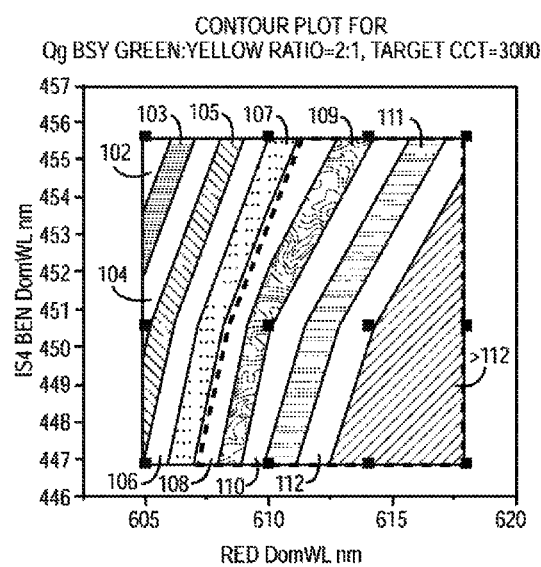
FIG. 21A is a contour plot of Qg as a function of blue LED dominant wavelength and red (or red-orange) LED dominant wavelength for a device with a phosphor mixture including a green:yellow (e.g., GAL535:NYAG4) phosphor ratio of 2:1 at a target CCT of 3000K
Figure 21B:
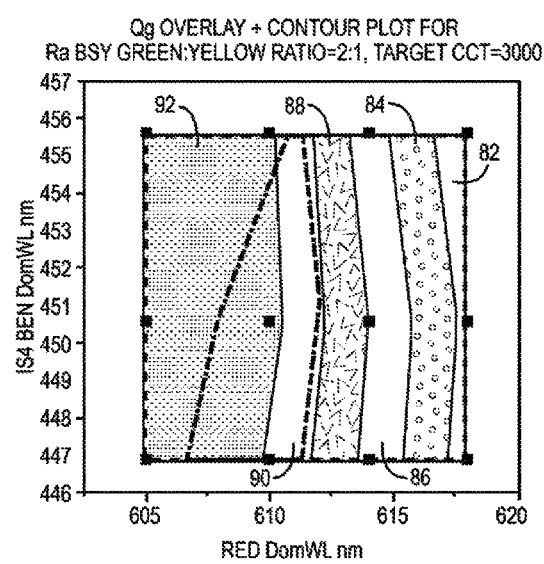
FIG. 21B is a contour plot of CRI Ra as a function of blue LED dominant wavelength and red (or red-orange) LED dominant wavelength for the device of FIG. 21A, including a dashed line region containing CRI Ra values of at least 90, over which the dashed line region of FIG. 21A has been overlaid.

FIG. 21A is a contour plot of Qg as a function of blue LED dominant wavelength and red LED dominant wavelength for a device with a phosphor mixture including a green:yellow (e.g., GAL535:NYAG4) phosphor ratio of 2:1 at a target CCT of 3000K, and including a dashed line region containing Qg values greater than 107. FIG. 21B is a contour plot of CRI Ra as a function of blue LED dominant wavelength and red LED dominant wavelength for the device of FIG. 21A, including a dashed line region containing CRI Ra values of at least 90, over which the dashed line region of FIG. 21A has been overlaid, wherein the intersection of dashed line regions represents a window of conditions under which both Qg>107 and CRI Ra≥90 may be obtained.

Figure 22A:
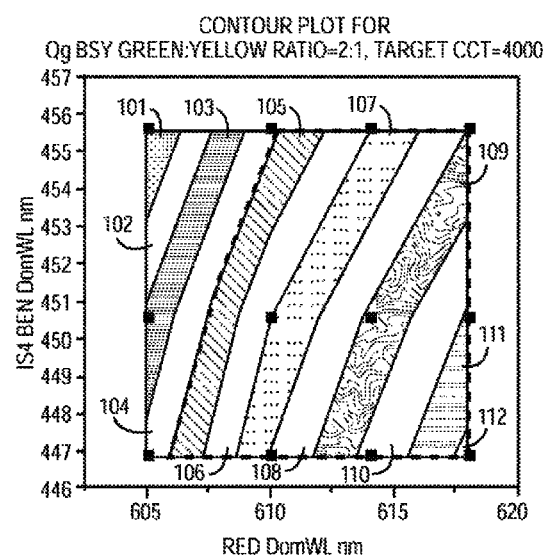
FIG. 22A is a contour plot of Qg as a function of blue LED dominant wavelength and red (or red-orange) LED dominant wavelength for a device with a phosphor mixture including a green:yellow (e.g., GAL535:NYAG4) phosphor ratio of 2:1 at a target CCT of 4000K, and including a dashed line region containing Qg values greater than 104.
Figure 22B:
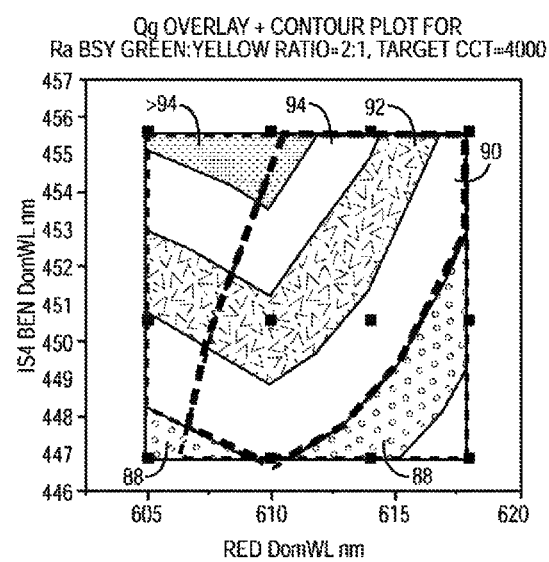
FIG. 22B is a contour plot of CRI Ra as a function of blue LED dominant wavelength and red (or red-orange) LED dominant wavelength for the device of FIG. 22A, including a dashed line region containing CRI Ra values of at least 90, over which the dashed line region of FIG. 22A has been overlaid.

FIG. 22A is a contour plot of Qg as a function of blue LED dominant wavelength and red LED dominant wavelength for a device with a phosphor mixture including a green:yellow (e.g., GAL535:NYAG4) phosphor ratio of 2:1 at a target CCT of 4000K, and including a dashed line region containing Qg values greater than 104. FIG. 22B is a contour plot of CRI Ra as a function of blue LED dominant wavelength and red LED dominant wavelength for the device of FIG. 22A, including a dashed line region containing CRI Ra values of at least 90, over which the dashed line region of FIG. 22A has been overlaid, wherein the intersection of dashed line regions represents a window of conditions under which both Qg>104 and CRI Ra≥90 may be obtained.

Figure 23A:
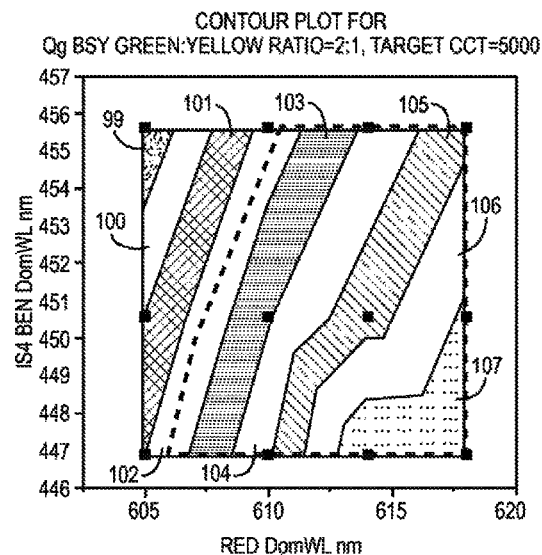
FIG. 23A is a contour plot of Qg as a function of blue LED dominant wavelength and red (or red-orange) LED dominant wavelength for a device with a phosphor mixture including a green:yellow (e.g., GAL535:NYAG4) phosphor ratio of 2:1 at a target CCT of 5000K, and including a dashed line region containing Qg values greater than 102.5.
Figure 23B:
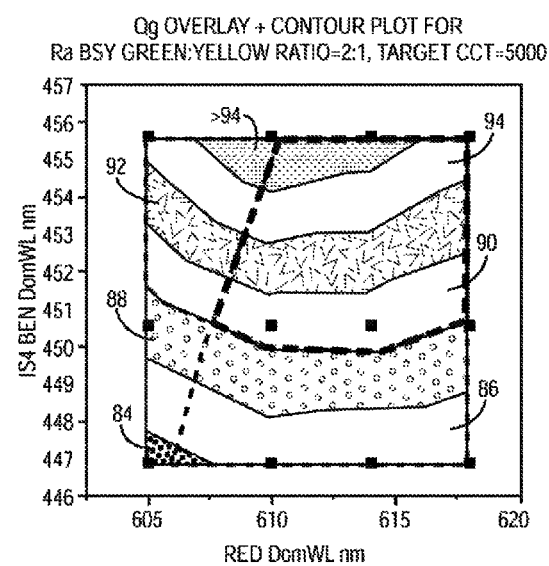
FIG. 23B is a contour plot of CRI Ra as a function of blue LED dominant wavelength and red (or red-orange) LED dominant wavelength for the device of FIG. 23A, including a dashed line region containing CRI Ra values of at least 90, over which the dashed line region of FIG. 23A has been overlaid.

FIG. 23A is a contour plot of Qg as a function of blue LED dominant wavelength and red LED dominant wavelength for a device with a phosphor mixture including a green:yellow (e.g., GAL535:NYAG4) phosphor ratio of 2:1 at a target CCT of 5000K, and including a dashed line region containing Qg values greater than 102.5. FIG. 23B is a contour plot of CRI Ra as a function of blue LED dominant wavelength and red LED dominant wavelength for the device of FIG. 23A, including a dashed line region containing CRI Ra values of at least 90, over which the dashed line region of FIG. 23A has been overlaid, wherein the intersection of dashed line regions represents a window of conditions under which both Qg>102.5 and CRI Ra≥90 may be obtained.

Figure 24A:
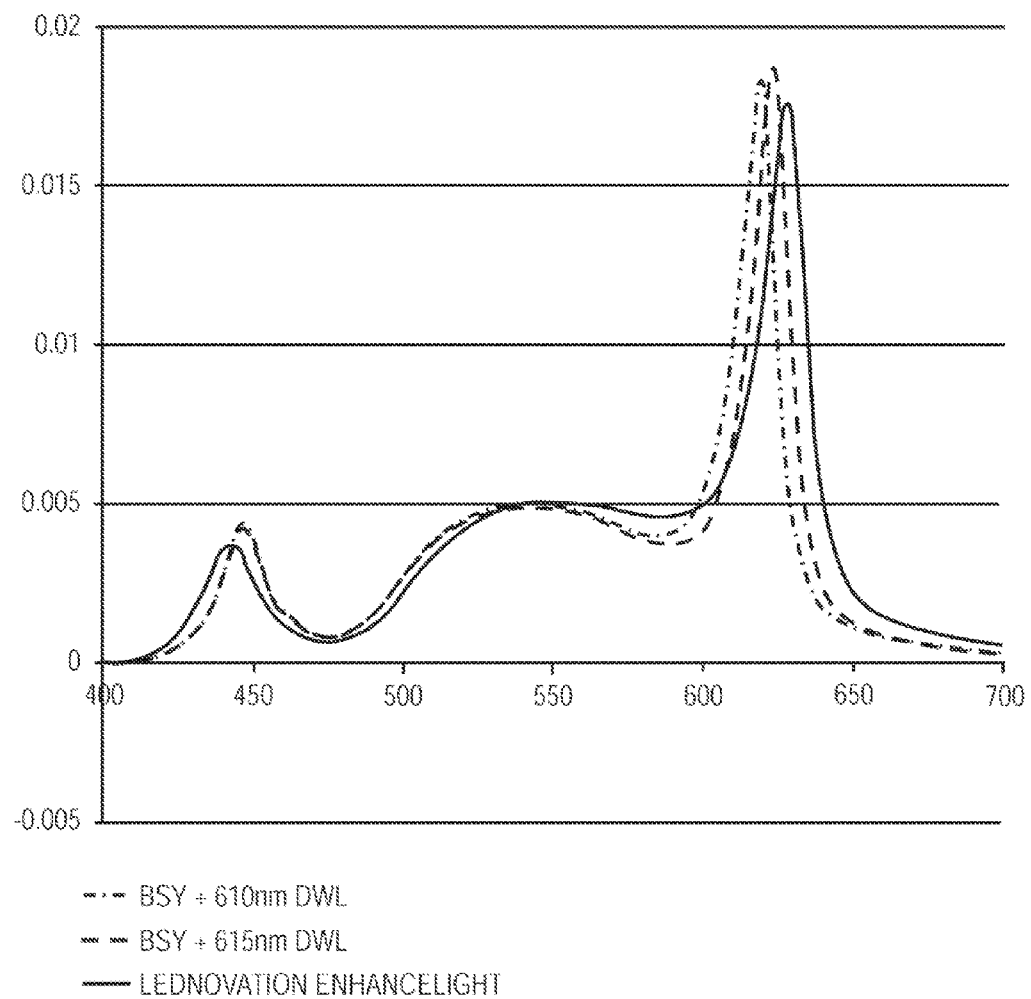
FIG. 24A is a spectral diagram including intensity as a function of wavelength (in nm) for a first modeled BSY+R source with a red (or red-orange) LED dominant wavelength of 610 nm, a second modeled BSY+R source with a red (or red-orange) LED dominant wavelength of 615 nm, and third source embodying a LEDnovation Enhancelite light bulb including at least one LED arranged to stimulate emissions of a phosphor and at least one red LED having a dominant wavelength of 628 nm, with each source having a nominal CCT value at or near 2700K.

FIG. 24A is a spectral diagram including intensity as a function of wavelength (in nm) for a first modeled BSY+R source with a red LED dominant wavelength of 610 nm, a second modeled BSY+R source with a red LED dominant wavelength of 615 nm, and third source embodying a LEDnovation Enhancelite light bulb (LEDnovation, Inc., Tampa, Fla., US) including at least one blue LED arranged to stimulate emissions of a phosphor and at least one red LED having a peak wavelength of 628 nm, with each source having a nominal CCT value of at or near 2700K. As shown in FIG. 24A, the LEDnovation Enhancelite bulb includes a shorter blue peak wavelength (444 nm), a longer (i.e., somewhat greener) dominant wavelength attributable to phosphor material, and a longer red peak wavelength (628 nm) relative to the modeled BSY devices. The LEDnovation Enhancelite bulb exhibited CRI Ra of 90.7, Qg of 111, CCT of 2822, and duv of −0.0013 according to measurements performed by Applicants. Test results for a LEDnovation Enhancelite A19 LED light bulb (model no. LED-A19-60-1-27D-IO) published by LED Light Review (http://led-light-review.com/reviews/lednovation-enhancelite-a19/) note that the A19 bulb has a luminous efficacy of 86 LPW and a CRI Ra of 94.

Figure 24B:
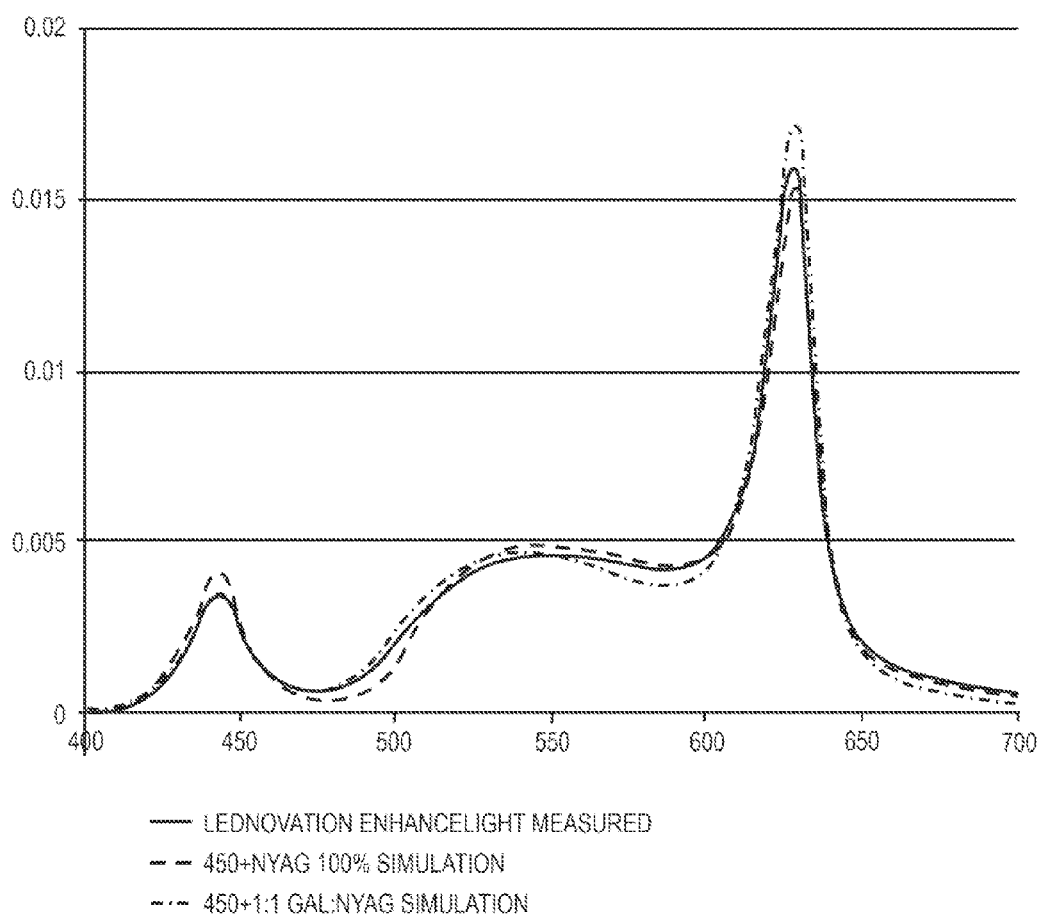
FIG. 24B is a spectral diagram including a first modeled BSY+R source, including a second modeled high-Qg BSY/G+R source with a green:yellow (e.g., GAL535:NYAG) phosphor ratio of 1:1, and a third source embodying a LEDnovation Enhancelite light bulb including at least one LED arranged to stimulate emissions of a phosphor and at least one red LED, with each source having a blue dominant wavelength of 444 nm, a red dominant wavelength of 628 nm, and a nominal CCT value at or near 2700K.

To provide a basis for comparing phosphors of the LEDnovation Enhancelite light bulb versus high Qg lighting devices according to the present disclosure, BSY+R and BSY/G+R each having a dominant red wavelength of 628 nm were modeled. FIG. 24B is a spectral diagram including a first modeled BSY+R source, including a second modeled high-Qg BSY/G+R source with a green:yellow (e.g., GAL535:NYAG) phosphor ratio of 1:1, and measurements obtained from the LEDnovation Enhancelite light bulb. Each source had a blue dominant wavelength of 444 nm, a red dominant wavelength of 628 nm, and a nominal CCT value of at or near 2700K. Identity of blue and red dominant wavelengths of the respective sources provided a basis for comparing spectra of the phosphors of the respective devices. As shown in FIG. 24B, the middle (phosphor) peak of the LEDnovation Enhancelite bulb has a shape substantially between the phosphor peaks of the modeled BSY+R and BSY/G+R sources, demonstrating that the LEDnovation Enhancelite bulb includes phosphor with some green content (e.g., not pure NYAG), but at a green:yellow phosphor ratio substantially less than 1:1.

Figure 25:
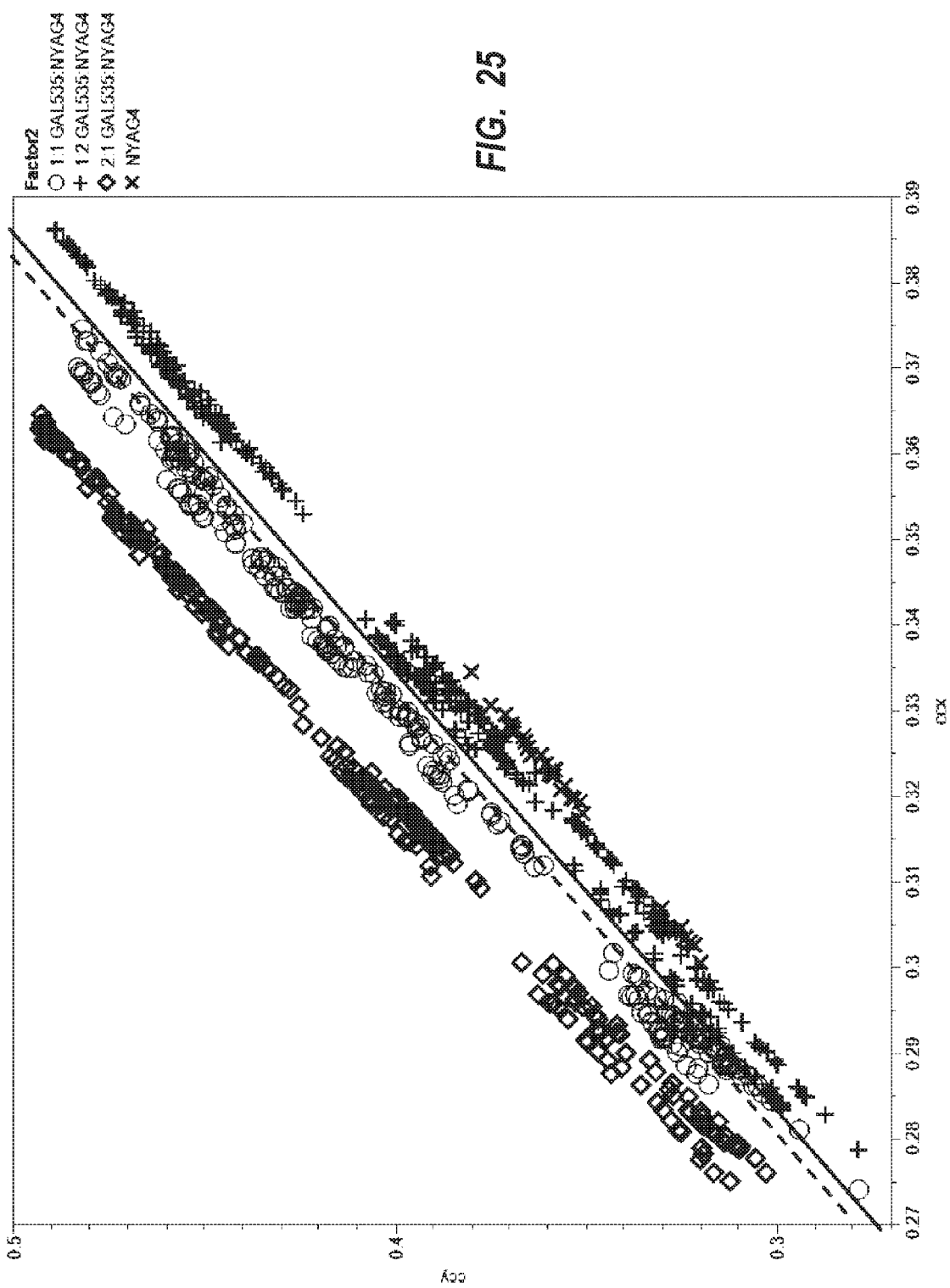
FIG. 25 is a plot of color points for a BSY source including 100% yellow (NYAG4) phosphor, and for BSY/G sources including green:yellow (GAL535:NYAG4) phosphor ratios of 1:1, 1:2, and 2:1, with addition of a solid line and a dashed line between the BSY/G green:yellow 1:2 phosphor ratio data points and the BSY/G green:yellow 1:1 phosphor ratio data points.

To provide a basis for comparing BSY and BSY/G subcombination color points, modeling was performed of a BSY source including 100% NYAG phosphor, and for three BSY/G sources including green:yellow (GAL535:NYAG4) phosphor ratios of 1:1, 1:2, and 2:1, respectively. Results of the modeling are shown in FIG. 25. A solid line and a dashed line have been added between the BSY/G green:yellow 1:2 phosphor ratio data points and the BSY/G green:yellow 1:1 phosphor ratio data points. The solid line (having endpoints with x,y values of (0.270, 0.273) and (0.386, 0.500)) represents a lower boundary of BSY/G color points believed to distinguish BSY/G subcombination color points of the LEDnovation Enhancelite bulb at a high confidence level. The dashed line (having endpoints with x,y values of (0.270, 0.280) and (0.383, 0.500)) represents a lower boundary of BSY/G color points believed to distinguish BSY/G subcombination color points of the LEDnovation Enhancelite bulb at an even higher confidence level (closer to green:yellow 1:1 phosphor ratio). Green:yellow phosphor ratios of greater than 1:1 (e.g., thresholds such as 1.25:1, 1.5:1, 1.75:1, 2:1, 2.5:1, 3:1, etc.) are believed to further distinguish BSY/G subcombination color points of the LEDnovation Enhancelite bulb.

Figure 26A:
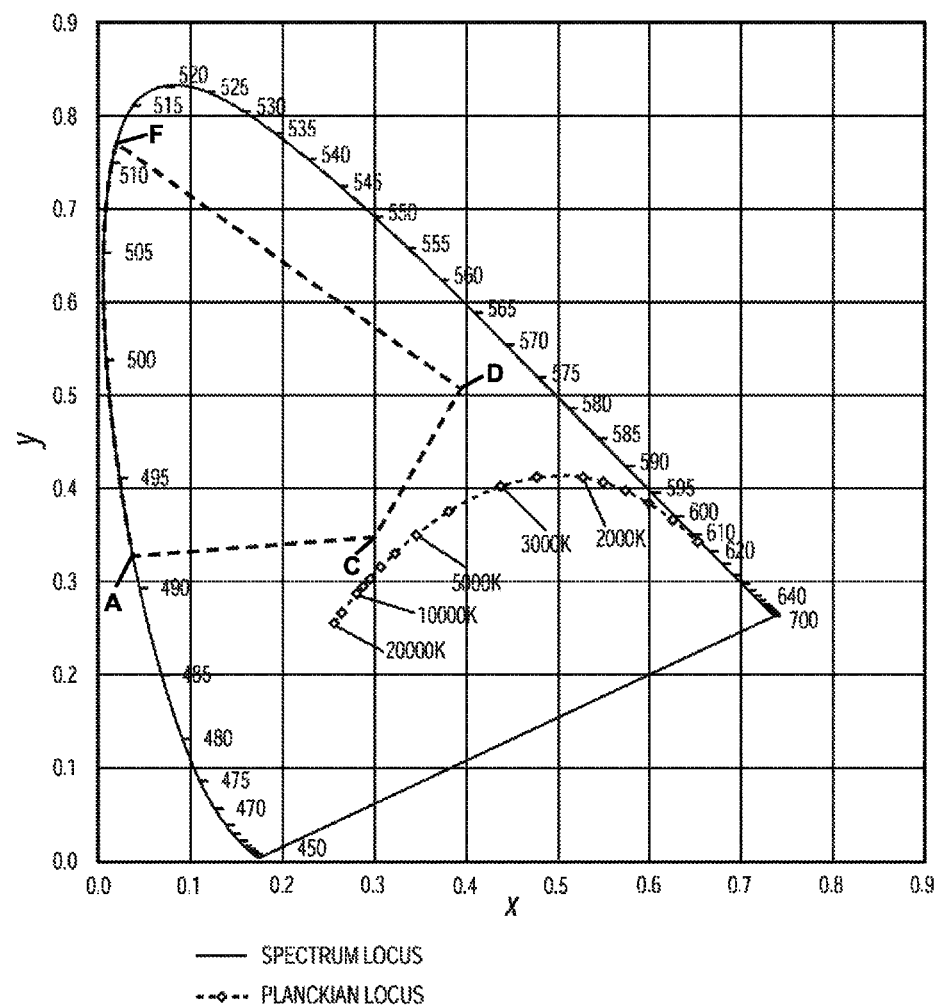
FIG. 26A is a CIE 1931 (x,y) chromaticity diagram illustrating the blackbody locus ("BBL," also known as the Planckian locus) and a first dash-line closed shape with vertices A, C, D, and F that includes BSY/G subcombination color points produced by a blue solid state light emitter in combination with one or more lumiphoric materials as utilized in BSY/G+R devices according to at least some embodiments of the present disclosure.

FIG. 26A is a CIE 1931 (x,y) chromaticity diagram illustrating the blackbody or Planckian locus, the spectrum locus, and a first dash-line closed shape with vertices A, C, D, and F that includes BSY/G subcombination color points produced by a blue solid state light emitter in combination with one or more lumiphoric materials as utilized in BSY/G+R lighting devices according to at least some embodiments of the present disclosure. Line segments "A-C" and "D-F" correspond to portions of the 5000K CCT and 2000K CCT tie lines, respectively. Line segment "A-F" corresponds to the spectrum locus between the 5000K CCT and 2000K CCT tie lines. In certain embodiments, line segment "C-D" corresponds to a segment of the dashed line shown in FIG. 25; in other embodiments, line segment "C-D" corresponds to a segment of the solid line shown in FIG. 25. In certain embodiments, a combination of lumiphor emissions and an unabsorbed portion of the blue LED emission of the BSY/G portion of a BSY/G+R device would, in the absence of any additional light, produce a mixture of light within the closed shape bounded by vertices A, C, D, and F, wherein segments A-C, C-D, and D-F embody straight lines and segment A-F embodies a curve corresponding to a portion of spectrum locus. Coordinates for points A, C, D, and F for certain embodiments are identified in the following Table 1.

TABLE 1

| Embodiment | A (x, y) | C (x, y) | D (x, y) | F (x, y) |
|---|---|---|---|---|
| (i) | (0.040, 0.329) | (0.309, 0.349) | (0.391, 0.509) | (0.020, 0.770) |
| (ii) | (0.040, 0.329) | (0.305, 0.349) | (0.389, 0.511) | (0.020, 0.770) |

In other embodiments, one or more subregions of the preceding regions may be defined wherein curved segment "A-F" may be shifted rightward by x values of 0.025, of 0.05, 0.075, 0.1, 0.125, or 0.15; wherein a line segment A-F may be defined by a straight line between endpoints "A-F", or wherein line segment may be defined by a straight line parallel to a line drawn through existing line segment "A-F" but shifted rightward by x values of 0.025, 0.05, 0.75, 0.1, 0.125, or 0.15. In each of the preceding subregions, the vertices C and D remain unchanged. The preceding subregions define BSY/G (or BSG) subcombination color points of high Qg BSY/G+R (or BSG+R) devices according to certain embodiments.

Figure 26B:
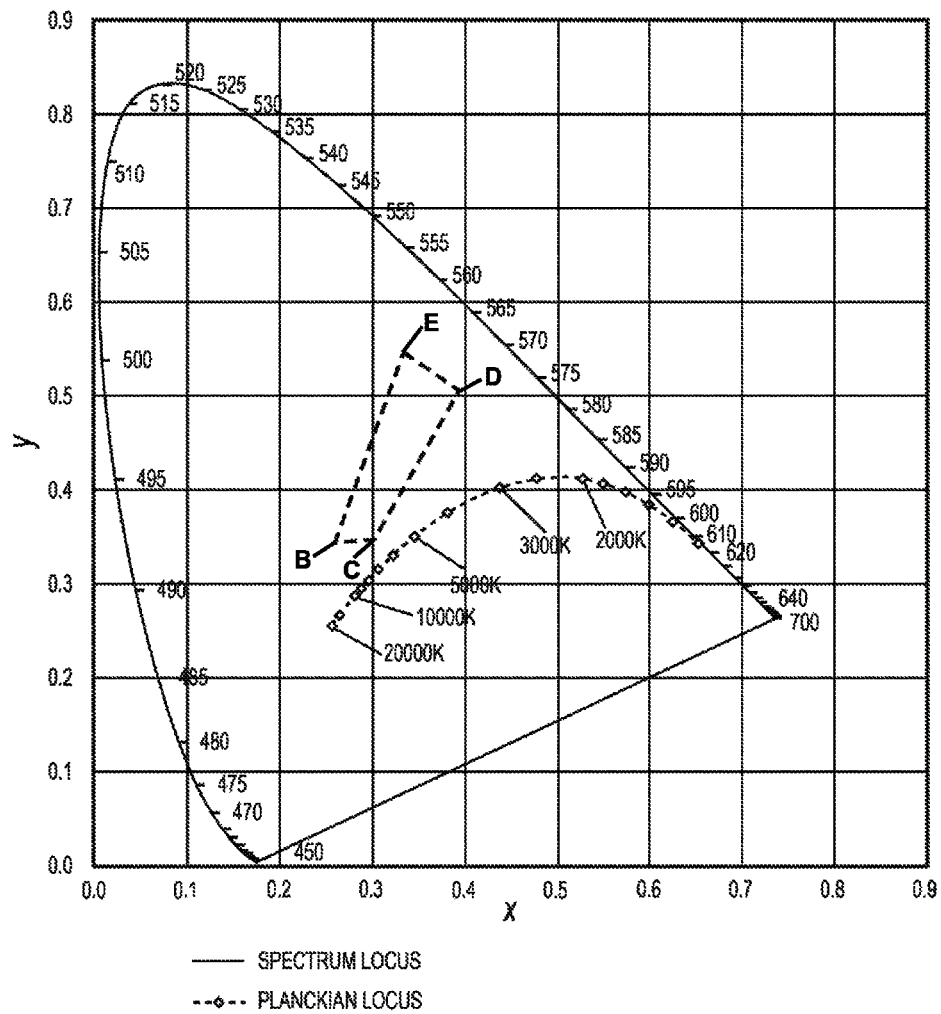
FIG. 26B is a CIE 1931 (x,y) chromaticity diagram illustrating the blackbody locus and a second dash-line closed shape with vertices B, C, D, and E (embodying a subregion of the closed shape shown in FIG. 26A) that includes BSY/G subcombination color points produced by a blue solid state light emitter in combination with one or more lumiphoric materials as utilized in BSY/G+R lighting devices according to at least some embodiments of the present disclosure.

FIG. 26B is a CIE 1931 (x,y) chromaticity diagram illustrating the blackbody or Planckian locus and a second dash-line closed shape with vertices B, C, D, and E (embodying a subregion of the closed shape shown in FIG. 26A) that includes BSY/G subcombination color points produced by a blue solid state light emitter in combination with one or more lumiphoric materials as utilized in BSY/G+R lighting devices according to at least some embodiments of the present disclosure. Line segments "B-C" and "D-E" correspond to portions of the 5000K CCT and 2000K CCT tie lines, respectively. Line segment "B-E" represents a best linear fit of color points obtained by modeling a 100% GAL phosphor stimulated with a blue LED (e.g., 450 nm dominant wavelength). In certain embodiments, line segment "C-D" corresponds to a segment of the dashed line shown in FIG. 25; in other embodiments, line segment "C-D" corresponds to a segment of the solid line shown in FIG. 25. In certain embodiments, a combination of lumiphor emissions and unabsorbed portion of the blue LED emission of the BSY/G portion of a BSY/G+R device would, in the absence of any additional light, produce a mixture of light within the closed shape bounded by vertices B, C, D, and E, wherein each segment B-C, C-D, D-E, and B-E embodies a straight line. Coordinates for points B, C, D, and E for certain embodiments are identified in the following Table 2.

TABLE 2

| Embodiment | B (x, y) | C (x, y) | D (x, y) | E (x, y) |
|---|---|---|---|---|
| (iii) | (0.264, 0.346) | (0.309, 0.349) | (0.391, 0.509) | (0.337, 0.547) |
| (iv) | (0.264, 0.346) | (0.305, 0.349) | (0.389, 0.511) | (0.337, 0.547) |

Lighting devices according to certain embodiments as disclosed herein may include CRI values in at least one of the following ranges: at least 80, at least 85, at least 90, at least 91, at least 92, at least 93, at least 94, and at least 95.

As noted previously, potentially attainable Qg values are limited in part by CCT since increasing CCT tends to decrease Qg. Lighting devices according to certain embodiments as disclosed herein may include Qg values of at least 116.5 minus the product of 0.003 times CCT. In certain embodiments, minimum Qg values may be increased from one to six points relative to the preceding equation, such as according to one or more of the following alternative equations: (i) $117.5-(0.003 \times CCT)$; (ii) $118.5-(0.003 \times CCT)$; (iii) $119.5-(0.003 \times CCT)$; (iv) $120.5-(0.003 \times CCT)$; (v) $121.5-(0.003 \times CCT)$; and (vi) $122.5-(0.003 \times CCT)$.

Lighting devices according to certain embodiments as disclosed herein may include luminous efficacy (lumens per watt) values of at least 85 LPW, at least 90 LPW, at least 95 LPW, at least 105 LPW, at least 115 LPW, at least 125 LPW, at least 135 LPW, at least 145 LPW, or at least 150 LPW.

Lighting devices according to certain embodiments as disclosed herein may include R9 color rendering values of at least 50, at least 60, at least 70, at least 80, at least 90, or at least 95.

In certain embodiments, preceding thresholds for two, three, or four different parameters of Qg, luminous efficacy, CRI Ra, and R9 color rendering may be achieved in combination. In certain embodiments, aggregate emissions of a BSY/G+R lighting device have a CCT in a range of from 2000K to 5000K; in a range of from 2500K to 5000K; in a range of 3000K to 5000K; or in a range of from 2700K to 4500K. In certain embodiments, aggregate emissions of a lighting device as disclosed herein are on or near the blackbody or Planckian locus. "Near the blackbody locus" in this context means preferably within a 5-step MacAdam ellipse, or more preferably within a 3-step MacAdam ellipse, of the blackbody locus. Such proximity to the blackbody locus is preferably in combination with a CCT in a range of from 2000K to 5000K.

In certain embodiments, a lighting device as disclosed herein includes a first power line, wherein each of at least one first (e.g., blue) electrically activated solid state emitter and at least one second (e.g., red or red-orange) electrically activated solid state emitter is electrically connected to the first power line. In certain embodiments, a lighting device as disclosed herein includes at least one (or multiple) of the following features: a single leadframe is arranged to conduct electrical power to the at least one first electrically activated solid state emitter and the at least one second electrically activated solid state emitter; a single reflector is arranged to reflect at least a portion of light emanating from each of the at least one first electrically activated solid state emitter and the at least one second electrically activated solid state emitter; a single submount or mounting element supports the at least one first electrically activated solid state emitter and the at least one second electrically activated solid state emitter; a single lens is arranged to transmit at least a portion of light emanating from each of the at least one first electrically activated solid state emitter and the at least one second electrically activated solid state emitter; and a single diffuser is arranged to diffuse at least a portion of light emanating from each of the at least one first electrically activated solid state emitter and the at least one second electrically activated solid state emitter. In certain embodiments, multiple first electrically activated (e.g., blue) solid state emitters and multiple second electrically activated (e.g., red or red-orange) solid state emitters may be provided. In certain embodiments, multiple clusters of solid state emitters may be provided, wherein each cluster includes at least one first solid state emitter and at least one second solid state emitter.

In certain embodiments, the lighting device may be devoid of any "unconverted" blue LED not arranged to stimulate a lumiphoric material. In certain embodiments, the lighting device may be devoid of any incandescent light emitting element and being devoid of any notch filtering element. In certain embodiments, a light bulb or light fixture may include at least one lighting device as disclosed herein.

In certain embodiments, a lighting device comprises at least one first electrically activated solid state emitter arranged to generate first emissions comprising a dominant wavelength in a blue range; at least one lumiphoric material arranged to receive at least a portion of the first emissions and produce lumiphor emissions comprising a dominant wavelength in a green or yellow-green range; and at least one second electrically activated solid state emitter arranged to generate second emissions comprising a dominant wavelength in a red or red-orange range; wherein a combination of (A) the lumiphor emissions and (B) an unabsorbed portion of the first emissions transmitted through or past the at least one lumiphoric material would, in the absence of any additional light, produce a mixture of light having a color point on a 1931 CIE Chromaticity Diagram including x, y coordinates that define a point on or within a closed shape bounded by a first line having x, y endpoint coordinates of (0.040, 0.329) and (0.309, 0.349), a second line having x, y endpoint coordinates of (0.309, 0.349) and (0.391, 0.509), a third line having x, y endpoint coordinates of (0.391, 0.509) and (0.020, 0.770), and a curve corresponding to a portion of the spectrum locus having x, y endpoint coordinates of (0.020, 0.770) and (0.040, 0.329); wherein aggregate emissions of the lighting device include at least a portion of the first emissions, at least a portion of the lumiphor emissions, and at least a portion of the second emissions; and wherein said aggregate emissions comprise a color rendering index (CRI Ra) value of at least 85, said aggregate emissions comprise a correlated color temperature (CCT) value, and said aggregate emissions comprise a relative gamut area (Qg) value of at least the value obtained by the equation 116.5 minus the product of 0.003 times the CCT value (or another appropriate equation disclosed herein). The preceding region corresponds to the shape bounded by vertices A, C, D, and F in FIG. 26A according to one embodiment. In certain embodiments, the combination of (A) the lumiphor emissions and (B) an unabsorbed portion of the first emissions may define a point on or within one or more subregions of the closed shape as disclosed herein, such as in connection with FIGS. 26A-26B. In certain embodiments, the aggregate emissions may include a CRI Ra value of at least 90, a luminous efficacy of at least 80 (more preferably at least 95, or still more preferably at least 115 or another threshold disclosed herein) lumens per watt, a CCT value in a range of from 2000K to 5000K, and/or a R9 color rendering value of at least 50 (or at least 60, at least 70, or at least 80 according to certain embodiments). In certain embodiments, a green lumiphor and a yellow lumiphor may be present in combination, with a proportion of green lumiphor to yellow lumiphor being at least 1:1, at least 1.5:1, or at least 2:1. In certain embodiments, the first emissions may include a peak wavelength not exceeding 465 nm (such as in a range of from 447 nm to 465 nm), and the second emissions may include a peak wavelength not exceeding 628 nm (such as in a range of from 615 nm to 627 nm).

In certain embodiments, a lighting device comprises at least one first electrically activated solid state emitter arranged to generate first emissions comprising a dominant wavelength in a blue range; at least one lumiphoric material arranged to receive at least a portion of the first emissions and produce lumiphor emissions comprising a dominant wavelength in a green or yellow-green range; and at least one second electrically activated solid state emitter arranged to generate second emissions comprising a dominant wavelength in a red or red-orange range; wherein a combination of (A) the lumiphor emissions and (B) an unabsorbed portion of the first emissions transmitted through or past the at least one lumiphoric material would, in the absence of any additional light, produce a mixture of light having a color point on a 1931 CIE Chromaticity Diagram including x, y coordinates that define a point on or within a closed shape bounded by a first line having x, y endpoint coordinates of (0.264, 0.346) and (0.309, 0.349), a second line having x, y endpoint coordinates of (0.309, 0.349) and (0.391, 0.509), a third line having x, y endpoint coordinates of (0.391, 0.509) and (0.337, 0.547), and a fourth line having x, y endpoint coordinates of (0.337, 0.547) and (0.264, 0.346); wherein aggregate emissions of the lighting device include at least a portion of the first emissions, at least a portion of the lumiphor emissions, and at least a portion of the second emissions, and said aggregate emissions comprise a correlated color temperature (CCT) value; and wherein said aggregate emissions comprise at least one of the following features (i) to (iv): (i) a color rendering index (CRI Ra) value of at least 85, (ii) a relative gamut area (Qg) value of at least the value obtained by the equation 116.5 minus the product of 0.003 times the CCT value, (iii) a luminous efficacy of at least 80 lumens per watt; and (iv) a R9 color rendering value of at least 50 (or at least 60, at least 70, or at least 80 according to certain embodiments). The preceding region corresponds to the shape bounded by vertices B, C, D, and E in FIG. 26B. In certain embodiments, a green lumiphor and a yellow lumiphor may be present in combination, with a proportion of green lumiphor to yellow lumiphor being at least 1:1, at least 1.5:1, or at least 2:1. In certain embodiments, the first emissions may include a dominant wavelength not exceeding 465 nm (such as in a range of from 447 nm to 465 nm), and the second emissions may include a peak wavelength not exceeding 628 nm (such as in a range of from 615 nm to 627 nm). In certain embodiments, the R9 color rendering value may be at least 60, at least 70, or at least 80.

Although various BSY/G+R sources have been described herein, it is to be recognized that the disclosure is not limited to BSY/G+R sources. In particular, BSG+R sources may be used in certain embodiments. Additionally, although various LEDs are described herein as "red," it is to be recognized that such term is intended to encompass and include "red-orange" LEDs unless specifically indicated to the contrary herein.

Figure 27A:
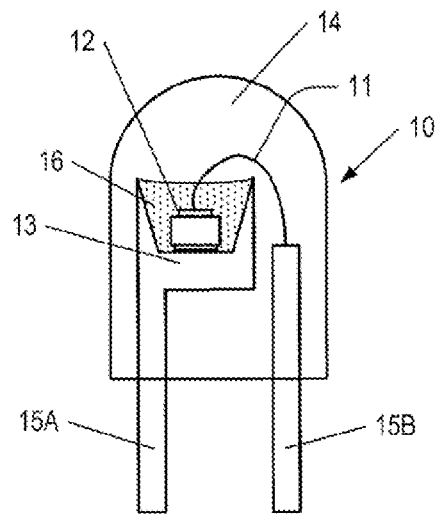
FIGS. 27A-27C are side cross-sectional views illustrating examples of packaged solid state emitters that may be used in lighting devices according to at least some embodiments of the present disclosure.
Figure 27B:
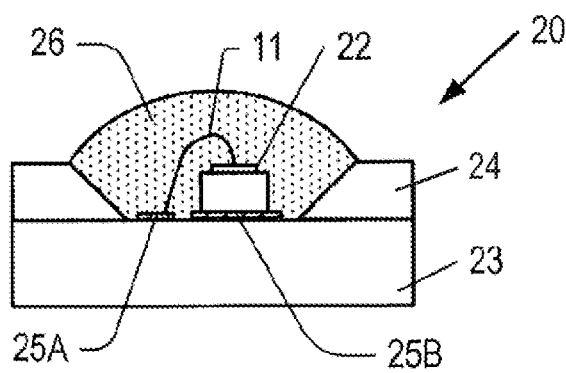
Figure 27C:
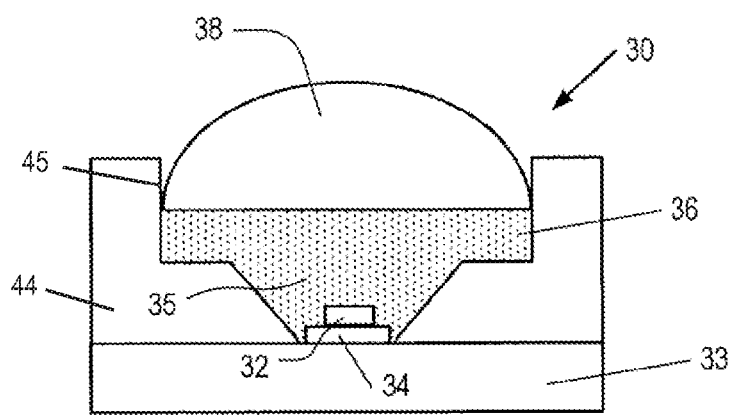

FIGS. 27A to 27C illustrate examples of solid state emitter (e.g., LED) packages that may be used to provide one or more solid state emitters of lighting devices according to certain embodiments of the present invention.

FIG. 27A illustrates an LED package 10 in which an LED chip 12 is mounted on a reflective cup 13 by means of a solder bond or conductive epoxy. One or more wirebonds 11 connect the ohmic contacts of the LED chip 12 to leads 15A and/or 15B, which may be attached to or integral with the reflective cup 13. The reflective cup may be filled with an encapsulant material 16 containing a wavelength conversion material, such as a phosphor or other lumiphoric material. The entire assembly may be encapsulated in a clear protective resin 14, which may be molded in the shape of a lens to collimate the light emitted from the LED chip 12 and/or phosphor particles in the encapsulant material 16. At least some of the light emitted by the LED chip 12 over a first wavelength range (e.g., "primary light") may be received by the phosphor, which may responsively emit light over a second wavelength range (e.g., "secondary light"). The primary light emitted by the LED chip 12 may be partially or completely absorbed by the wavelength conversion material, such that the overall light output of the LED package 10 includes both the primary light emitted by the LED chip 12 and the secondary light emitted by the wavelength conversion material.

Another LED package 20 that may be used in some embodiments of the present invention is illustrated in FIG. 27B. Relative to the LED package 10 described above, the LED package 20 depicted in FIG. 27B may be more suited for high power operations which may generate more heat. In the LED package 20, an LED chip 22 is mounted onto a carrier, such as a printed circuit board (PCB) carrier 23. A metal reflector 24 mounted on the carrier 23 surrounds the LED chip 22 and reflects light emitted by the LED chip 22 away from the package 20. The metal reflector 24 is typically attached to the carrier 23 by means of a solder or epoxy bond. The reflector 24 also provides mechanical protection to the LED chip 22. One or more wirebond connections 11 are made between ohmic contacts on the LED chip 22 and electrical traces 25A, 25B on the carrier 23. The mounted LED chip 22 is covered with an encapsulant 26, which may provide environmental and/or mechanical protection to the chips while also acting as a lens. The encapsulant 26 includes at least one phosphor or other wavelength conversion material that absorbs at least some of the light emitted by the LED chip 22, and responsively emits light of a different wavelength.

Yet another LED package 30 that may be used in some embodiments of the present invention is illustrated in FIG. 27C. The LED package 30 includes an LED chip 32 mounted on a submount 34 to a carrier substrate 33. The carrier substrate 33 can include an alumina substrate and/or a metal core PCB carrier substrate. A reflector 44 attached to the carrier substrate 33 surrounds the LED chip 32 and defines an optical cavity 35 above the LED chip(s) 32. An encapsulant material 36, such as silicone, fills the optical cavity 35. The encapsulant material 36 further includes at least one phosphor (or other wavelength conversion material) that is that absorbs at least some of the light emitted by the LED chip 32, and responsively emits light of a different wavelength. The reflector 44 reflects light emitted by the LED chip 32 away from the package 30. The reflector 44 also includes an upwardly extending cylindrical sidewall 45 that defines a channel in which a lens 38 can be inserted. The lens 38 may be held in place by the encapsulant material 36, and can move up and down as the encapsulant material 36 expands and contracts due to heat cycling. The lens 38 may include a light-scattering lens that is configured to refract light emitted by the LED and the wavelength conversion material (e.g., a transparent lens body with light scattering particles such as $TiO_2$, $Al_2O_3$, $SiO_2$, etc., and/or a lens body including a roughened outer surface that can randomly scatter light that exits the lens 38).

FIGS. 28A-28E illustrate exemplary portions of solid state lighting devices incorporating electrically activated solid state emitters and lumiphoric materials, which may be used alone or in groups according to certain embodiments described herein. It is to be appreciated that various structures employed within complete lighting devices (e.g., package leads, leadframes, contacts, wirebonds, bond structures, heat transfer elements, light extracting optics, diffusers, additional reflecting surfaces, power supplies, and the like) have been omitted for clarity of illustration, but one skilled in the art would appreciate that known structures could be incorporated in operative lighting devices including the illustrative portions provided in FIGS. 28A-28E.

Figure 28A:
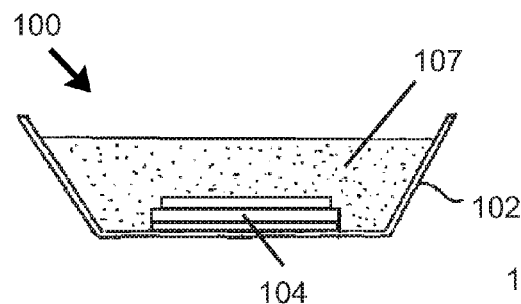
FIG. 28A is a side cross-sectional schematic view of a packaged solid state emitter (e.g., LED) and at least one lumiphor dispersed in an encapsulant material disposed over the solid state emitter, which may be used in lighting devices according to at least some embodiments of the present disclosure.

FIG. 28A is a side cross-sectional schematic view of a portion of a solid state lighting device 100 including at least one electrically activated solid state light emitter (e.g., LED) 104, a reflector cup 102 or other support structure on or over which the LED 104 is mounted, and (optionally) at least one lumiphor (e.g., phosphor) 107 dispersed in an encapsulant material disposed over the LED 104 and within the reflector cup 102. Although FIG. 28A illustrates the at least one lumiphor 107 as being dispersed in an encapsulant material, in various embodiments one or more lumiphors (e.g., phosphors) may be disposed in any suitable conformation to receive emissions from a solid state emitter (e.g., LED) and responsively re-emit light. In certain embodiments, at least one lumiphor may be coated directly on or over a solid state emitter. In certain embodiments, one or more lumiphors may be arranged in separate layers that may be spatially separated from each solid state emitter and/or one another. In certain embodiments, the device 100 including a lumiphor may be utilized in conjunction with a comparable device including a LED but lacking a lumiphor.

Figure 28B:
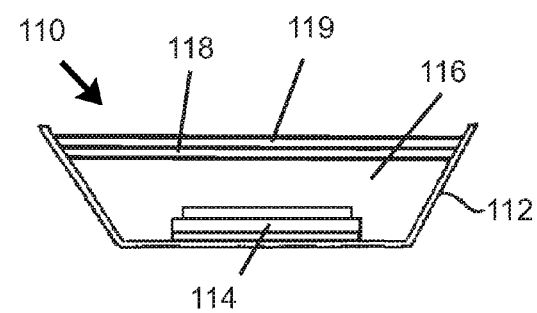
FIG. 28B is a side cross-sectional schematic view of at least one packaged solid state emitter (e.g., LED) and at least one lumiphor arranged in one or more layers spatially separated from the solid state emitter(s), which may be used in lighting devices according to at least some embodiments of the present disclosure.

FIG. 28B is a side cross-sectional schematic view of a portion of a solid state lighting device 110 including at least one electrically activated solid state emitter (e.g., LED) 114, a reflector cup 112 or other support structure on or over which the solid state emitter 114 is mounted, and multiple lumiphors (e.g., phosphors) 118, 119 arranged in layers that are spatially segregated from the solid state emitter 114. An encapsulant 116 may be disposed between the solid state emitter 114 and the lumiphors 118, 119; alternatively, at least one void may be arranged between the solid state emitter 114 and the lumiphors 118, 119 to reduce conductive thermal coupling therebetween. In certain embodiments, the device 110 including at least one lumiphor may be utilized in conjunction with a comparable device including a LED but lacking a lumiphor.

Figure 28C:
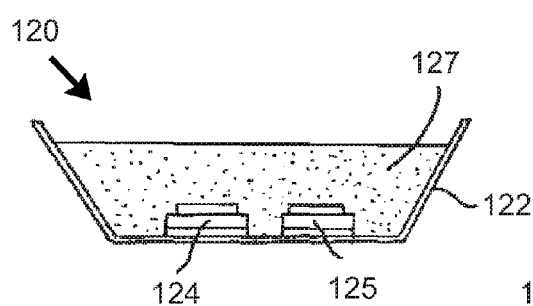
FIG. 28C is a side cross-sectional schematic view of a package including multiple solid state emitters (e.g., LEDs) and at least one lumiphor dispersed in an encapsulant material disposed over the multiple solid state light emitters, which may be used in lighting devices according to at least some embodiments of the present disclosure.

FIG. 28C is a side cross-sectional schematic view of a portion of a solid state lighting device 120 including first and second solid state emitters (e.g., LEDs) 124, 125, a reflector cup 122 or other support structure on or over which the solid state emitters 124, 125 are mounted, and at least one lumiphor (e.g., phosphor) 127 dispersed in an encapsulant material disposed over the solid state emitters 124, 125 and within the reflector cup 122. In certain embodiments, multiple lumiphors 127 may be provided. In one embodiment, one or more lumiphors may be arranged to interact with only a single solid state emitter 124, 125. At least one lumiphor may be disposed in an amount (e.g., thickness, width, etc.) or concentration that varies with respect to position within a solid state lighting device, such embodied in variations of presence, amount or concentration with respect to one or more solid state emitters. For example, at least one lumiphor may be coated over or arranged over one solid state emitter, and not arranged over (or arranged in a different thickness or concentration over) another solid state emitter. In certain embodiments, the excitation (or stimulation) wavelength range of the lumiphor 127 may correspond with output wavelength range (e.g., at least overlapping with a full width half maximum output) of one LED 124, but not correspond with output wavelength range of another LED 125.

Figure 28D:
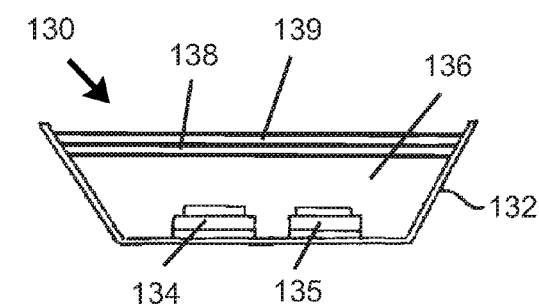
FIG. 28D is a side cross-sectional schematic view of a package including multiple solid state emitters (e.g., LEDs) and at least one lumiphor arranged in one or more layers spatially separated from the multiple solid state light emitters, which may be used in lighting devices according to at least some embodiments of the present disclosure.

In certain embodiments, a solid state lighting device may include multiple electrically activated solid state emitters (e.g., LEDs) and one or more lumiphors (e.g., phosphors) arranged in one or more layers spatially separated from the solid state emitters. FIG. 28D is a side cross-sectional schematic view of a portion of a solid state lighting device 130 including first and second solid state emitters (e.g., LEDs) 134, 135, a reflector cup 132 or similar support structure on or over which the solid state emitters 134, 135 are mounted, and one or more lumiphors (e.g., phosphors) 138, 139 arranged in layers that are spatially segregated from the solid state emitters 134, 135. An encapsulant 136 or other material may be disposed between the solid state emitters 134, 135 and the lumiphors 138, 139; alternatively, the solid state emitters 134, 135 and lumiphors 138, 139 may be separated by a gap. In one embodiment, the lumiphors 138, 139 may be arranged in alternating layers including at least two non-adjacent layers including lumiphors of substantially same material composition. One advantage of confining different lumiphors to different layers is to avoid undue absorption of emission spectrum of one lumiphor that may overlap with excitation spectrum of another lumiphor (e.g., excitation spectrum of a red phosphor may overlap with emission spectrum of a yellow phosphor) which would result in loss of efficiency). In certain embodiments, presence of a lumiphoric material may be non-uniform (e.g., patterned) within an individual lumiphor layer. In certain embodiments, a lumiphoric material layer may have a thickness that is non-uniform with respect to position.

Figure 28E:
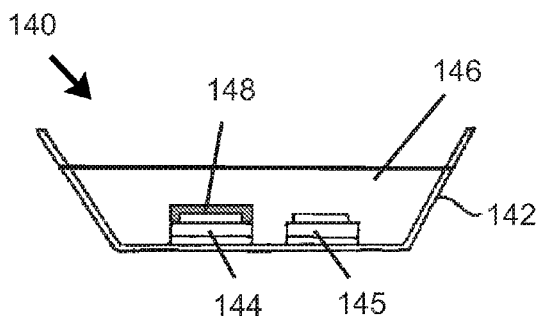
FIG. 28E is a side cross-sectional schematic view of a package including multiple solid state emitters (e.g., LEDs), with at least one solid state emitter having at least one lumiphor individually applied or coated over at least one surface of the solid state emitter.

FIG. 28E is a side cross-sectional schematic view of a portion of a solid state lighting device 140 including first and second electrically activated solid state emitters (LEDs) 144, 145, a reflector cup 142 or other support structure on or over which the LEDs 144, 145 are mounted, and at least one lumiphor 148 arranged to interact only (or primarily only) with a single LED 144. In certain embodiments, the at least one lumiphor 148 may be coated or deposited on or over a first LED 144 but omitted from the LED 145. In certain embodiments, the at least one lumiphor 148 may include a mixture of multiple lumiphors, and/or multiple layers of lumiphors having different material compositions. An encapsulant 146 may cover the LEDs 144, 145.

Figure 29:
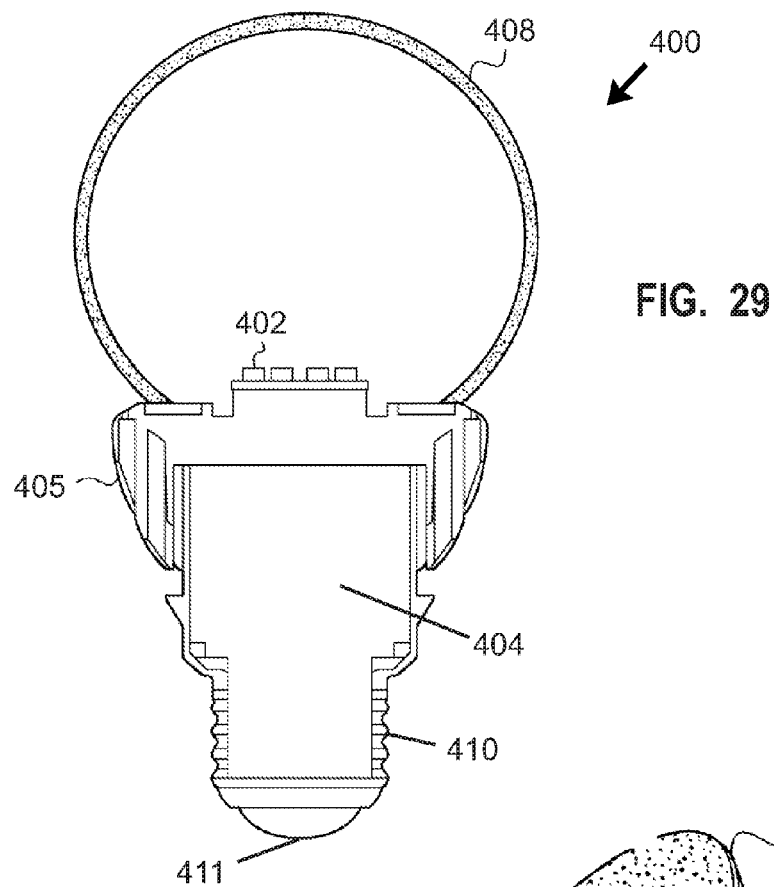
FIG. 29 is a side cross-sectional view of a first light bulb arranged to incorporate multiple solid state emitters according to at least some embodiments of the present disclosure.

FIG. 29 illustrates a first light bulb 400 arranged to incorporate multiple solid state emitters as disclosed herein. The light bulb 400 may optionally be arranged to output notch filtered light. The solid state light bulb 400 includes a conventional power supply 404, and includes a heatsink 405 including fins to promote cooling of the emitter chips 402 and power supply 404. A lateral contact 410 and foot contact 411 may be compatible with an Edison-style screw-type light socket for conducting power to the light bulb 400. An optical element 408 (which may be embodied in a light-transmissive globe) is provided to protect the emitter chips 402 and provide light shaping and/or diffusion utility for light emissions of the light bulb 400. One or more lumiphoric materials may be associated with the emitter chips 402 and/or the optical element 408 to provide wavelength conversion utility. In certain embodiments, one or more optional filtering materials (e.g., notch filtering materials) may be associated with the emitter chips 402 and/or the optical element 408 to filter light emissions in order to exhibit at least one spectral notch as described herein. If an optional notch filtering material is provided, then upon passage of light through one or more notch filtering materials (e.g., associated with LEDs and/or the optical element 408), the light will exhibit a spectral notch, and the notch filtering may be specifically tailored to increase GAI and/or CRI Ra.

Figure 30:
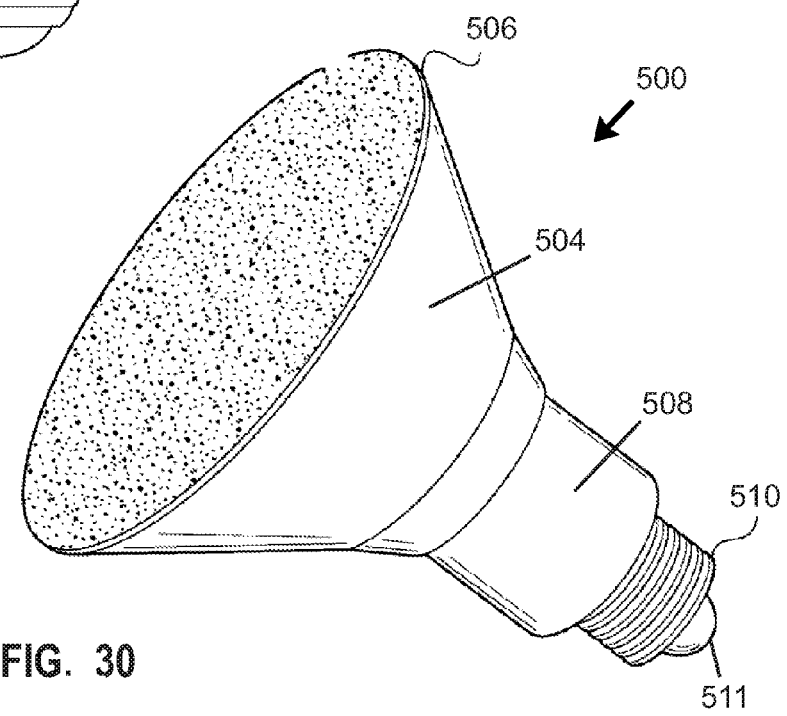
FIG. 30 is a side cross-sectional view of a second, reflector-type light bulb arranged to incorporate multiple solid state emitters according to at least some embodiments of the present disclosure.

FIG. 30 illustrates a second, reflector-type (i.e. PAR-style) light bulb 500 arranged to incorporate solid state emitters as disclosed herein. The light bulb 500 may optionally be arranged to output notch filtered light. The light bulb 500 includes a reflector 504 and an optical element (e.g., lens) 506 covering a front or light emitting portion of the bulb 500, with the reflector 504 and lens 506 together forming a light-transmissive optical enclosure. An opposing end of the bulb includes contacts 510, 511 (e.g., an Edison-style threaded lateral contact 510 and a foot contact 511) for receiving power from a socket or other receptacle. A body 508 of the light bulb 500 may include suitable LED control and/or drive circuitry. The bulb 500 includes LED devices or dies (not visible) as previously discussed, and such components optionally may include one or more notch filtering material layers and/or one or more lumiphoric materials. Optionally, one or more filtering materials (e.g., notch filtering materials) may be associated with the lens 506 to filter light emissions in order to exhibit at least one spectral notch as described herein. The lens 506 may alternatively or additionally include light scattering and/or lumiphoric materials in certain embodiments. If notch filtering material is provided, then upon passage of light through one or more notch filtering materials (e.g., associated with LEDs and/or the lens 506), the light will exhibit a spectral notch, and the notch filtering may be specifically tailored to increase GAI and/or CRI Ra.

Figure 31A:
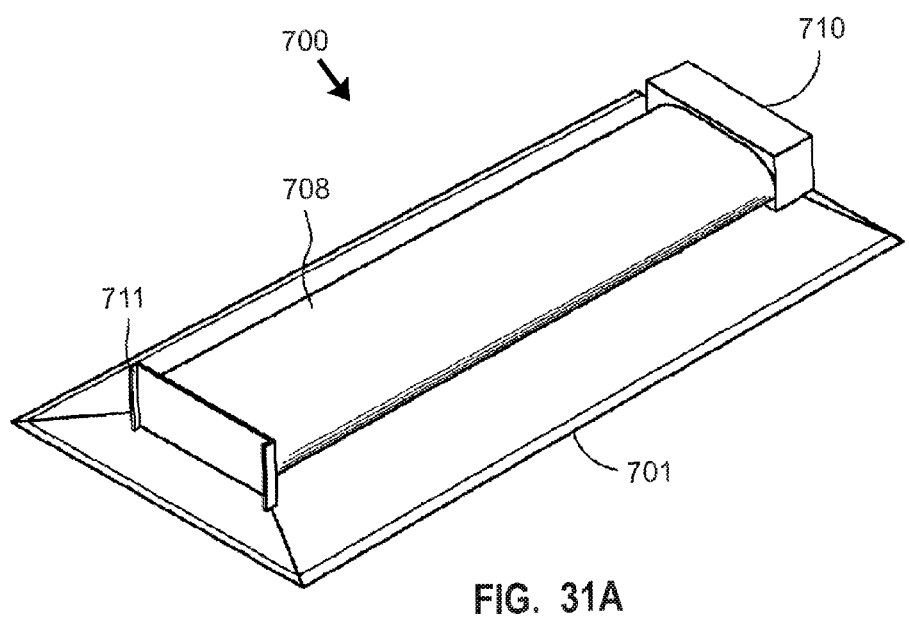
FIG. 31A is an upper perspective view of a troffer-type light fixture arranged to incorporate multiple solid state emitters according to at least some embodiments of the present disclosure.
Figure 31B:
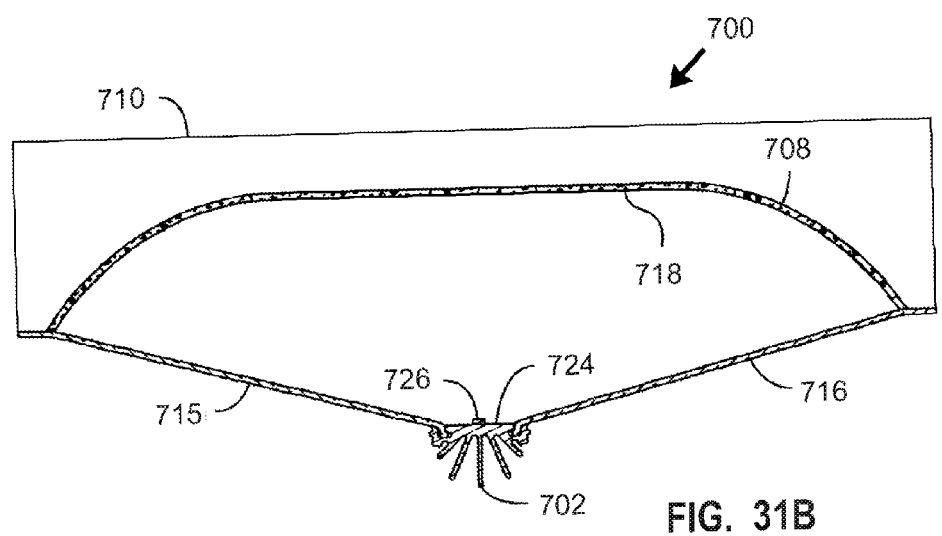
FIG. 31B is a side cross-sectional view of the troffer-type light fixture of FIG. 31A.

FIGS. 31A-31B illustrate a troffer-type (in-ceiling linear) light fixture 700 arranged to incorporate multiple solid state emitters (e.g., LEDs) 726 as disclosed herein. One or more lumiphoric materials may be associated with one or more LEDs 726. Optionally, the fixture 700 may include one or more notch filtering materials, such as may be associated with emitters 726, may be applied to or included in a linear reflector (e.g., e.g., by doping, impregnation, coating, etc.), or may be applied to or integrated with one or more light transmissive lens plates 715, 716 to cause the light emitted from the light fixture 700 to exhibit a spectral notch. Light fixture 700 includes pan 701, heatsink 702, emitter mounting surface 724, reflector 708, and end caps 710, 711. End cap 710 is larger than end cap 711 and is shaped to act as a circuit box to house electronics used to drive and control the light source (e.g., rectifiers, regulators, timing circuitry, etc.). Although a reflector may take various shapes, in the illustrated embodiment, the reflector 708 includes a flat region opposite the heatsink 702. In alternative embodiments, the reflector 708 could be parabolic in shape, or include two or more parabolic regions. Light fixture 700 also includes a diffuser lens assembly including lens plates 715, 716, disposed adjacent to sides of the heatsink 702. Reflector 708 can be made of many different materials, including metal, polymeric material, microcellular polyethyleneterephthalate (MCPET), or other suitable materials. If notch filtering material is provided, then emissions of the LEDs 726 may interact with one or more notch filtering materials (e.g., associated with the LEDs 726, associated with the reflector 708 (such as optional notch filtering material 718), and/or associated with the lens plates 715, 716) such that the light will exhibit a spectral notch, and the notch filtering may be specifically tailored to increase GAI and/or CRI Ra.

Figure 32:
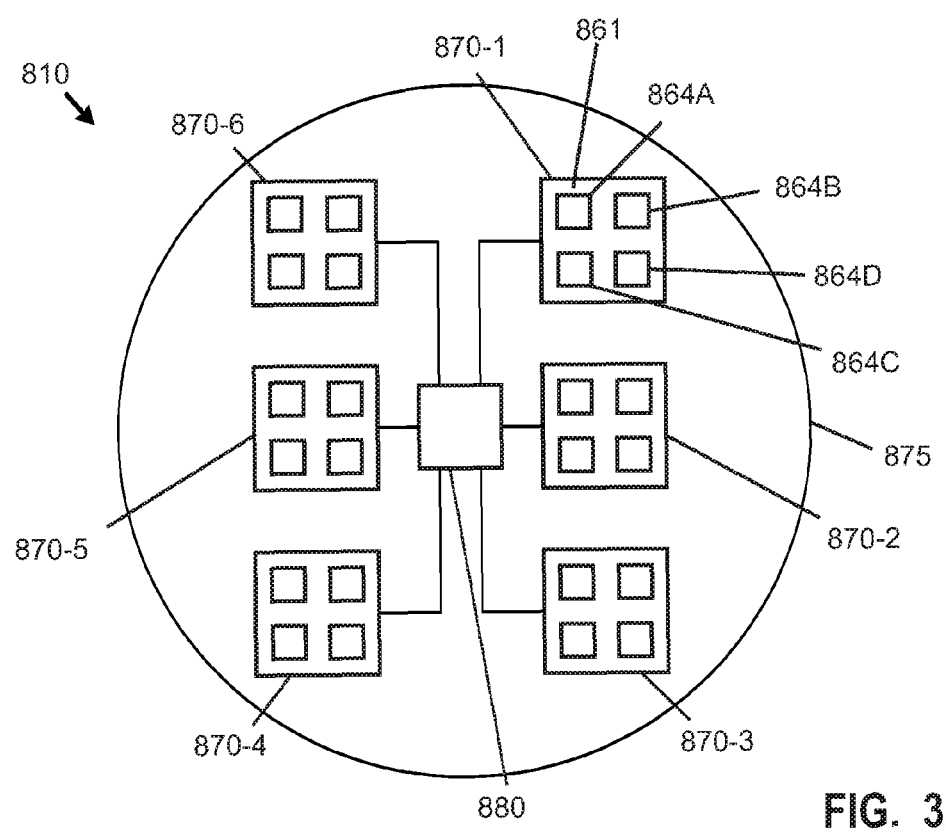
FIG. 32 is a simplified plan view of a light emitting apparatus including multiple solid state emitters and at least one control circuit according to at least some embodiments of the present disclosure.

FIG. 32 illustrates a lighting apparatus (e.g., light fixture) 810 according to at least one embodiment. The apparatus 810 includes a substrate or mounting plate 875 to which multiple solid state emitter (e.g., LED) lamps 870-1 to 870-6 (optionally embodied in multi-chip lamps such as multi-chip LED packages) are attached, wherein each lamp 870-1 to 870-6 may include multiple LEDs as described herein. Each lamp 870-1 to 870-6 may optionally include a cluster of solid state emitters, including at least one lumiphor converted solid state emitter and at least one supplemental solid state emitter as disclosed herein. The mounting plate 875 may include a circular shape or any suitable shape or configuration (including non-planar and curvilinear configurations). Different solid state emitter lamps or clusters may be configured to emit the same or different colors (e.g., wavelengths) of light. With specific reference to a first solid state lamp 870-1, each solid state lamp 870-1 to 870-6 may include multiple solid state emitters (e.g., LEDs) 864A-864D preferably arranged on a single submount 861. Although FIG. 32 illustrates four solid state emitter chips as being associated with each multi-chip solid state lamp 870-1 to 870-6, it is to be appreciated that any suitable number of solid state emitter chips may be associated with each multi-chip solid state lamp 870-1 to 870-6, and the number of solid state emitter chips associated with different (e.g., multi-chip) solid state lamps may be different. Each solid state lamp 870-1 to 870-6 in a single fixture 810 may be substantially identical to one another, or solid state lamps with different output characteristics may be intentionally provided in a single fixture 810.

The solid state lamps 870-1 to 870-6 may be grouped on the mounting plate 875 in clusters or other arrangements so that the light fixture 810 outputs a desired pattern of light. In certain embodiments, at least one state emitter lamp associated with a single fixture 810 includes a lumiphor-converted light emitting component. One or more lamps 870-1 to 870-6 may optionally include at least one notch filtering material. With continued reference to FIG. 32, the light fixture 810 may include one or more control circuit components 880 arranged to operate the lamps 870-1 to 870-6 by independently applying currents and/or adjusting duty cycle of respective LED components or groups thereof. In certain embodiments, individual solid state chip 864A-864D in various lamps 870-1 to 870-6 may be configured to be individually addressed by the control circuit 880. In certain embodiments, the lighting apparatus 810 may be self-ballasted. In certain embodiments, a control circuit 880 may include a current supply circuit configured to independently apply an on-state drive current to each individual solid state chip responsive to a control signal, and may include one or more control elements configured to selectively provide control signals to the current supply circuit. As solid state emitters (e.g., LEDs) are current-controlled devices, the intensity of the light emitted from an electrically activated solid state emitter (e.g., LED) is related to the amount of current with which the device is driven. A common method for controlling the current driven through an LED to achieve desired intensity and/or color mixing is a Pulse Width Modulation (PWM) scheme, which alternately pulses the LEDs to a full current "ON" state followed by a zero current "OFF" state. The control circuit 880 may be configured to control the current driven through the solid state emitter chips 864A-864D associated with the lamps 870-1 to 870-6 using one or more control schemes known in the art. The control circuit 880 may be attached to an opposite or back surface of the mounting plate 875, or may be provided in an enclosure or other structure (not shown) that is segregated from the lighting device 800.

While not illustrated in FIG. 32, the light fixture 810 a may further include one or more heat spreading components and/or heatsinks for spreading and/or removing heat emitted by solid state emitter chips 864A-864D associated with the lamps 870-1 to 870-6. For example, a heat spreading component may include a sheet of thermally conductive material configured to conduct heat generated by the solid state emitter chips 864A-864D of the light fixture 810 and spread the conducted heat over the area of the mounting plate 875 to reduce thermal stratification in the light fixture 810.

Embodiments as disclosed herein may provide one or more of the following beneficial technical effects: enhancing perceived quality of emissions of lighting devices; enhancing vividness of colors represented by lighting devices in combination with high color rendering; and enhancing efficacy of vivid output lighting devices.

While the invention has been described herein in reference to specific aspects, features, and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Various combinations and subcombinations of the structures described herein are contemplated and will be apparent to a skilled person having knowledge of this disclosure. Any of the various features and elements as disclosed herein may be combined with one or more other disclosed features and elements unless indicated to the contrary herein. Correspondingly, the invention as hereinafter claimed is intended to be broadly construed and interpreted, as including all such variations, modifications and alternative embodiments, within its scope and including equivalents of the claims.

What is claimed is:

1. A lighting device comprising:
   at least one first electrically activated solid state emitter arranged to generate first emissions comprising a dominant wavelength in a blue range;
   at least one lumiphoric material arranged to receive at least a portion of the first emissions and produce lumiphor emissions comprising a dominant wavelength in a green or yellow-green range; and
   at least one second electrically activated solid state emitter arranged to generate second emissions comprising a dominant wavelength in a red or red-orange range;
   wherein a combination of (A) the lumiphor emissions and (B) an unabsorbed portion of the first emissions transmitted through or past the at least one lumiphoric material would, in the absence of any additional light, produce a mixture of light having a color point on a 1931 CIE Chromaticity Diagram including x, y coordinates that define a point on or within a closed shape bounded by a first line having x, y endpoint coordinates of (0.040, 0.329) and (0.309, 0.349), a second line having x, y endpoint coordinates of (0.309, 0.349) and (0.391, 0.509), a third line having x, y endpoint coordinates of (0.391, 0.509) and (0.020, 0.770), and a curve corresponding to a portion of the spectrum locus having x, y endpoint coordinates of (0.020, 0.770) and (0.040, 0.329);
   wherein aggregate emissions of the lighting device include at least a portion of the first emissions, at least a portion of the lumiphor emissions, and at least a portion of the second emissions; and
   wherein said aggregate emissions comprise a color rendering index (CRI Ra) value of at least 85, said aggregate emissions comprise a correlated color temperature (CCT) value, and said aggregate emissions comprise a relative gamut area (Qg) value of at least the value obtained by the equation 116.5 minus the product of 0.003 times the CCT value.

2. The lighting device of claim 1, wherein the combination of (A) the lumiphor emissions and (B) an unabsorbed portion of the first emissions transmitted through or past the at least one lumiphoric material would, in the absence of any additional light, produce a mixture of light having a color point on a 1931 CIE Chromaticity Diagram including x, y coordinates that define a point on or within a first subregion of the closed shape, wherein the first subregion is bounded by a first line having x, y endpoint coordinates of (0.040, 0.329) and (0.305, 0.349), a second line having x, y endpoint coordinates of (0.305, 0.349) and (0.389, 0.511), a third line having x, y endpoint coordinates of (0.389, 0.511) and (0.020, 0.770), and a curve corresponding to a portion of the spectrum locus having x, y endpoint coordinates of (0.020, 0.770) and (0.040, 0.329).

3. The lighting device of claim 1, wherein the combination of (A) the lumiphor emissions and (B) an unabsorbed portion of the first emissions transmitted through or past the at least one lumiphoric material would, in the absence of any additional light, produce a mixture of light having a color point on a 1931 CIE Chromaticity Diagram including x, y coordinates that define a point on or within a second subregion of the closed shape, wherein the second subregion is bounded by a first line having x, y endpoint coordinates of (0.264, 0.346) and (0.309, 0.349), a second line having x, y endpoint coordinates of (0.309, 0.349) and (0.391, 0.509), a third line having x, y endpoint coordinates of (0.391, 0.509) and (0.337, 0.547), and a fourth line having x, y endpoint coordinates of (0.337, 0.547) and (0.264, 0.346).

4. The lighting device of claim 1, wherein the combination of (A) the lumiphor emissions and (B) an unabsorbed portion of the first emissions transmitted through or past the at least one lumiphoric material would, in the absence of any additional light, produce a mixture of light having a color point on a 1931 CIE Chromaticity Diagram including x, y coordinates that define a point on or within a second subregion of the closed shape, wherein the second subregion is bounded by a first line having x, y endpoint coordinates of (0.264, 0.346) and (0.305, 0.349), a second line having x, y endpoint coordinates of (0.305, 0.349) and (0.389, 0.511), a third line having x, y endpoint coordinates of (0.389, 0.511) and (0.337, 0.547), and a fourth line having x, y endpoint coordinates of (0.337, 0.547) and (0.264, 0.346).

5. The lighting device of claim 1, wherein said aggregate emissions comprise a CRI Ra value of at least 90.

6. The lighting device of claim 1, wherein said aggregate emissions of the lighting device comprise a luminous efficacy of at least 80 lumens per watt.

7. The lighting device of claim 1, wherein said aggregate emissions of the lighting device comprise a luminous efficacy of at least 95 lumens per watt.

8. The lighting device of claim 1, wherein said aggregate emissions comprise a correlated color temperature (CCT) value in a range of from 2000K to 5000K.

9. The lighting device of claim 1, comprising at least one of the following features: said first emissions comprise a peak wavelength not exceeding 465 nm, or said second emissions comprise a peak wavelength of less than 628 nm.

10. The lighting device of claim 1, wherein:
    said at least one lumiphoric material comprises a first lumiphoric material including at least one of lutetium aluminum garnet (LuAG) or green aluminate (GAL) material; and
    said at least one lumiphoric material comprises a second lumiphoric material including cerium(III)-doped yttrium aluminum garnet (Ce:YAG) or yttrium aluminum oxide doped with cerium yttrium aluminum garnet (NYAG) material;
    wherein a proportion of the first lumiphoric material to the second lumiphoric material is at least 1:1.

11. The lighting device of claim 1, wherein the lighting device is devoid of any electrically activated solid state emitter arranged to generate emissions (i) having a dominant wavelength in a range of from 430 nm to 480 nm and (ii) exiting the lighting device without passage through a layer or region comprising a lumiphoric material.

12. The lighting device of claim 1, wherein the lighting device is devoid of any incandescent light emitting element and is devoid of any notch filtering element.

13. A lighting device comprising:
    at least one first electrically activated solid state emitter arranged to generate first emissions comprising a dominant wavelength in a blue range;
    at least one lumiphoric material arranged to receive at least a portion of the first emissions and produce lumiphor emissions comprising a dominant wavelength in a green or yellow-green range; and
    at least one second electrically activated solid state emitter arranged to generate second emissions comprising a dominant wavelength in a red or red-orange range;

wherein a combination of (A) the lumiphor emissions and (B) an unabsorbed portion of the first emissions transmitted through or past the at least one lumiphoric material would, in the absence of any additional light, produce a mixture of light having a color point on a 1931 CIE Chromaticity Diagram including x, y coordinates that define a point on or within a closed shape bounded by a first line having x, y endpoint coordinates of (0.264, 0.346) and (0.309, 0.349), a second line having x, y endpoint coordinates of (0.309, 0.349) and (0.391, 0.509), a third line having x, y endpoint coordinates of (0.391, 0.509) and (0.337, 0.547), and a fourth line having x, y endpoint coordinates of (0.337, 0.547) and (0.264, 0.346);

wherein aggregate emissions of the lighting device include at least a portion of the first emissions, at least a portion of the lumiphor emissions, and at least a portion of the second emissions, and said aggregate emissions comprise a correlated color temperature (CCT) value; and wherein said aggregate emissions comprise a color rendering index (CRI Ra) value of at least 85, and a relative gamut area (Qg) value of at least the value obtained by the equation 116.5 minus the product of 0.003 times the CCT value.

14. The lighting device of claim 13, wherein the combination of (A) the lumiphor emissions and (B) an unabsorbed portion of the first emissions transmitted through or past the at least one lumiphoric material would, in the absence of any additional light, produce a mixture of light having a color point on a 1931 CIE Chromaticity Diagram including x, y coordinates that define a point on or within a first subregion of the closed shape, wherein the first subregion is bounded by a first line having x, y endpoint coordinates of (0.264, 0.346) and (0.305, 0.349), a second line having x, y endpoint coordinates of (0.305, 0.349) and (0.389, 0.511), a third line having x, y endpoint coordinates of (0.389, 0.511) and (0.337, 0.547), and a fourth line having x, y endpoint coordinates of (0.337, 0.547) and (0.264, 0.346).

15. The lighting device of claim 13, wherein said aggregate emissions comprise a luminous efficacy of at least 80 lumens per watt, and a R9 color rendering value of at least 50.

16. The lighting device of claim 13, wherein said aggregate emissions comprise a luminous efficacy of at least 95 lumens per watt, and a R9 color rendering value of at least 50.

17. The lighting device of claim 13, wherein said aggregate emissions comprise a CRI Ra value of at least 90.

18. The lighting device of claim 13, wherein said aggregate emissions of the lighting device comprise a luminous efficacy of at least 80 lumens per watt.

19. The lighting device of claim 13, wherein said aggregate emissions of the lighting device comprise a luminous efficacy of at least 95 lumens per watt.

20. The lighting device of claim 13, wherein said aggregate emissions comprise a correlated color temperature (CCT) value in a range of from 2000K to 5000K.

21. The lighting device of claim 13, comprising at least one of the following features: said first emissions comprise a dominant wavelength not exceeding 465 nm, or said second emissions comprise a peak wavelength of less than 628 nm.

22. The lighting device of claim 13, wherein:
said at least one lumiphoric material comprises a first lumiphoric material including at least one of lutetium aluminum garnet (LuAG) or green aluminate (GAL) material; and
said at least one lumiphoric material comprises a second lumiphoric material including cerium(III)-doped yttrium aluminum garnet (Ce:YAG) or yttrium aluminum oxide doped with cerium yttrium aluminum garnet (NYAG) material;
wherein a proportion of the first lumiphoric material to the second lumiphoric material is at least 1:1.

23. The lighting device of claim 13, wherein the lighting device is devoid of any electrically activated solid state emitter arranged to generate emissions (i) having a dominant wavelength in a range of from 430 nm to 480 nm and (ii) exiting the lighting device without passage through a layer or region comprising a lumiphoric material.

24. The lighting device of claim 13, wherein the lighting device is being devoid of any incandescent light emitting element and is devoid of any notch filtering element.

* * * * *

UNITED STATES PATENT AND TRADEMARK OFFICE
CERTIFICATE OF CORRECTION

PATENT NO. : 9,702,524 B2  
APPLICATION NO. : 14/606509  
DATED : July 11, 2017  
INVENTOR(S) : Benjamin A. Jacobson et al.

It is certified that error appears in the above-identified patent and that said Letters Patent is hereby corrected as shown below:

In the Specification

Figure 10C:
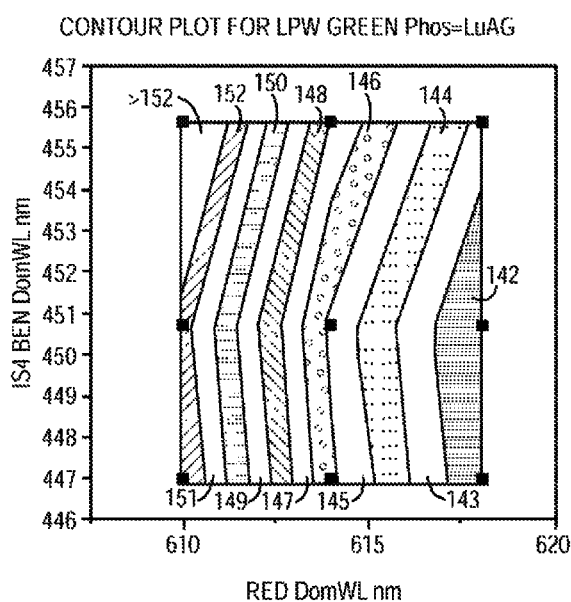

In Column 18, Line 17, replace "FIG. 100" with --FIG. 10C--.

In the Claims

In Column 36, Line 40, Claim 24, replace "device is being devoid" with --device is devoid--.

Signed and Sealed this  
Twenty-second Day of August, 2017

Joseph Matal  
*Performing the Functions and Duties of the*  
*Under Secretary of Commerce for Intellectual Property and*  
*Director of the United States Patent and Trademark Office*